(12) United States Patent
Helander et al.

(10) Patent No.: US 10,700,304 B2
(45) Date of Patent: Jun. 30, 2020

(54) DEVICE INCLUDING A CONDUCTIVE COATING DISPOSED OVER EMISSIVE REGIONS AND METHOD THEREFOR

(71) Applicant: OTI Lumionics Inc., Toronto (CA)

(72) Inventors: Michael Helander, Toronto (CA); Zhibin Wang, Toronto (CA); Yi-Lu Chang, Scarborough (CA); Qi Wang, North York (CA); Jacky Qiu, Toronto (CA)

(73) Assignee: OTI Lumionics Inc., Toronto (CA)

( * ) Notice: Subject to any disclaimer, the term of this patent is extended or adjusted under 35 U.S.C. 154(b) by 0 days.

(21) Appl. No.: 16/428,762

(22) Filed: May 31, 2019

(65) Prior Publication Data

US 2019/0305246 A1    Oct. 3, 2019

Related U.S. Application Data

(63) Continuation of application No. PCT/IB2017/057591, filed on Dec. 1, 2017.

(60) Provisional application No. 62/429,625, filed on Dec. 2, 2016.

(51) Int. Cl.
| | |
|---|---|
| *H01L 51/52* | (2006.01) |
| *C09K 11/06* | (2006.01) |
| *H01L 51/00* | (2006.01) |
| *H01L 27/32* | (2006.01) |

(52) U.S. Cl.
CPC .......... *H01L 51/5228* (2013.01); *C09K 11/06* (2013.01); *H01L 51/0004* (2013.01); *H01L 51/52* (2013.01); *H01L 51/5234* (2013.01); *H01L 51/5262* (2013.01); *H01L 27/3218* (2013.01); *H01L 51/5278* (2013.01)

(58) Field of Classification Search
CPC .............. H01L 51/0023; H01L 51/442; H01L 51/5228; H01L 51/5234; H01L 51/5212; H01L 51/0081; H01L 51/529; H01L 51/0048; H01L 51/0046
See application file for complete search history.

(56) References Cited

U.S. PATENT DOCUMENTS

| | | |
|---|---|---|
| 6,878,297 B1 | 4/2005 | Berger et al. |
| 2002/0197511 A1 | 12/2002 | D'Andrade et al. |
| 2008/0054799 A1 | 3/2008 | Satou |
| 2012/0104422 A1* | 5/2012 | Lee ............... H01L 51/5228 257/88 |
| 2017/0256719 A1* | 9/2017 | Jang ............... H01L 51/0058 |

FOREIGN PATENT DOCUMENTS

EP    1 089 361 B1    3/2014

OTHER PUBLICATIONS

International Search Report and Written Opinion for International Application No. PCT/IB/2017/057591, dated Mar. 27, 2018, 12 pages.

* cited by examiner

*Primary Examiner* — Cuong Q Nguyen
(74) *Attorney, Agent, or Firm* — Foley & Lardner LLP

(57) ABSTRACT

An opto-electronic device includes: (1) a subpixel region including: an electrode; an organic layer disposed over the electrode; and a conductive coating disposed over the organic layer; and (2) a light transmissive region including a nucleation inhibiting coating, wherein a surface of the nucleation inhibiting coating in the light transmissive region is substantially free of the conductive coating.

30 Claims, 38 Drawing Sheets

DEVICE INCLUDING A CONDUCTIVE COATING DISPOSED OVER EMISSIVE REGIONS AND METHOD THEREFOR

CROSS-REFERENCE TO RELATED APPLICATIONS

This application is a continuation of International Application No. PCT/IB2017/057591, filed Dec. 1, 2017, which claims the benefit of and priority to U.S. Provisional Application No. 62/429,625, filed Dec. 2, 2016, the contents of which are incorporated herein by reference in their entireties.

TECHNICAL FIELD

The following generally relates to a device including a conductive coating disposed over emissive regions of the device, and method for depositing an electrically conductive material over emissive regions of a device. Specifically, the method relates to selective deposition of the electrically conductive material on a surface for forming an electrically conductive structure of a device.

BACKGROUND

Organic light-emitting diodes (OLEDs) typically include several layers of organic materials interposed between conductive thin film electrodes, with at least one of the organic layers being an electroluminescent layer. When a voltage is applied to electrodes, holes and electrons are injected from an anode and a cathode, respectively. The holes and electrons injected by the electrodes migrate through the organic layers to reach the electroluminescent layer. When a hole and an electron are in close proximity, they are attracted to each other due to a Coulomb force. The hole and electron may then combine to form a bound state referred to as an exciton. An exciton may decay through a radiative recombination process, in which a photon is released. Alternatively, an exciton may decay through a non-radiative recombination process, in which no photon is released. It is noted that, as used herein, internal quantum efficiency (IQE) will be understood to be a proportion of all electron-hole pairs generated in a device which decay through a radiative recombination process.

A radiative recombination process can occur as a fluorescence or phosphorescence process, depending on a spin state of an electron-hole pair (namely, an exciton). Specifically, the exciton formed by the electron-hole pair may be characterized as having a singlet or triplet spin state. Generally, radiative decay of a singlet exciton results in fluorescence, whereas radiative decay of a triplet exciton results in phosphorescence.

More recently, other light emission mechanisms for OLEDs have been proposed and investigated, including thermally activated delayed fluorescence (TADF). Briefly, TADF emission occurs through a conversion of triplet excitons into singlet excitons via a reverse inter system crossing process with the aid of thermal energy, followed by radiative decay of the singlet excitons.

An external quantum efficiency (EQE) of an OLED device may refer to a ratio of charge carriers provided to the OLED device relative to a number of photons emitted by the device. For example, an EQE of 100% indicates that one photon is emitted for each electron that is injected into the device. As will be appreciated, an EQE of a device is generally substantially lower than an IQE of the device. The difference between the EQE and the IQE can generally be attributed to a number of factors such as absorption and reflection of light caused by various components of the device.

An OLED device can typically be classified as being either a "bottom-emission" or "top-emission" device, depending on a relative direction in which light is emitted from the device. In a bottom-emission device, light generated as a result of a radiative recombination process is emitted in a direction towards a base substrate of the device, whereas, in a top-emission device, light is emitted in a direction away from the base substrate. Accordingly, an electrode that is proximal to the base substrate is generally made to be light transmissive (e.g., substantially transparent or semi-transparent) in a bottom-emission device, whereas, in a top-emission device, an electrode that is distal to the base substrate is generally made to be light transmissive in order to reduce attenuation of light. Depending on the specific device structure, either an anode or a cathode may act as a transmissive electrode in top-emission and bottom-emission devices.

An OLED device also may be a double-sided emission device, which is configured to emit light in both directions relative to a base substrate. For example, a double-sided emission device may include a transmissive anode and a transmissive cathode, such that light from each pixel is emitted in both directions. In another example, a double-sided emission display device may include a first set of pixels configured to emit light in one direction, and a second set of pixels configured to emit light in the other direction, such that a single electrode from each pixel is transmissive.

In addition to the above device configurations, a transparent or semi-transparent OLED device also can be implemented, in which the device includes a transparent portion which allows external light to be transmitted through the device. For example, in a transparent OLED display device, a transparent portion may be provided in a non-emissive region between each neighboring pixels. In another example, a transparent OLED lighting panel may be formed by providing a plurality of transparent regions between emissive regions of the panel. Transparent or semi-transparent OLED devices may be bottom-emission, top-emission, or double-sided emission devices.

While either a cathode or an anode can be selected as a transmissive electrode, a typical top-emission device includes a light transmissive cathode. Materials which are typically used to form the transmissive cathode include transparent conducting oxides (TCOs), such as indium tin oxide (ITO) and zinc oxide (ZnO), as well as thin films, such as those formed by depositing a thin layer of silver (Ag), aluminum (Al), or various metallic alloys such as magnesium silver (Mg:Ag) alloy and ytterbium silver (Yb:Ag) alloy with compositions ranging from about 1:9 to about 9:1 by volume. A multi-layered cathode including two or more layers of TCOs and/or thin metal films also can be used.

Particularly in the case of thin films, a relatively thin layer thickness of up to about a few tens of nanometers contributes to enhanced transparency and favorable optical properties for use as a top-emission electrode in OLEDs. The top-emission electrode may be a common electrode coating a plurality of pixels. For example, such common electrode may be a relatively thin conductive layer having a substantially uniform thickness across the device.

However, when a common electrode having a substantially uniform thickness is provided as the top-emission cathode in an OLED display device, the optical performance of the device cannot readily be fine-tuned according to the emission spectrum associated with each subpixel. In a typical OLED display device, red, green, and blue subpixels are provided to form the pixels of the display device. While efforts have been made to tune the optical microcavity effects associated with each subpixel color by varying the thickness of organic layers disposed within different subpixels, such approach may not provide sufficient degree of tuning of the optical microcavity effects in at least some cases. In addition, such approach may be difficult to implement in an OLED display production environment.

SUMMARY

According to some embodiments, an opto-electronic device comprises: (1) a subpixel region comprising: an electrode; an organic layer disposed over the electrode; and a conductive coating disposed over the organic layer; and (2) a light transmissive region comprising a nucleation inhibiting coating, wherein a surface of the nucleation inhibiting coating in the light transmissive region is substantially free of the conductive coating.

According to some embodiments, an opto-electronic device comprises: (1) a subpixel region comprising: an electrode; an organic layer disposed over the electrode; a first portion of a first conductive coating disposed over the organic layer; and a second conductive coating disposed over the first portion of the first conductive coating; and (2) a light transmissive region comprising: a second portion of the first conductive coating; and a nucleation inhibiting coating disposed over the second portion of the first conductive coating, wherein a surface of the nucleation inhibiting coating in the light transmissive region is substantially free of the second conductive coating.

According to some embodiments, an electroluminescent device comprises: (1) a first emissive region and a second emissive region, the first emissive region configured to emit light of a different wavelength from the second emissive region; and (2) a conductive coating disposed in the first emissive region and the second emissive region, the conductive coating comprising a first portion disposed in the first emissive region and a second portion disposed in the second emissive region, the first portion having a first thickness and the second portion having a second thickness, wherein the first thickness is different from the second thickness.

According to some embodiments, an electroluminescent device comprises: (1) a plurality of pixel regions, each pixel region comprising a first subpixel region and a second subpixel region, the first subpixel region configured to emit light of a different wavelength from the second subpixel region; and (2) a conductive coating disposed over the plurality of pixel regions, the conductive coating comprising, for each pixel region, a first portion disposed over the first subpixel region and a second portion disposed over the second subpixel region, wherein a thickness of the first portion is different from a thickness of the second portion.

According to some embodiments, an OLED device comprises: (1) a backplane comprising a plurality of thin-film transistors; and (2) a frontplane disposed over the backplane, the frontplane comprising a plurality of pixels, each pixel further comprising at least two subpixels being configured to emit light of different wavelengths from one another, and each subpixel comprising: (i) a first electrode electrically connected to a thin-film transistor of the plurality of thin-film transistors; (ii) an organic layer disposed over the first electrode; (iii) a second electrode disposed over the organic layer, wherein, for each pixel, a thickness of the second electrode disposed in one subpixel is different from a thickness of the second electrode disposed in another subpixel.

According to some embodiments, a method for manufacturing an electroluminescent device comprises: (1) depositing a first conductive coating over a substrate comprising a first emissive region and a second emissive region, the first conductive coating comprising a first portion covering the first emissive region and a second portion covering the second emissive region; (2) depositing a first nucleation inhibiting coating over the first portion of the first conductive coating; and (3) depositing a second conductive coating over the second portion of the first conductive coating.

BRIEF DESCRIPTION OF THE DRAWINGS

Some embodiments will now be described by way of example with reference to the appended drawings wherein.

DETAILED DESCRIPTION

Figure 1:
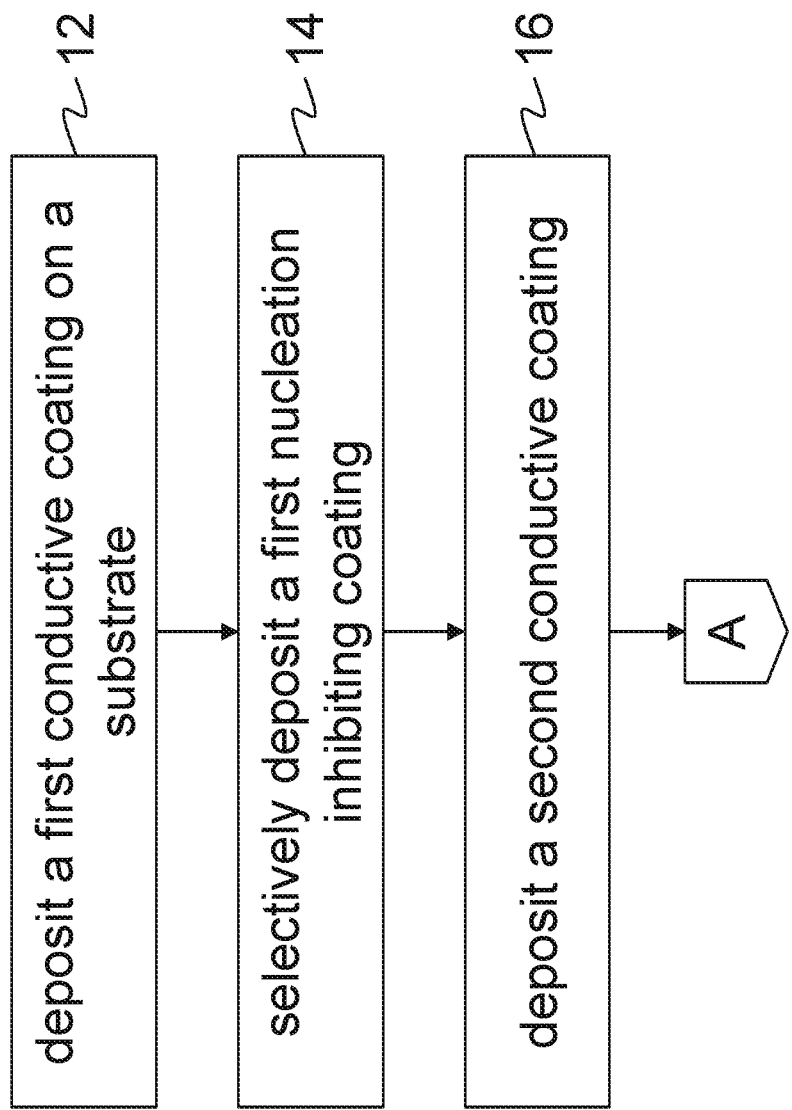
FIG. 1 is a flow diagram illustrating the stages for fabricating a device according to one embodiment.

It will be appreciated that for simplicity and clarity of illustration, where considered appropriate, reference numerals may be repeated among the figures to indicate corresponding or analogous components. In addition, numerous specific details are set forth in order to provide a thorough understanding of example embodiments described herein. However, it will be understood by those of ordinary skill in the art that the example embodiments described herein may be practiced without some of those specific details. In other instances, certain methods, procedures and components have not been described in detail so as not to obscure the example embodiments described herein.

As used herein, the term "nucleation inhibiting" is used to refer to a coating or a layer of a material having a surface which exhibits a relatively low affinity towards deposition of an electrically conductive material, such that the deposition of the conductive material or auxiliary electrode material on the surface is inhibited, while the term "nucleation promoting" is used to refer to a coating or a layer of a material having a surface which exhibits a relatively high affinity towards deposition of an electrically conductive material, such that the deposition of the conductive material on the surface is facilitated. One measure of nucleation inhibiting or nucleation promoting property of a surface is an initial sticking probability of the surface for an electrically conductive material, such as magnesium. For example, a nucleation inhibiting coating with respect to magnesium can refer to a coating having a surface which exhibits a relatively low initial sticking probability for magnesium vapor, such that deposition of magnesium on the surface is inhibited, while a nucleation promoting coating with respect to magnesium can refer to a coating having a surface which exhibits a relatively high initial sticking probability for magnesium vapor, such that deposition of magnesium on the surface is facilitated. As used herein, the terms "sticking probability" and "sticking coefficient" may be used interchangeably. Another measure of nucleation inhibiting or nucleation promoting property of a surface is an initial deposition rate of an electrically conductive material, such as magnesium, on the surface relative to an initial deposition rate of the conductive material on another (reference) surface, where both surfaces are subjected or exposed to an evaporation flux of the conductive material.

As used herein, the terms "evaporation" and "sublimation" are interchangeably used to generally refer to deposition processes in which a source material is converted into a vapor (e.g., by heating) to be deposited onto a target surface in, for example, a solid state.

As used herein, a surface (or a certain area of the surface) which is "substantially free of" or "is substantially uncovered by" a material refers to a substantial absence of the material on the surface (or the certain area of the surface). One measure of an amount of a material on a surface is a percentage coverage of the surface by the material, such as where the surface can be deemed to be substantially free of the material if the percentage coverage by the material is no greater than about 10%, no greater than about 8%, no greater than about 5%, no greater than about 3%, or no greater than about 1%. Surface coverage can be assessed using imaging techniques, such as using transmission electron microscopy (TEM), atomic force microscopy (AFM), or scanning electron microscopy (SEM). Such imaging techniques may also be combined with other analytical techniques such as energy-dispersive x-ray spectroscopy (EDX).

In one aspect, a method for manufacturing a device is provided. For example, the device may be an opto-electronic device and/or an electroluminescent device. In some embodiments, the method includes depositing a first conductive coating on a substrate. The substrate may include a first emissive region and a second emissive region. The first conductive coating deposited on the substrate may include a first portion coating the first emissive region and a second portion coating the second emissive region of the substrate. The method may further include depositing a first nucleation inhibiting coating on the first portion of the first conductive coating, and then depositing a second conductive coating on the second portion of the first conductive coating.

FIG. 1 is a flow diagram outlining stages of manufacturing a device according to one embodiment. FIGS. 2A-2D are schematic diagrams illustrating the device at each stage of the process.

Figure 2A:
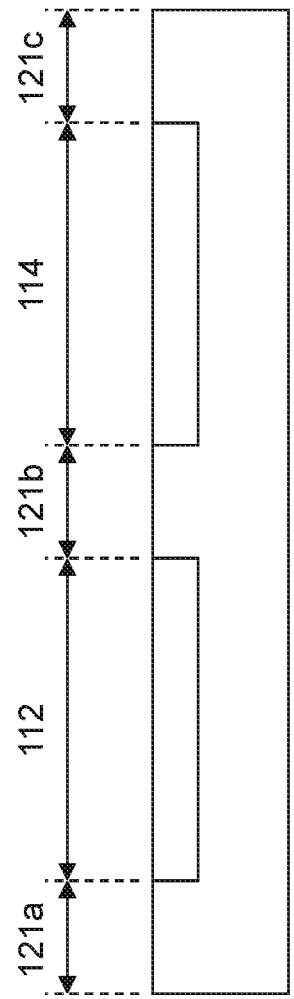
FIG. 2A, FIG. 2B, FIG. 2C, and FIG. 2D are schematic diagrams illustrating the various stages of device fabrication according to the embodiment of FIG. 1.

As illustrated in FIG. 2A, a substrate 102 is provided. The substrate 102 comprises a first emissive region 112 and a second emissive region 114. The substrate 102 may further comprise one or more non-emissive regions 121a, 121b, 121c. For example, the first emissive region 112 and the second emissive region 114 may correspond to pixel regions or subpixel regions of an electroluminescent device.

Figure 2B:
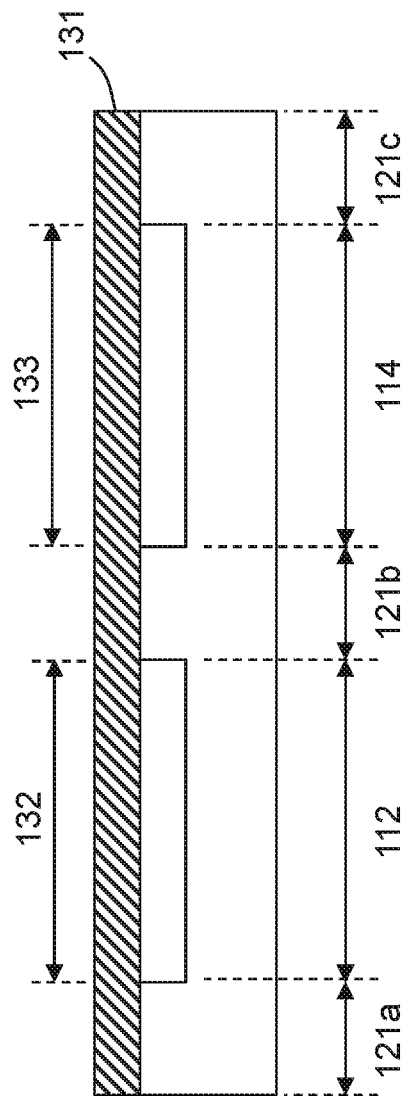
Figure 2C:
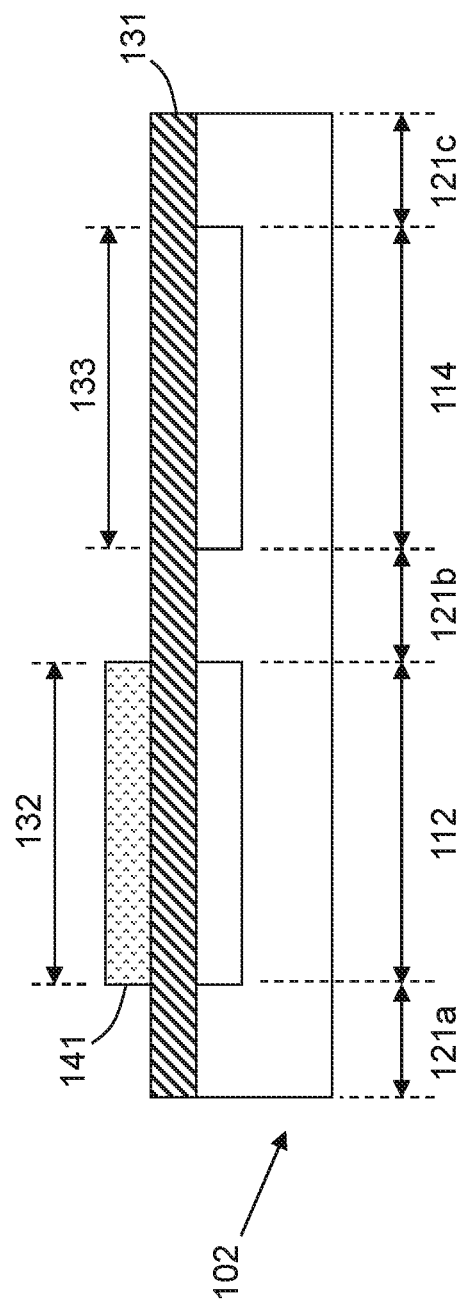

In stage 12, a first conductive coating 131 is deposited over the substrate. As illustrated in FIG. 2B, the first conductive coating 131 is deposited to coat the first emissive region 112, the second emissive region 114, and the non-emissive regions 121a-121c. The first conductive coating 131 includes a first portion 132 corresponding to the portion coating the first emissive region 112, and a second portion 133 corresponding to the portion coating the second emissive region 114. For example, the first conductive coating 131 may be deposited by evaporation, including thermal evaporation and electron beam evaporation. In some embodiments, the first conductive coating 131 may be deposited using an open mask or without a mask (e.g., mask-free). The first conductive coating 131 may be deposited using other methods including, but not limited to, sputtering, chemical vapor deposition, printing (including ink or vapor jet printing, reel-to-reel printing, and micro-contact transfer printing), organic vapor phase deposition (OVPD), laser induced thermal imaging (LITI), and combinations thereof.

In stage 14, a first nucleation inhibiting coating 141 is selectively deposited over a portion of the first conductive coating 131. In the embodiment illustrated in FIG. 2C, the first nucleation inhibiting coating 141 is deposited to coat the first portion 132 of the first conductive coating 131, which corresponds to the first emissive region 112. In such embodiment, the second portion 133 of the first conductive coating 131 disposed over the second emissive region 114 is substantially free of, or exposed from, the first nucleation inhibiting coating 141. In some embodiments, the first nucleation inhibiting coating 141 may optionally also coat portion(s) of the first conductive coating 131 deposited over one or more non-emissive regions. For example, the first nucleation inhibiting coating 141 may optionally also coat the portion(s) of the first conductive coating 131 deposited over one or more non-emissive regions adjacent to the first emissive region 112, such as the non-emissive region 121a and/or 121b. Various processes for selectively depositing a material on a surface may be used to deposit the first nucleation inhibiting coating 141 including, but not limited to, evaporation (including thermal evaporation and electron beam evaporation), photolithography, printing (including ink or vapor jet printing, reel-to-reel printing, and micro-contact transfer printing), OVPD, LITI patterning, and combinations thereof.

Figure 2D:
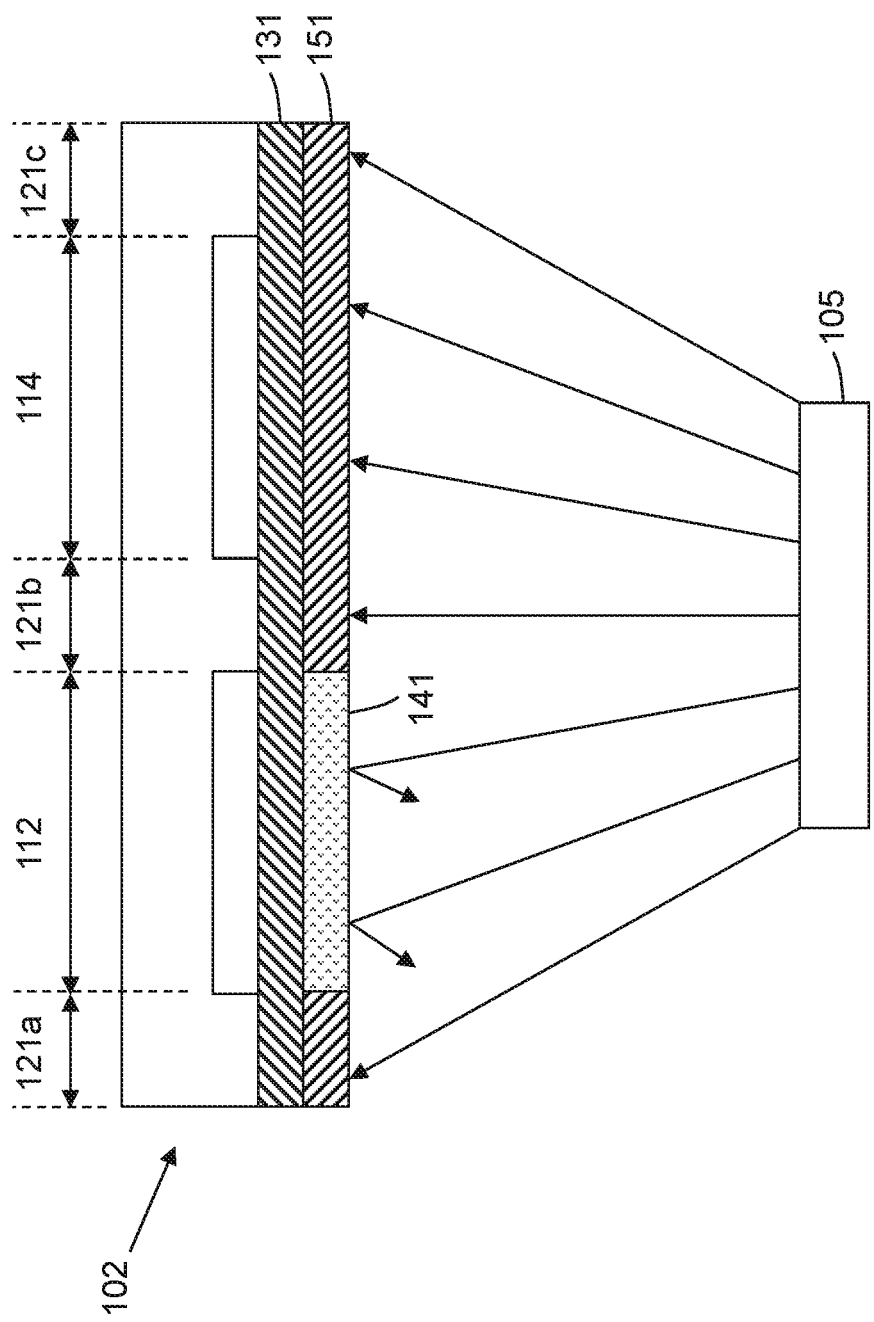

Once the first nucleation inhibiting coating 141 has been deposited on a region of the surface of the first conductive coating 131, a second conductive coating 151 may be deposited on remaining uncovered region(s) of the surface where the nucleation inhibiting coating is not present. Turning to FIG. 2D, in stage 16, a conductive coating source 105 is illustrated as directing an evaporated conductive material towards the surfaces of the first conductive coating 131 and the first nucleation inhibiting coating 141. As illustrated in FIG. 2D, the conducting coating source 105 may direct the evaporated conductive material such that it is incident on both covered or treated areas (namely, region(s) of the first conductive coating 131 with the nucleation inhibiting coating 141 deposited thereon) and uncovered or untreated areas of the first conductive coating 131. However, since a surface of the first nucleation inhibiting coating 141 exhibits a relatively low initial sticking coefficient compared to that of the uncovered surface of the first conductive coating 131, a second conductive coating 151 selectively deposits onto the areas of the first conductive coating surface where the first nucleation inhibiting coating 141 is not present. Accordingly, the second conductive coating 151 may coat the second portion 133 of the first conductive coating 131, which corresponds to the portion of the first conductive coating 131 coating the second emissive region 114. As illustrated in FIG. 2D, the second conductive coating 151 may also coat other portions or regions of the first conductive coating 131, including the portions coating the non-emissive regions 121a, 121b, and 121c. The second conductive coating 151 may include, for example, pure or substantially pure magnesium. In some examples, the second conductive coating 151 may be formed using materials which are identical to those used to form the first conductive coating 131. The second conductive coating 151 may be deposited using an open mask or without a mask (e.g., mask-free deposition process).

In some embodiments, the method may further include additional stages following stage 16. Such additional stages may include, for example, depositing one or more additional nucleation inhibiting coatings, depositing one or more additional conductive coatings, depositing an auxiliary electrode, depositing an outcoupling coating, and/or encapsulation of the device.

Figure 3:
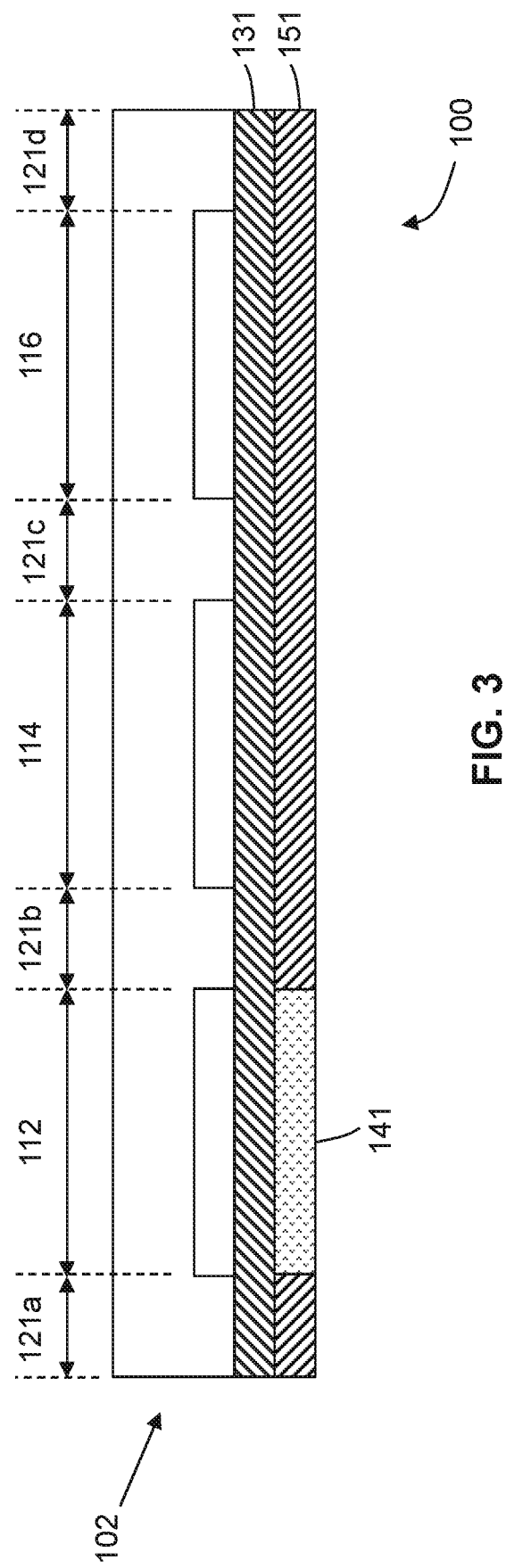
FIG. 3 is a device according to another embodiment.

In another embodiment illustrated in FIG. 3, the substrate 102 comprises a third emissive region 116 in addition to the first emissive region 112 and the second emissive region 114. The substrate 102 may further comprise non-emissive regions 121a-121d disposed adjacent to the emissive regions. The device 100 illustrated in FIG. 3 may be produced using substantially the same process of FIG. 1 as described above. Accordingly, the details of each stage undertaken to produce the device 100 of FIG. 3 are omitted. Briefly, the device 100 comprises a first conductive coating 131 coating the first emissive region 112, the second emissive region 114, the third emissive region 116, and non-emissive regions 121a-121d. A portion of the first conductive coating 131 disposed over the first emissive region 112 is coated with a first nucleation inhibiting coating 141, and the remainder of the first conductive coating 131, including the portions coating the second emissive region 114, the third emissive region 116, and the non-emissive regions 121a-121d, is coated by the second conductive coating 151.

Figure 4:
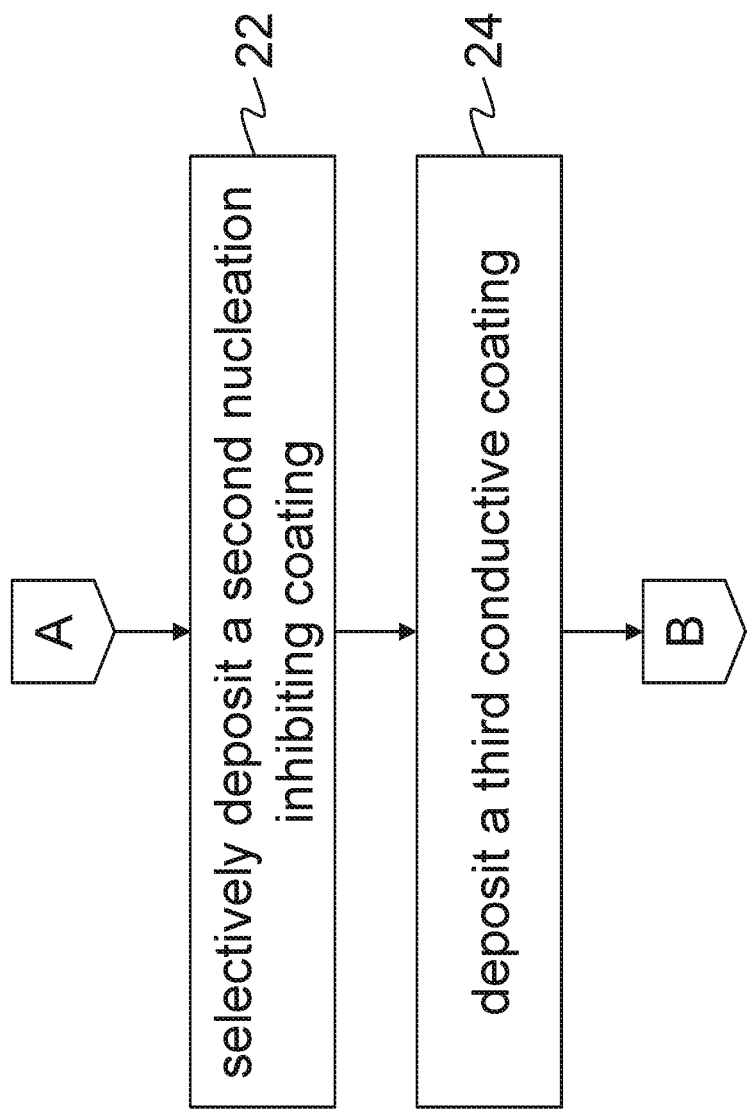
FIG. 4 is a flow diagram illustrating the stages of fabricating a device according to another embodiment.
Figure 5A:
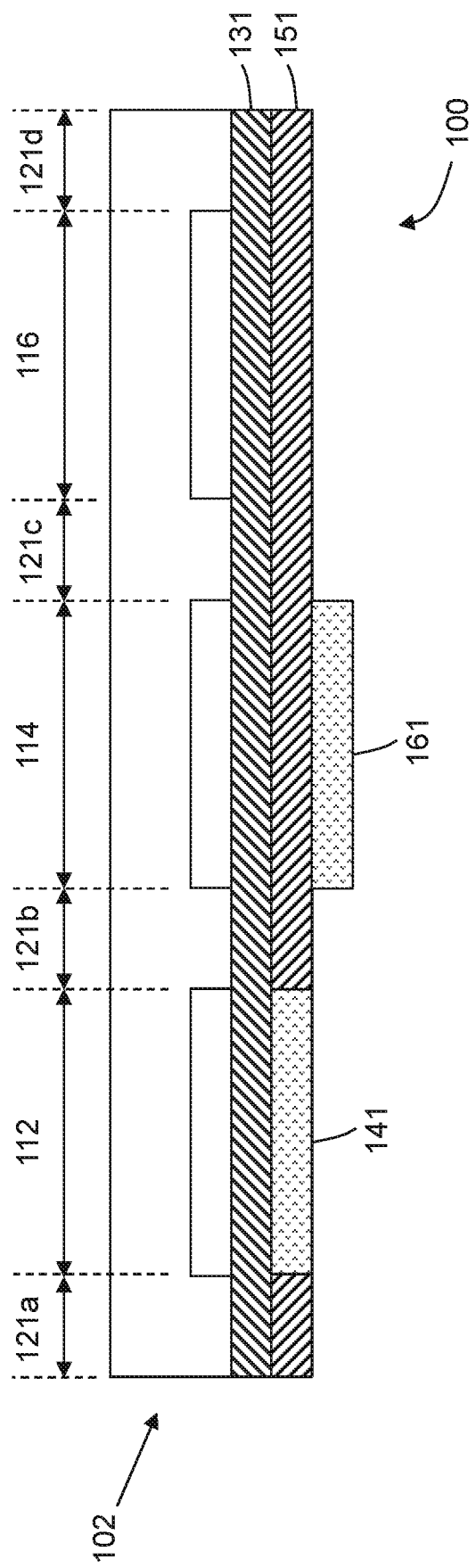
FIG. 5A and FIG. 5B are schematic diagrams illustrating the various stages of device fabrication according to the embodiment of FIG. 4.
Figure 5B:
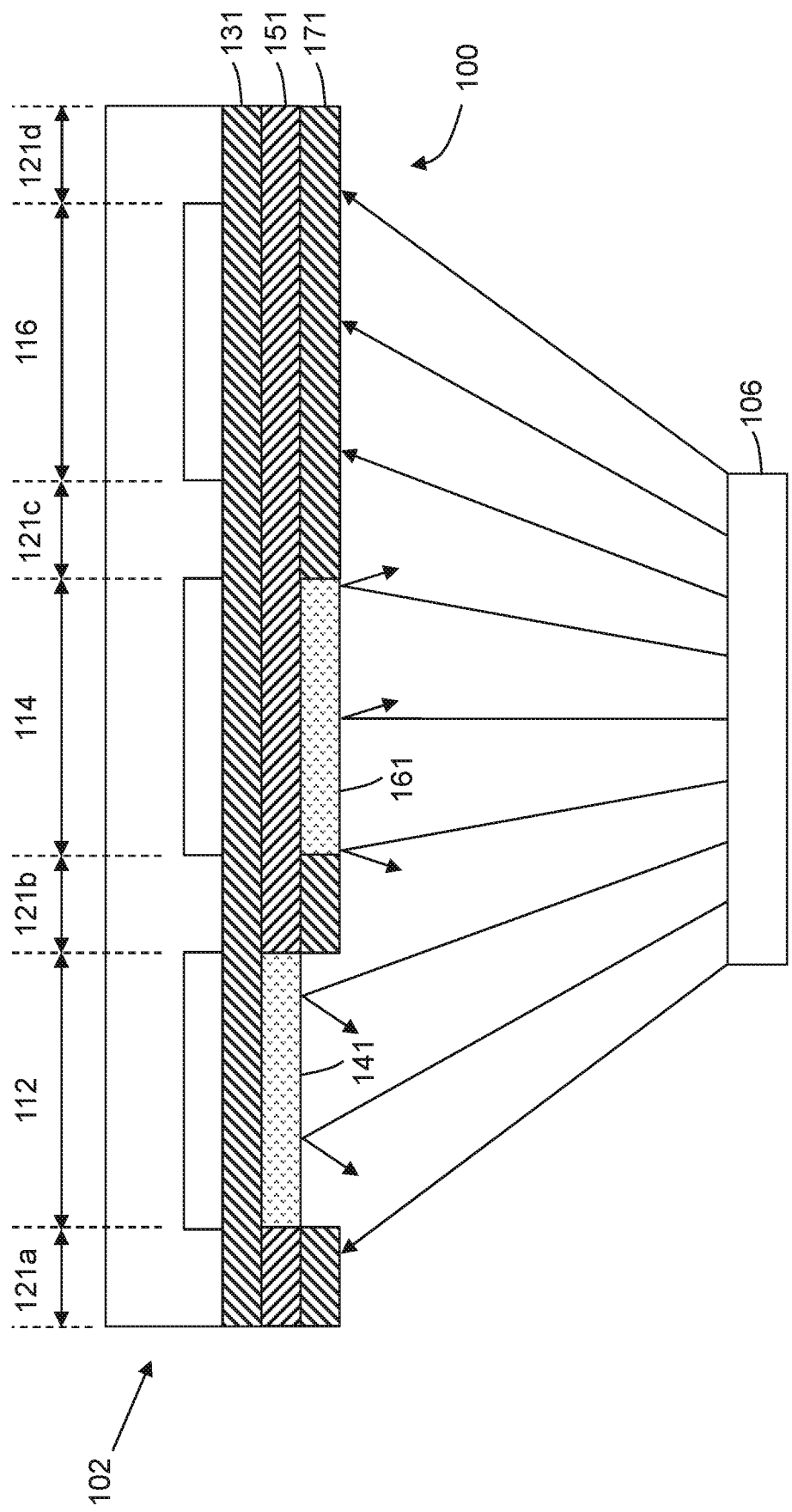

FIG. 4 is a flow diagram outlining additional stages of manufacturing a device according to one embodiment, wherein the substrate 102 comprises a third emissive region. FIGS. 5A and 5B are schematic diagrams illustrating the device at each stage of the process.

In stage 22, a second nucleation inhibiting coating 161 is selectively deposited over a portion of the second conductive coating 151. In the embodiment illustrated in FIG. 5A, the second nucleation inhibiting coating 161 is deposited to coat the portion of the second conductive coating 151 disposed over the second emissive region 114. In such embodiment, the portion of the second conductive coating 151 disposed over the third emissive region 116 is substantially free of, or exposed from, the first nucleation inhibiting coating 141 or the second nucleation inhibiting coating 161. In some embodiments, the second nucleation inhibiting coating 161 may optionally also coat portion(s) of the second conductive coating 151 deposited over one or more non-emissive regions. For example, the second nucleation inhibiting coating 161 may optionally also coat the portion(s) of the second conductive coating 151 deposited over one or more non-emissive regions adjacent to the first emissive region 112 such as the non-emissive region 121a and/or 121b, and/or those adjacent to the second emissive region 114 such as the non-emissive region 121b and/or 121c. Various processes for selectively depositing a material on a surface may be used to deposit the second nucleation inhibiting coating 161 including, but not limited to, evaporation (including thermal evaporation and electron beam evaporation), photolithography, printing (including ink or vapor jet printing, reel-to-reel printing, and micro-contact transfer printing), OVPD, LITI patterning, and combinations thereof.

Once the second nucleation inhibiting coating 161 has been deposited on a region of the surface of the second conductive coating 151, a third conductive coating 171 may be deposited on remaining uncovered region(s) of the surface where the nucleation inhibiting coating is not present. Turning to FIG. 5B, in stage 24, a conductive coating source 106 is illustrated as directing an evaporated conductive material towards the surfaces of the second conductive coating 151, the first nucleation inhibiting coating 141, and the second nucleation inhibiting coating 161. As illustrated in FIG. 5B, the conducting coating source 106 may direct the evaporated conductive material such that it is incident on both covered or treated areas (namely, regions where the first nucleation inhibiting coating 141 and the second nucleation inhibiting coating 161 are deposited thereon) and uncovered or untreated areas of the second conductive coating 151. However, since the surface of the first nucleation inhibiting coating 141 and the second nucleation inhibiting coating 161 exhibit a relatively low initial sticking coefficient compared to that of the uncovered surface of the second conductive coating 151, the third conductive coating 171 selectively deposits onto the areas where the first nucleation inhibiting coating 141 and the second nucleation inhibiting coating 161 are not present. Accordingly, the third conductive coating 171 may coat the portion of the second conductive coating 151 disposed over the third emissive region 116. As illustrated in FIG. 5B, the third conductive coating 171 may also coat other portions or regions of the second conductive coating 151, including the portions coating the non-emissive regions 121a, 121b, 121c, and 121d. The third conductive coating 171 may include, for example, pure or substantially pure magnesium. For example, the third conductive coating 171 may be formed using materials which are identical to those used to form the first conductive coating 131 and/or the second conductive coating 151. The third conductive coating 171 may be deposited using an open mask or without a mask (e.g., mask-free deposition process).

Figure 6:
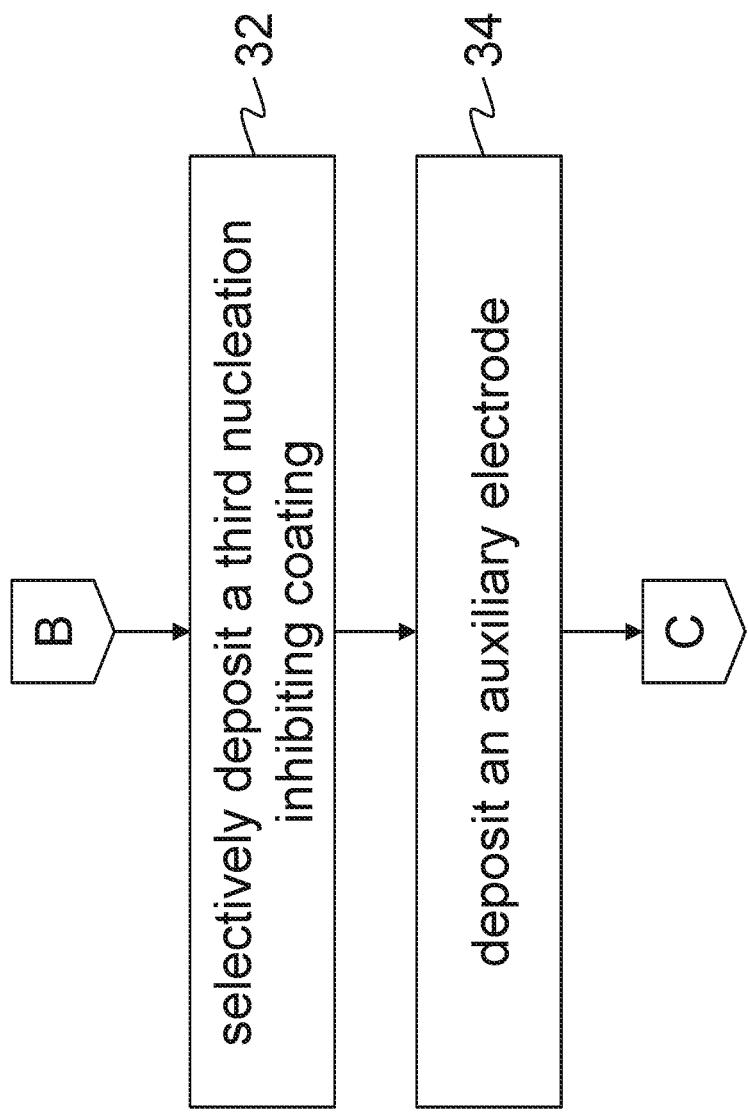
FIG. 6 is a flow diagram illustrating the stages for fabricating a device according to a further embodiment.
Figure 7A:
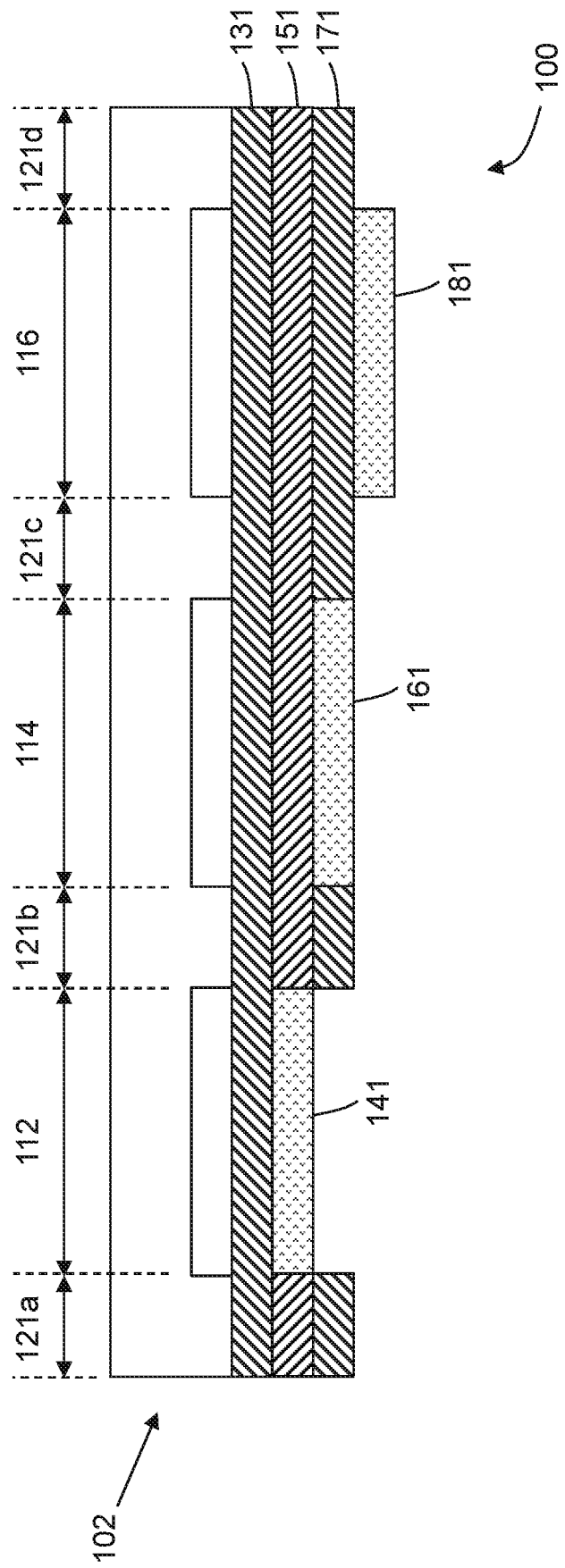
FIG. 7A and FIG. 7B are schematic diagrams illustrating the various stages of device fabrication according to the embodiment of FIG. 6.
Figure 7B:
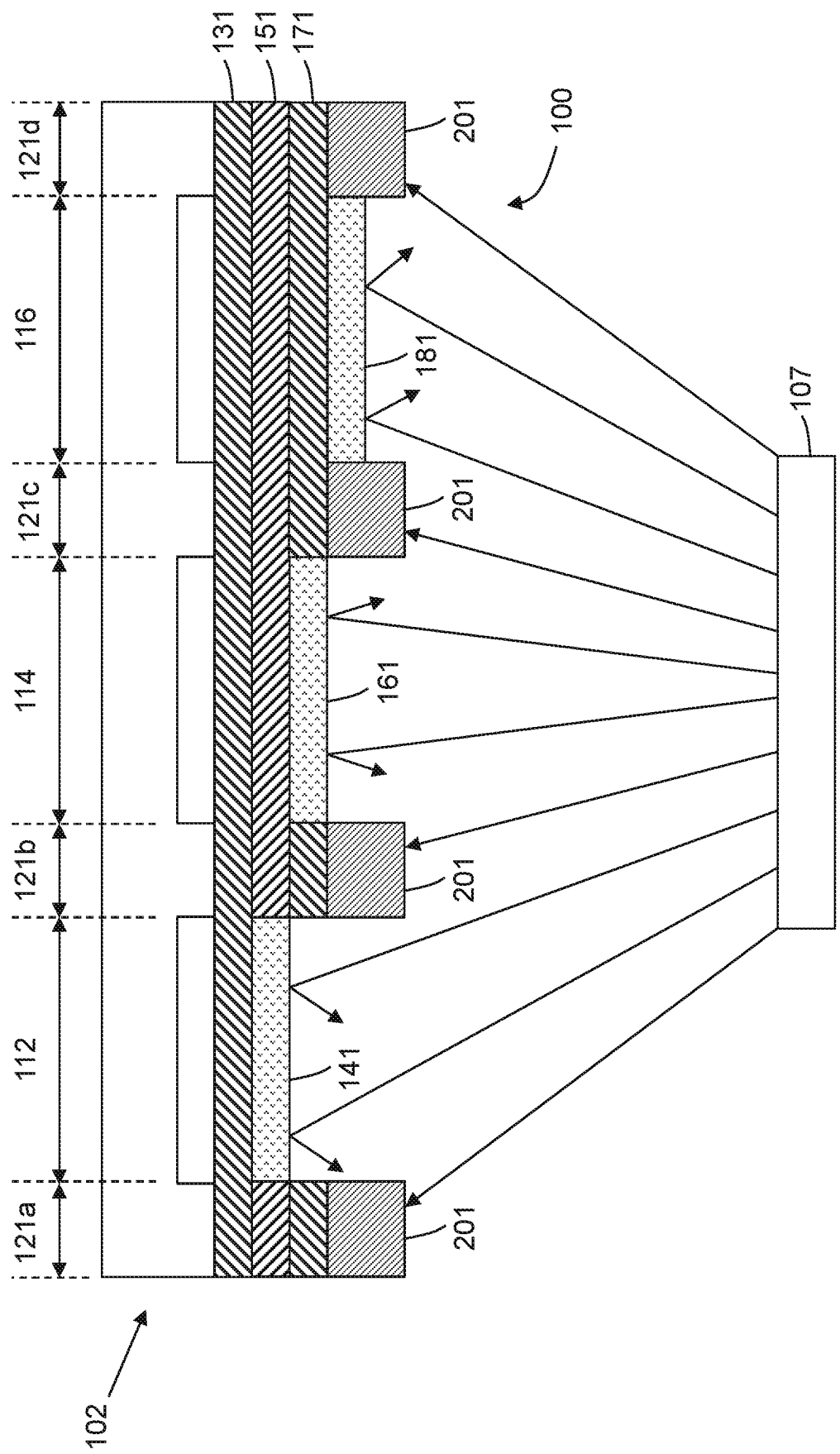

In a further embodiment, following stage 24, additional coating(s) may be deposited on the device. FIG. 6 is a flow diagram outlining additional coating stages according to one such further embodiment. FIGS. 7A and 7B are schematic diagrams illustrating the device at each stage of the process.

In stage 32, a third nucleation inhibiting coating 181 is selectively deposited on a portion of the third conductive coating 171. Specifically, in the embodiment illustrated in FIG. 7A, the third nucleation inhibiting coating 181 is deposited to coat the portion of the third conductive coating 171 disposed over the third emissive region 116. In some embodiments, the third nucleation inhibiting coating 181 may optionally also coat portion(s) of the third conductive coating 171 deposited over one or more non-emissive regions. For example, the third nucleation inhibiting coating 181 may optionally also coat the portion(s) of the third conductive coating 171 deposited over one or more non-emissive regions 121a-d. Various processes for selectively depositing a material on a surface may be used to deposit the third nucleation inhibiting coating 181 including, but not limited to, evaporation (including thermal evaporation and electron beam evaporation), photolithography, printing (including ink or vapor jet printing, reel-to-reel printing, and micro-contact transfer printing), OVPD, LITI patterning, and combinations thereof.

In stage 34, a source 107 is illustrated as directing an evaporated conductive material towards the surfaces of the third conductive coating 171, the first nucleation inhibiting coating 141, the second nucleation inhibiting coating 161, and the third nucleation inhibiting coating 181 to deposit an auxiliary electrode 201. As illustrated in FIG. 7B, the conducting coating source 107 may direct the evaporated conductive material such that it is incident on both covered or treated areas (namely, regions where the first nucleation inhibiting coating 141, the second nucleation inhibiting coating 161, and the third nucleation inhibiting coating 181 are present) and uncovered or untreated areas of the third conductive coating 171. However, since the surface of the first nucleation inhibiting coating 141, the second nucleation inhibiting coating 161, and the third nucleation inhibiting coating 181 exhibit a relatively low initial sticking coefficient compared to that of the uncovered surface of the third conductive coating 171, the auxiliary electrode 201 selectively deposits onto the areas of the where the first nucleation inhibiting coating 141, the second nucleation inhibiting coating 161, and the third nucleation inhibiting coating 181 are not present. Accordingly, the auxiliary electrode 201 may coat the portions of the third conductive coating 171 corresponding to the non-emissive regions 121a, 121b, 121c, and 121d. The auxiliary electrode 201 may include, for example, pure or substantially pure magnesium. For example, the auxiliary electrode 201 may be formed using materials which are identical to those used to form the first conductive coating 131, the second conductive coating 151, and/or the third conductive coating 171. The auxiliary electrode 201 may be deposited using an open mask or without a mask (e.g., mask-free deposition process). In other embodiments, one or more non-emissive regions 121a, 121,b 121c, and/or 121d may be coated with the first nucleation inhibiting coating such that deposition of the second conductive coating and/or third conductive coating thereon is substantially prevented.

It may be particularly advantageous to provide an auxiliary electrode in cases where the conductive coatings form a light-transmissive electrode of a device. In particular, such light-transmissive electrode may have a low thickness to allow transmission of light. However, a reduction in the thickness of a transmissive electrode is accompanied by an increase in its sheet resistance. An electrode with a high sheet resistance is generally undesirable for use in devices such as OLEDs, since it creates a large current-resistance (IR) drop when a device is in use, which is detrimental to the performance and efficiency of OLEDs. The IR drop can be compensated to some extent by increasing a power supply level; however, when the power supply level is increased for one pixel, voltages supplied to other components are also increased to maintain proper operation of the device, and thus is unfavorable.

In order to reduce power supply specifications for top-emission OLED devices, solutions have been proposed to form busbar structures or auxiliary electrodes on the devices. For example, such an auxiliary electrode may be formed by depositing a conductive coating in electrical communication with a transmissive electrode of an OLED device. Such an auxiliary electrode may allow current to be carried more effectively to various regions of the device by lowering a sheet resistance and an associated IR drop of the transmissive electrode.

Figure 8:
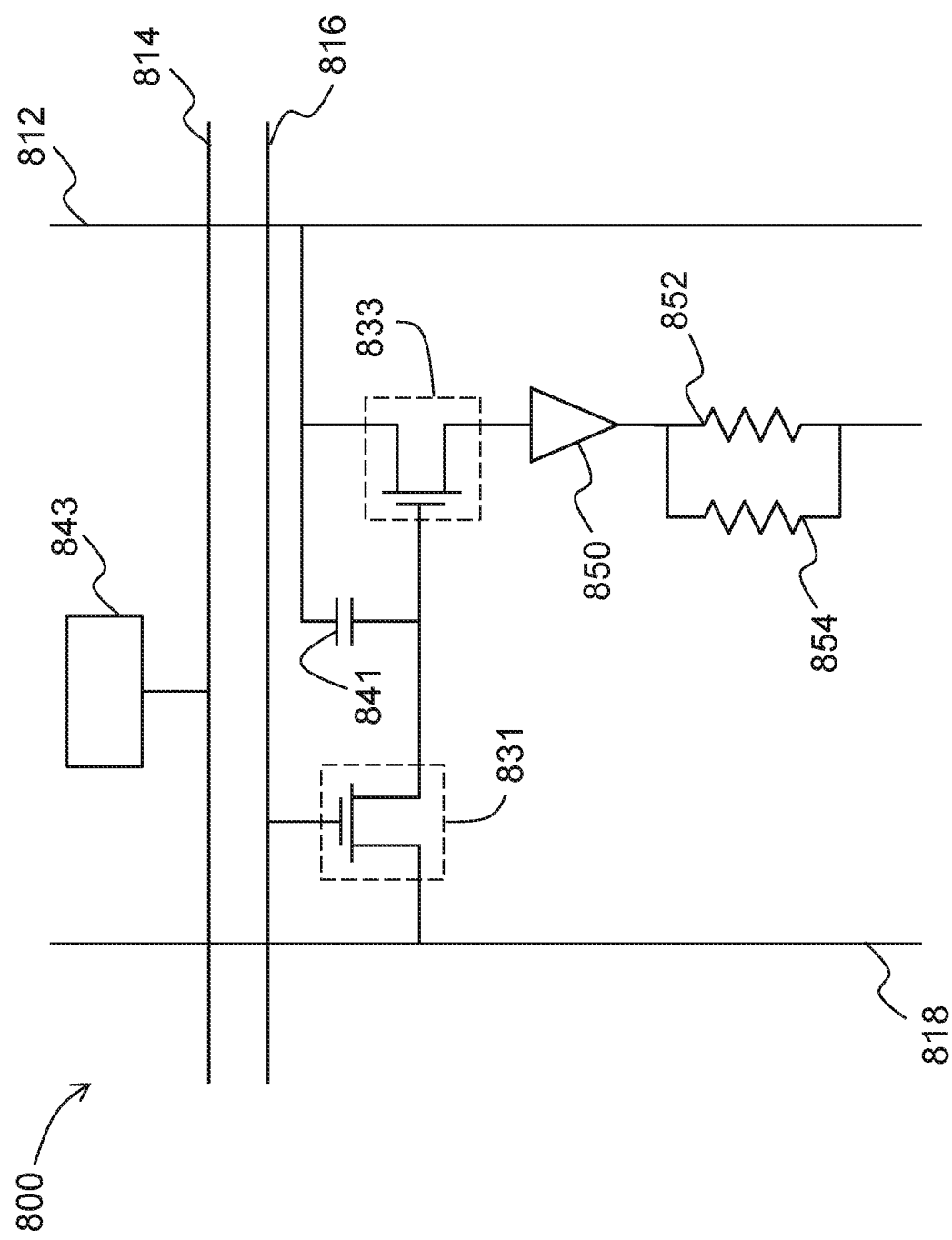
FIG. 8 is a schematic diagram illustrating a circuit diagram of an active-matrix OLED (AMOLED) according to one example.

The effect of an electrode sheet resistance will now be explained with reference to FIG. 8, which shows an example of a circuit diagram for a top-emission active matrix OLED (AMOLED) pixel with a p-type thin-film transistor (TFT). In FIG. 8, a circuit 800 includes a power supply (VDD) line 812, a control line 814, a gate line 816, and a data line 818. A driving circuit including a first TFT 831, a second TFT 833, and a storage capacitor 841 is provided, and the driving circuit components are connected to the data line 818, the gate line 816, and the VDD line 812 in the manner illustrated in the figure. A compensation circuit 843 is also provided, which generally acts to compensate for any deviation in transistor properties caused by manufacturing variances or degradation of the TFTs 831 and 833 over time.

An OLED pixel or subpixel 850 and a cathode 852, which is represented as a resistor in the circuit diagram, are connected in series with the second TFT 833 (also referred to as a "driving transistor"). The driving transistor 833 regulates a current passed through the OLED pixel 850 in accordance with a voltage of a charge stored in the storage capacitor 841, such that the OLED pixel 850 outputs a desired luminance. The voltage of the storage capacitor 841 is set by connecting the storage capacitor 841 to the data line 818 via the first TFT 831 (also referred to as a "switch transistor").

Since the current through the OLED pixel or subpixel 850 and the cathode 852 is regulated based on a potential difference between a gate voltage and a source voltage of the driving transistor 833, an increase in a sheet resistance of the cathode 852 results in a greater IR drop, which is compensated by increasing the power supply (VDD). However, when the VDD is increased, other voltages supplied to the TFT 833 and the OLED pixel 850 are also increased to maintain proper operation, and thus is unfavorable.

Referring to FIG. 8, an auxiliary electrode 854 is illustrated as a resistor connected in parallel to the cathode 852. Since the resistance of the auxiliary electrode 854 is substantially lower than that of the cathode 852, a combined effective resistance of the auxiliary electrode 854 and the cathode 852 is lower than that of the cathode 852 alone. Accordingly, an increase in the VDD can be mitigated by the presence of the auxiliary electrode 854.

Since an auxiliary electrode is typically provided on top of an OLED stack which includes an anode, one or more organic layers, and a cathode, patterning of the auxiliary electrode is traditionally achieved using a shadow mask with mask apertures through which a conductive coating is selectively deposited, for example by a physical vapor deposition (PVD) process. However, since masks are typically metal masks, they have a tendency to warp during a high-temperature deposition process, thereby distorting mask apertures and a resulting deposition pattern. Furthermore, a mask is typically degraded through successive depositions, as a conductive coating adheres to the mask and obfuscates features of the mask. Consequently, such a mask should either be cleaned using time-consuming and expensive processes or should be disposed once the mask is deemed to be ineffective at producing the desired pattern, thereby rendering such process highly costly and complex. Accordingly, a process for depositing a conductive coating using a shadow mask may not be commercially feasible for mass production of OLED devices. Moreover, an aspect ratio of features which can be produced using the shadow mask process is typically constrained due to shadowing effects and a mechanical (e.g., tensile) strength of the metal mask, since large metal masks are typically stretched during a shadow mask deposition process.

Another challenge of patterning a conductive coating onto a surface through a shadow mask is that certain, but not all, patterns can be achieved using a single mask. As each portion of the mask is physically supported, not all patterns are possible in a single processing stage. For example, where a pattern specifies an isolated feature, a single mask processing stage typically cannot be used to achieve the desired pattern. In addition, masks which are used to produce repeating structures (e.g., busbar structures or auxiliary electrodes) spread across an entire device surface include a large number of perforations or apertures formed on the masks. However, forming a large number of apertures on a mask can compromise the structural integrity of the mask, thus leading to significant warping or deformation of the mask during processing, which can distort a pattern of deposited structures.

Using the process described above, and in particular, the process described with reference to FIGS. 6, 7A, and 7B, the auxiliary electrode 201 may be selectively deposited on non-emissive regions of the device without the use of a fine metal mask during the auxiliary electrode deposition step. Furthermore, since the nucleation inhibiting layers used to conduct selective deposition of the second conductive coating and/or the third conductive coating may be used to substantially inhibit the deposition of the auxiliary electrode 201 in the emissive region(s) of the device, deposition of the auxiliary electrode 201 is further facilitated.

The first conductive coating 131, the second conductive coating 151, and the third conductive coating 171 may be light transmissive or substantially transparent in at least a portion of the visible wavelength range of the electromagnetic spectrum. For further clarity, the first conductive coating 131, the second conductive coating 151, and the third conductive coating 171 may each be light transmissive or substantially transparent in at least a portion of the visible wavelength range of the electromagnetic spectrum. Thus when the second conductive coating and/or the third conductive coating are disposed on top of the first conductive coating to form a multi-coating electrode, such electrode may also be light transmissive or substantially transparent in the visible wavelength portion of the electromagnetic spectrum. For example, the light transmittance of the first conductive coating 131, the second conductive coating 151, the third conductive coating 171, and/or the multi-coating electrode may be greater than about 30%, greater than about 40%, greater than about 45%, greater than about 50%, greater than about 60%, greater than 70%, greater than about 75%, or greater than about 80% in a visible portion of the electromagnetic spectrum. At least in some cases, it may be particularly desirable for the first conductive coating 131, the second conductive coating 151, the third conductive coating 171, and/or the multi-coating electrode to exhibit a relatively high light transmittance across the visible portion of the electromagnetic spectrum (e.g., in the wavelength range from about 390 nm to about 700 nm).

In some embodiments, the thickness of the first conductive coating 131, the second conductive coating 151, and the third conductive coating 171 may be made relatively thin to maintain a relatively high light transmittance. For example, the thickness of the first conductive coating 131 may be about 5 to 30 nm, about 8 to 25 nm, or about 10 to 20 nm. The thickness of the second conductive coating 151 may, for example, be about 1 to 25 nm, about 1 to 20 nm, about 1 to 15 nm, about 1 to 10 nm, or about 3 to 6 nm. The thickness of the third conductive coating 171 may, for example, be about 1 to 25 nm, about 1 to 20 nm, about 1 to 15 nm, about 1 to 10 nm, or about 3 to 6 nm. Accordingly, the thickness of a multi-coating electrode formed by the combination of the first conductive coating 131 and the second conductive coating 151 and/or the third conductive coating 171 may, for example, be about 6 to 35 nm, about 10 to 30 nm, or about 10 to 25 nm, or about 12 to 18 nm.

The thickness of the auxiliary electrode 201 may be substantially greater than the thickness of the first conductive coating 131, the second conductive coating 151, the third conductive coating, and/or the multi-coating electrode. For example, the thickness of the auxiliary electrode 201 may be greater than about 50 nm, greater than about 80 nm, greater than about 100 nm, greater than about 150 nm, greater than about 200 nm, greater than about 300 nm, greater than about 400 nm, greater than about 500 nm, greater than about 700 nm, greater than about 800 nm, greater than about 1 µm, greater than about 1.2 µm, greater than about 1.5 µm, greater than about 2 µm, greater than about 2.5 µm, or greater than about 3 µm. In some embodiments, the auxiliary electrode 201 may be substantially non-transparent or opaque. However, since the auxiliary electrode 201 is generally provided in the non-emissive region(s) of the device, the auxiliary electrode 201 may not cause significant optical interference. For example, the light transmittance of the auxiliary electrode 201 may be less than about 50%, less than about 70%, less than about 80%, less than about 85%, less than about 90%, or less than about 95% in the visible portion of the electromagnetic spectrum. In some embodiments, the auxiliary electrode 201 may absorb light in at least a portion of the visible wavelength range of the electromagnetic spectrum.

The first emissive region 112, the second emissive region 114, and/or the third emissive region 116 may correspond to subpixel regions of an OLED display device in some embodiments. Accordingly, it will be appreciated that the substrate 102 onto which various coatings are deposited may include one or more additional organic and/or inorganic layers not specifically illustrated or described in the foregoing embodiments. For example, the OLED display device may be an active-matrix OLED (AMOLED) display device. In such embodiments, the substrate 102 may comprise an electrode and at least one organic layer deposited over the electrode in each emissive region (e.g. subpixel), such that the first conductive coating 131 may be deposited over the at least one organic layer. For example, the electrode may be an anode, and the first conductive coating 131, either by itself or in combination with the second conductive coating 151, the third conductive coating 171, and/or any additional conductive coatings, may form a cathode. The at least one organic layer may comprise an emitter layer. The at least one organic layer may further comprise a hole injection layer, a hole transport layer, an electron blocking layer, a hole blocking layer, an electron transport layer, an electron injection layer, and/or any additional layers. The substrate 102 may further comprise a plurality of TFTs. Each anode provided in the device may be electrically connected to at least one TFT. For example, the substrate 100 may include one or more top-gate TFTs, one or more bottom-gate TFTs, and/or other TFT structures. A TFT may be a n-type TFT or a p-type TFT. Examples of TFT structures include those including amorphous silicon (a-Si), indium gallium zinc oxide (IGZO), and low-temperature polycrystalline silicon (LTPS).

The substrate 102 may also include a base substrate for supporting the above-identified additional organic and/or inorganic layers. For example, the base substrate may be a flexible or rigid substrate. The base substrate may include, for example, silicon, glass, metal, polymer (e.g., polyimide), sapphire, or other materials suitable for use as the base substrate.

The first emissive region 112, the second emissive region 114, and the third emissive region 116 may be subpixels configured to emit light of different wavelength or emission spectrum from one another. The first emissive region 112 may be configured to emit light having a first wavelength or first emission spectrum, the second emissive region 114 may be configured to emit light having a second wavelength or second emission spectrum, and the third emissive region 116 may be configured to emit light having a third wavelength or third emission spectrum. The first wavelength may be less than or greater than the second wavelength and/or the third wavelength, the second wavelength may be less than or greater than the first wavelength and/or the third wavelength, and the third wavelength may be less than or greater than the first wavelength and/or the second wavelength. For example, the first emissive region 112 may correspond to a blue subpixel, the second emissive region 114 may correspond to a green subpixel, and the third emissive region 116 may correspond to a red subpixel. In other examples, the emission spectrum or the emitted color associated with the first emissive region 112, the second emissive region 114, and the third emissive region 116 may be different. The first emissive region 112 in combination with the second emissive region 114 and/or the third emissive region 116 may form a pixel of a display device. It will be appreciated that such display device typically includes a plurality of pixels. Accordingly, in various embodiments described herein, a plurality of first emissive regions, a plurality of second emissive regions, and a plurality of third emissive regions may be provided. For example, the emissive regions forming the plurality of first, second, and/or third emissive regions may be arranged in a distributed manner across the display device, and each grouping of emissive regions (e.g., each of the first emissive regions, the second emissive regions, and third emissive regions) may correspond to the subpixels of a particular emission color or spectrum. In such example, the emissive regions belonging to each grouping may have a substantially identical structure and configuration to other emissive regions within the same grouping.

In some embodiments, the first nucleation inhibiting coating 141, the second nucleation inhibiting coating 161, and/or the third nucleation inhibiting coating 181 may be selectively deposited using the same shadow mask used to deposit the at least one organic layer. In this way, the optical microcavity effect may be tuned for each subpixel in a cost-effective manner due to there being no additional mask requirements for depositing the nucleation inhibiting coatings.

In some embodiments, the method may further include additional stages following stage 24 or stage 34. Such additional stages may include, for example, depositing one or more additional nucleation inhibiting coatings, depositing one or more additional conductive coatings, depositing an auxiliary electrode, depositing an outcoupling coating, and/or encapsulation of the device.

In some embodiments, an outcoupling coating may be deposited following the deposition of the first conductive coating in stage 12. For example, the outcoupling coating may be deposited over the surface of the first conductive coating after stage 12, and before the deposition of the second conductive coating in stage 16. In another example, the outcoupling coating may be deposited after the deposition of the second conductive coating in stage 16, and before the deposition of the third conductive coating in stage 24, thus resulting in a device wherein an outcoupling coating is disposed between the first conductive coating and the second conductive coating. The outcoupling coating may comprise, for example, small-molecule organic compounds, polymers, organo-metallic compounds, and/or inorganic compounds and elements. The thickness of the outcoupling coating may, for example, be about 5 to 60 nm. The outcoupling coating may be deposited using an open mask or mask-free deposition process. Alternatively, the outcoupling coating may be selectively deposited using various processes described above including, but not limited to, evaporation (including thermal evaporation and electron beam evaporation), photolithography, printing (including ink or vapor jet printing, reel-to-reel printing, and micro-contact transfer printing), OVPD, LITI patterning, and combinations thereof. As will be explained further, certain conductive materials such as magnesium may not be readily deposited onto the surface of outcoupling coating in at least some cases, particularly if the outcoupling coating is formed by organic materials. Accordingly, in some examples, a nucleation promoting coating may be deposited over portions of the outcoupling coating where a conductive coating is to be deposited. For example, a nucleation promoting coating may be deposited over the emissive region(s) to allow deposition of additional conductive coating(s) thereon.

It will also be appreciated that in some embodiments, the first conductive coating, the second conductive coating, and/or the third conductive coating may be deposited using an open mask. An open mask generally serves to "mask" or prevent deposition of a material on certain regions of a substrate. However, unlike a fine metal mask (FMM) used to form relatively small features with a feature size on the order of tens of microns or smaller, a feature size defined by an open mask is generally comparable to the size of an OLED device being manufactured. For example, the open mask may mask edges of a display device during manufacturing, which would result in the open mask having an aperture that approximately corresponds to a size of the display device (e.g. about 1 inch for micro-displays, about 4-6 inches for mobile displays, about 8-17 inches for laptop or tablet displays, and so forth). For example, the feature size of an open mask may be on the order of about 1 cm or greater.

Figure 9:
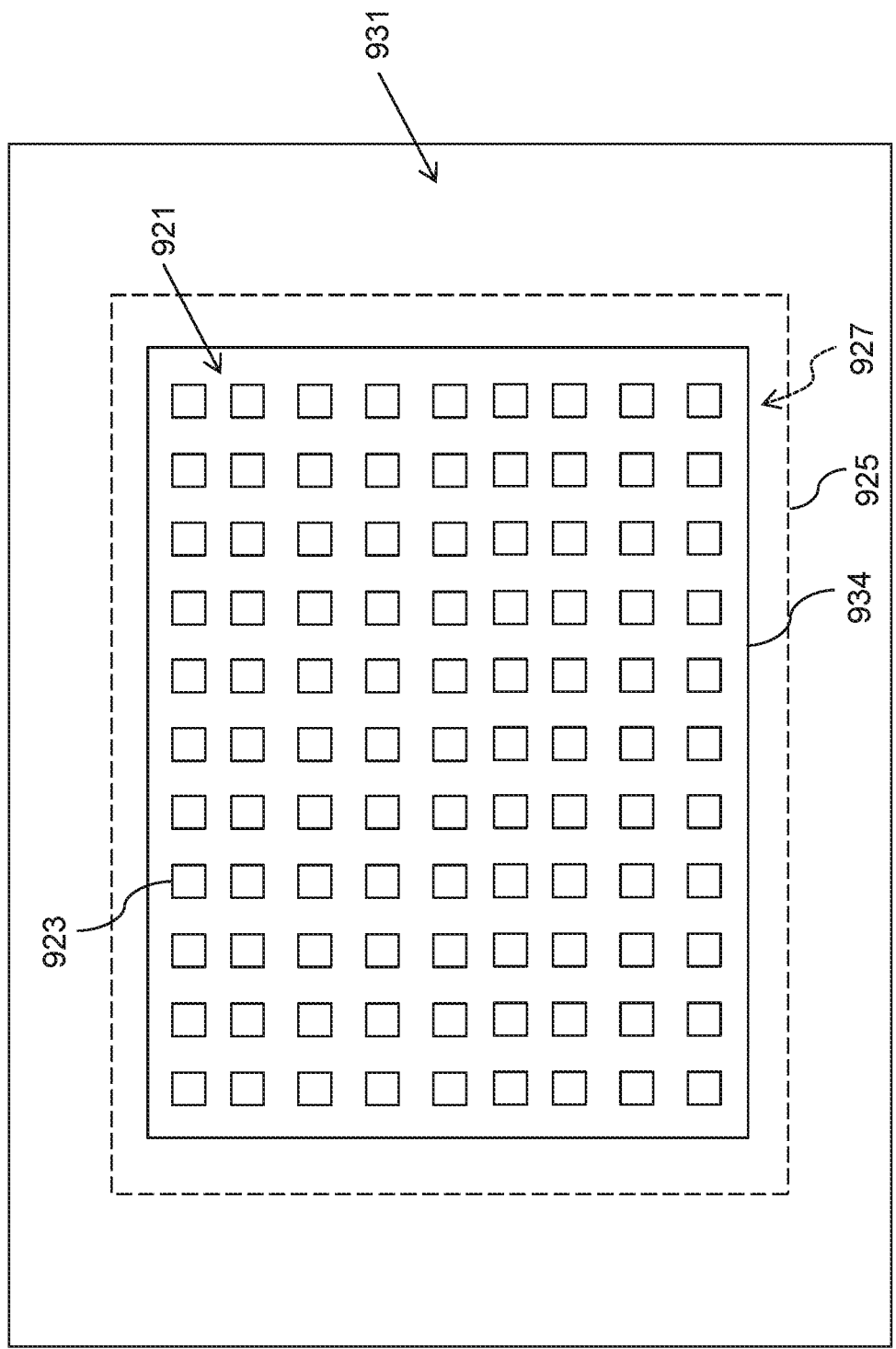
FIG. 9 is a diagram illustrating an open mask according to one example.

FIG. 9 illustrates an example of an open mask 931 having or defining an aperture 934 formed therein. In the illustrated example, the aperture 934 of the mask 931 is smaller than a size of a device 921, such that, when the mask 931 is overlaid, the mask 931 covers edges of the device 921. Specifically, in the illustrated embodiments, all or substantially all emissive regions or pixels 923 of the device 921 are exposed through the aperture 934, while an unexposed region 927 is formed between outer edges 925 of the device 921 and the aperture 934. As would be appreciated, electrical contacts or other device components may be located in the unexposed region 927 such that these components remain unaffected through the open mask deposition process. It will be appreciated that, in cases where a plurality of independent devices are fabricated concurrently on a single substrate, the open mask may comprise a plurality of apertures, wherein each aperture corresponds to a device region.

In another aspect according to some embodiments, an opto-electronic device is provided. The opto-electronic device may be an electroluminescent device. In some embodiments, the device comprises a first emissive region and a second emissive region. The first emissive region may be configured to emit light of different wavelength from the second emissive region. In other words, for example, the first emissive region may be configured to emit light having a first wavelength, and the second emissive region may be configured to emit light having a second wavelength. The first wavelength may be greater than or less than the second wavelength. For example, a wavelength of light emitted by each emissive region may correspond to a peak wavelength (e.g., the wavelength at which the radiometric emission spectrum is at its maximum) or a dominant wavelength (e.g., the wavelength perceived by the human eye). The device further comprises a conductive coating disposed in the first emissive region and the second emissive region. The conductive coating may include a first portion disposed in the first emissive region, and a second portion disposed in the second emissive region. The first portion may have a first thickness and the second portion may have a second thickness, wherein the first thickness is different from the second thickness. For example, the first thickness may be greater than or less than the second thickness. For example, the second thickness may be greater than the first thickness, such as where the second thickness is at least about 1.1 times, at least about 1.2 times, at least about 1.3 times, at least about 1.4 times, at least about 1.5 times, at least about 1.8 times, or at least about 2 times the first thickness.

Figure 10:
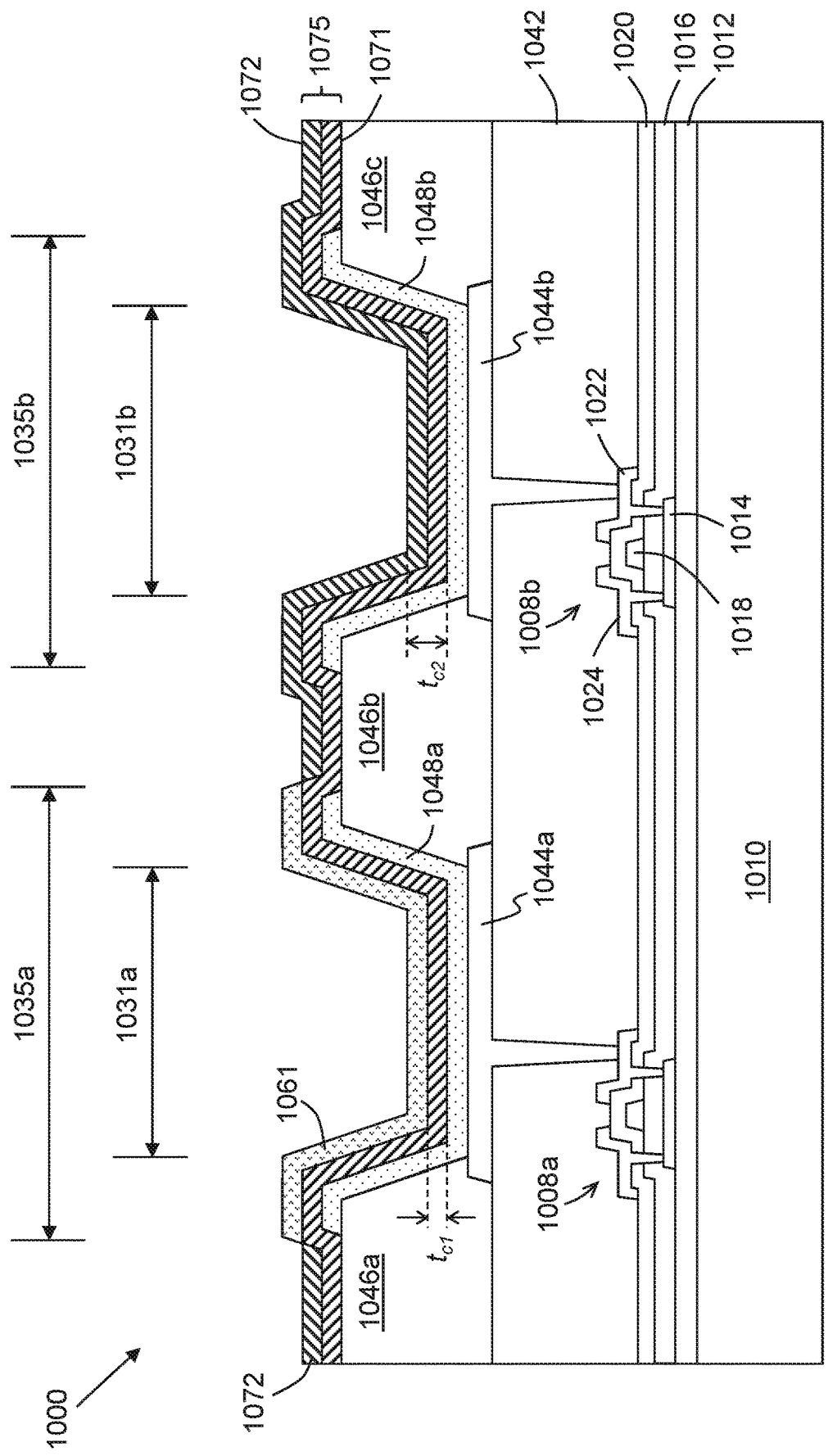
FIG. 10 is a schematic diagram illustrating the cross-section of an AMOLED device according to one embodiment.

FIG. 10 is a cross-sectional schematic diagram illustrating a portion of an AMOLED device 1000 according to one embodiment. The AMOLED device 1000 includes a first emissive region 1031a and a second emissive region 1031b. The first emissive region 1031a and the second emissive region 1031b may be subpixels of the AMOLED device 1000.

The device 1000 includes a base substrate 1010, and a buffer layer 1012 deposited over a surface of the base substrate 1010. A plurality of TFTs 1008a, 1008b is then formed over the buffer layer 1012. Specifically with reference to the TFT 1008b, a semiconductor active area 1014 is formed over a portion of the buffer layer 1012, and a gate insulating layer 1016 is deposited to substantially cover the semiconductor active area 1014. Next, a gate electrode 1018 is formed on top of the gate insulating layer 1016, and an interlayer insulating layer 1020 is deposited. A source electrode 1024 and a drain electrode 1022 are formed such that they extend through openings formed through the interlayer insulating layer 1020 and the gate insulating layer 1016 to be in contact with the semiconductor active layer 1014. An insulating layer 1042 is then formed over the TFTs 1008a, 1008b. A first electrode 1044a, 1044b is then formed in each of the first emissive region 1031a, and the second emissive region 1031b, respectively, over a portion of the insulating layer 1042. As illustrated in FIG. 10, each of the first electrode 1044a, 1044b extends through an opening of the insulating layer 1042 such that it is in electrical communication with the drain electrode 1022 of the respective TFTs 1008a, 1008b. Pixel definition layers (PDLs) 1046a, 1046b, 1046c are then formed to cover at least a portion of the first electrodes 1044a, 1044b, including the outer edges of each electrode. For example, the PDLs 1046a, 1046b, 1046c may include an insulating organic or inorganic material. An organic layer 1048a, 1048b is then deposited over the respective first electrode 1044a, 1044b, particularly in regions between neighboring PDLs 1046a, 1046b, 1046c. A first conductive coating 1071 is deposited to substantially cover both the organic layers 1048a, 1048b and the PDLs 1046a, 1046b, 1046c. For example, the first conductive coating 1071 may form a common cathode, or a portion thereof. A first nucleation inhibiting coating 1061 is selectively deposited over a first portion 1035a of the first conductive coating 1071 disposed over the first emissive region 1031a. For example, the first nucleation inhibiting coating 1061 may be selectively deposited using a fine metal mask or a shadow mask. Accordingly, a second conductive coating 1072 is selectively deposited over an exposed surface of the first conductive coating 1071 using an open mask or a mask-free deposition process. For further specificity, by conducting thermal deposition of the second conductive coating 1072 (e.g., including magnesium) using an open mask or without a mask, the second conductive coating 1072 is selectively deposited over the exposed surface of the first conductive coating 1071, while leaving a surface of the first nucleation inhibiting coating 1061 substantially free of a material of the second conductive coating 1072. Accordingly, the second conductive coating 1072 may be deposited directly on top of, or in direct physical contact with, the first conductive coating 1071.

In the device 1000 illustrated in FIG. 10, the first conductive coating 1071 and the second conductive coating 1072 collectively form a common cathode 1075. Specifically, the common cathode 1075 may be formed by the combination of the first conductive coating 1071 and the second conductive coating 1072, wherein the second conductive coating 1072 is disposed directly over at least a portion of the first conductive coating 1071. The common cathode 1075 has a first thickness $t_{c1}$ in the first emissive region 1031a, and a second thickness $t_{c2}$ in the second emissive region 1031b. The first thickness $t_{c1}$ may correspond to the thickness of the first conductive coating 1071, and the second thickness $t_{c2}$ may correspond to the combined thickness of the first conductive coating 1071 and the second conductive coating 1072. The first portion 1035a and a second portion 1035b of the first conductive coating 1071 may be formed integrally or continuous with each other to provide a single monolithic structure. For example, the first conductive coating 1071 may further comprise an intermediate portion disposed between the first portion 1035a and the second portion 1035b, and the intermediate portion connecting the first portion 1035a and the second portion 1035b. Alternatively, in some embodiments, the first portion 1035a and the second portion 1035b may be formed as separate structures which are spaced apart from each other. For example, the first portion and the second portion coating the respective emissive regions may be formed as separate structures by disposing, between the first portion and the second portion, a nucleation inhibiting coating prior to depositing the first conductive coating. For example, the nucleation inhibiting coating may be disposed in the non-emissive region between the emissive regions. In this way, the deposition of the first conductive coating material in the region coated with the nucleation inhibiting coating may be inhibited, thus the first portion and the second portion may be formed as separate structures spaced apart from each other. Alternatively, other methods for selectively depositing the conductive coating may be used to form the first portion and the second portion as separate structures.

In some embodiments, the first nucleation inhibiting coating 1061 may be selectively deposited to coat at least the first portion 1035a of the first conductive coating 1071 using the same shadow mask used to selectively deposit the organic layer 1048a.

In some embodiments, the first nucleation inhibiting coating 1061 may be an optical out-coupling coating. As will be appreciated, an optical out-coupling coating may be provided to enhance the out-coupling efficiency of the device. Accordingly, the nucleation inhibiting coating may be formed, for example, by materials exhibiting relatively high refractive index. In other embodiments, an out-coupling coating separate from the first nucleation inhibiting coating 1061 may be provided.

Figure 11:
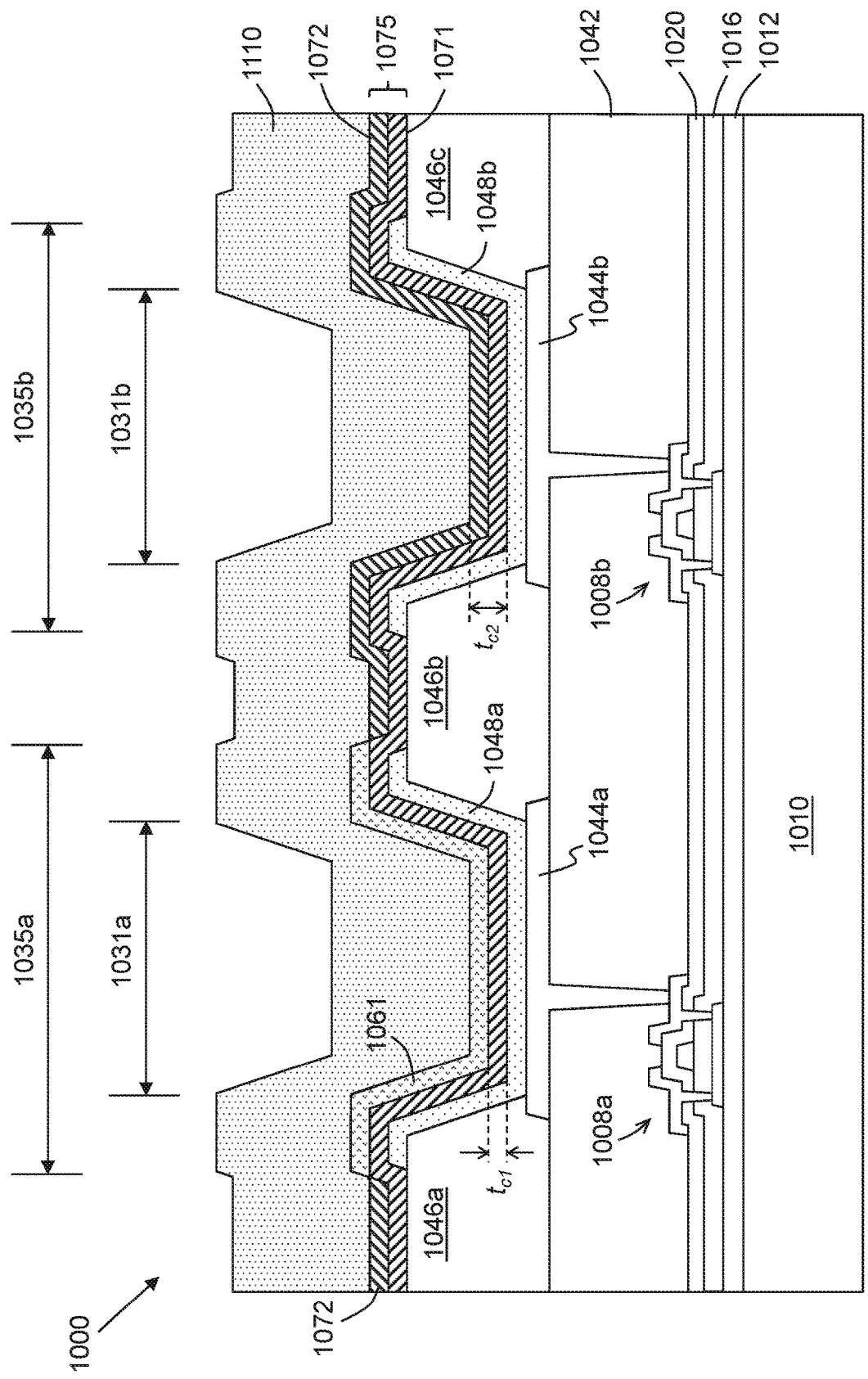
FIG. 11 is a schematic diagram illustrating the cross-section of an AMOLED device according to another embodiment.

FIG. 11 illustrates an embodiment wherein the device 1000 of FIG. 10 further includes an out-coupling coating 1110. As illustrated, the out-coupling coating 1110 may be deposited to coat the first emissive region 1031a and the second emissive region 1031b. The out-coupling coating 1110 may further coat the non-emissive regions of the device, for example in cases where the out-coupling coating 1110 is deposited using an open mask or mask-free deposition process. The out-coupling coating 1110 may comprise the same material composition as the first nucleation inhibiting coating 1061. Alternatively, the out-coupling coating 1110 may have a different material composition than the first nucleation inhibiting coating 1061.

Figure 12:
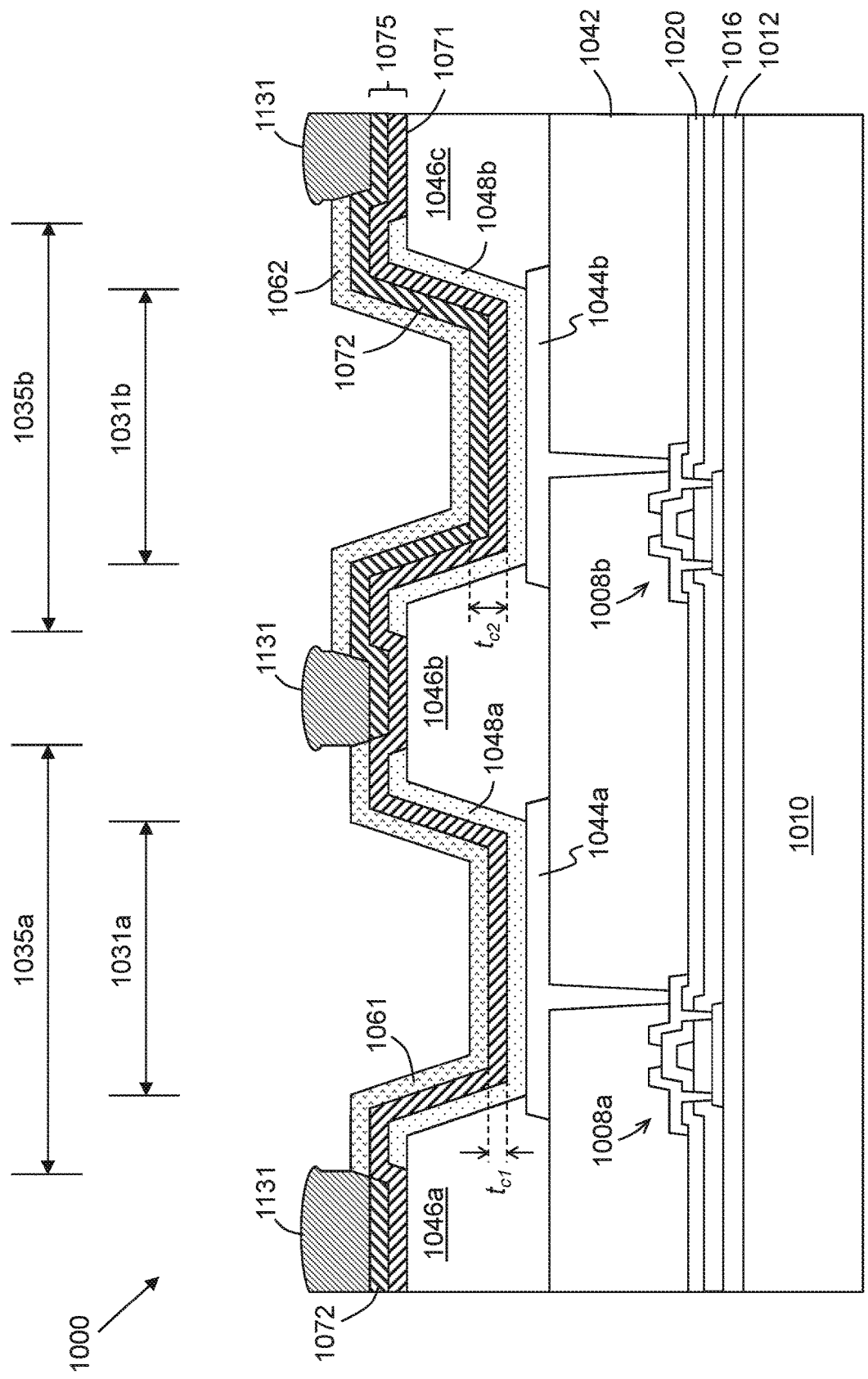
FIG. 12 is a schematic diagram illustrating the cross-section of an AMOLED device according to yet another embodiment.

FIG. 12 illustrates another embodiment wherein the device 1000 of FIG. 10 further includes an auxiliary electrode 1131. The auxiliary electrode 1131 may be provided in the non-emissive portions of the device 1000. In the embodiment of FIG. 12, the auxiliary electrode 1131 is disposed in the regions adjacent to the emissive regions 1031a, 1031b, corresponding to the regions wherein the PDLs 1046a-c are present. For example, the auxiliary electrode 1131 may be deposited using an open mask or mask-free deposition process. The deposition of the material used to form the auxiliary electrode 1131 in the first emissive region 1031a and the second emissive region 1031b may be substantially prevented by the presence of the first nucleation inhibiting coating 1061 and the second nucleation inhibiting coating 1062, respectively. In some embodiments, the auxiliary electrode 1131 may be formed using the same materials as the first conductive coating 1071 and/or the second conductive coating 1072. For example, the auxiliary electrode 1131 may include magnesium. For example, the auxiliary electrode 1131 may comprise substantially pure magnesium.

In the embodiment of FIG. 12, the thickness of the first nucleation inhibiting coating 1061 and the thickness of the second nucleation inhibiting coating 1062 may substantially be the same. Alternatively, the thickness of the first nucleation inhibiting coating 1061 may be less than, or greater than the thickness of the second nucleation inhibiting coating 1062 in some embodiments. For example, it may be particularly advantageous to vary the thickness of the nucleation inhibiting coating deposited over different emissive regions or subpixels of a device in cases where the nucleation inhibiting coating also functions as an out-coupling coating. By adjusting the thickness of the nucleation inhibiting coating (and thus the out-coupling coating) in addition to the thickness of the common cathode between different subpixels, the optical microcavity effects may be modulated on a subpixel-to-subpixel scale. In other embodiments, the device 1000 of FIG. 12 may further comprise an additional out-coupling coating deposited over the nucleation inhibiting coatings, and optionally, the auxiliary electrode.

Figure 13:
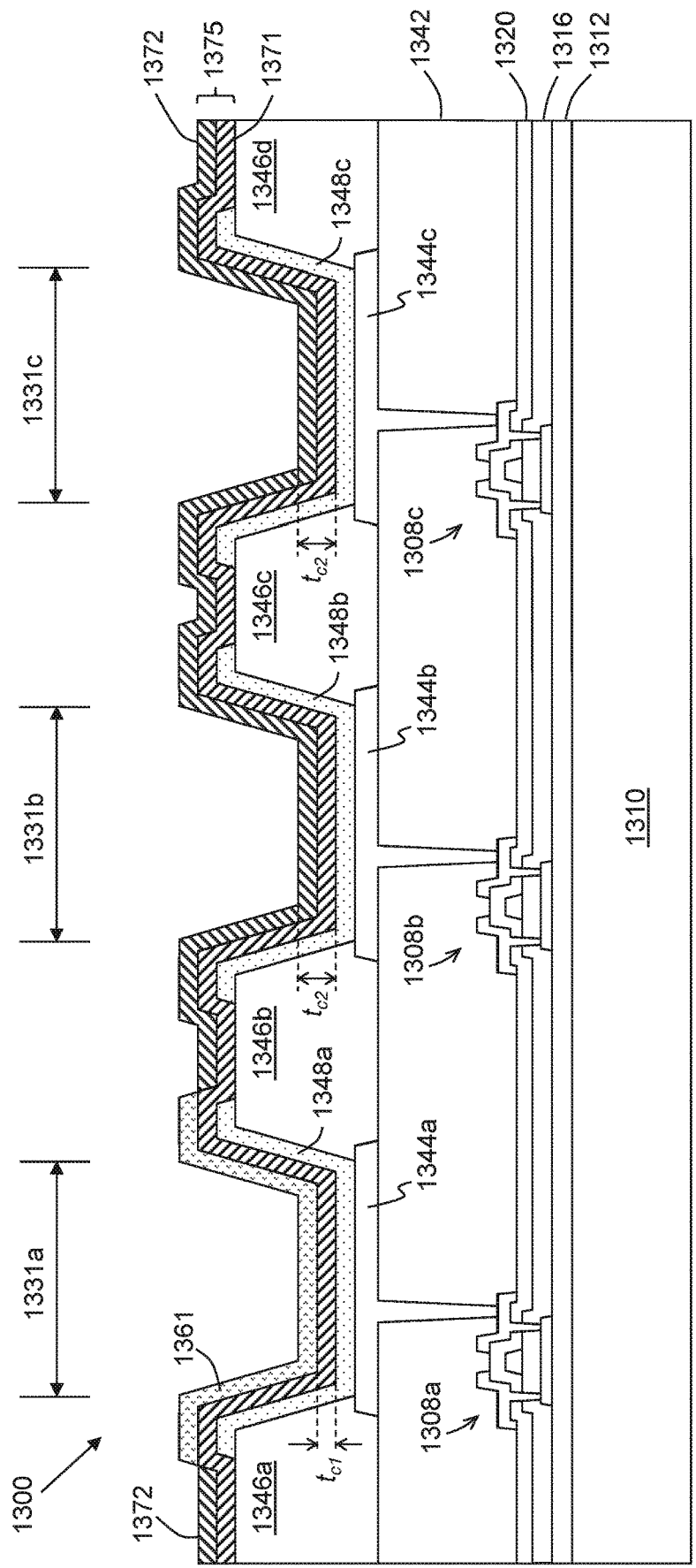
FIG. 13 is a schematic diagram illustrating the cross-section of an AMOLED device according to yet another embodiment.

FIG. 13 is a schematic cross-sectional diagram illustrating a portion of an AMOLED device 1300. For sake of simplicity, certain details of a backplane including those regarding the TFTs 1308a, 1308b, 1308c are omitted in describing the following embodiments.

In the embodiment of FIG. 13, the device 1300 includes a first emissive region 1331a, a second emissive region 1331b, and a third emissive region 1331c. For example, the emissive regions may correspond to the subpixels of the device 1300. In the device 1300, a first electrode 1344a, 1344b, 1344c is formed in each of the first emissive region 1331a, the second emissive region 1331b, and the third emissive region 1331c, respectively. As illustrated in FIG. 13, each of the first electrode 1344a, 1344b, 1344c extends through an opening of an insulating layer 1342 such that it is in electrical communication with the respective TFTs 1308a, 1308b, 1308c. PDLs 1346a-d are then formed to cover at least a portion of the first electrodes 1344a-c, including the outer edges of each electrode. For example, the PDLs 1346a-d may include an insulating organic or inorganic material. An organic layer 1348a, 1348b, 1348c is then deposited over the respective first electrode 1344a, 1344b, 1344c, particularly in regions between neighboring PDLs 1346a-d. A first conductive coating 1371 is deposited to substantially cover both the organic layers 1348a-d and the PDLs 1346a-d. For example, the first conductive coating 1371 may form a common cathode, or a portion thereof. A first nucleation inhibiting coating 1361 is selectively deposited over a portion of the first conductive coating 1371 disposed over the first emissive region 1331a. For example, the first nucleation inhibiting coating 1361 may be selectively deposited using a fine metal mask or a shadow mask. Accordingly, a second conductive coating 1372 is selectively deposited over an exposed surface of the first conductive coating 1371 using an open mask or a mask-free deposition process. For further specificity, by conducting thermal deposition of the second conductive coating 1372 (e.g., including magnesium) using an open mask or without a mask, the second conductive coating 1372 is selectively deposited over the exposed surface of the first conductive coating 1371, while leaving a surface of the first nucleation inhibiting coating 1361 substantially free of a material of the second conductive coating 1372. The second conductive coating 1372 may be deposited to coat the portions of the first conductive coating 1371 disposed over the second emissive region 1331b and the third emissive region 1331c.

In the device 1300 illustrated in FIG. 13, the first conductive coating 1371 and the second conductive coating 1372 may collectively form a common cathode 1375. Specifically, the common cathode 1375 may be formed by the combination of the first conductive coating 1371 and the second conductive coating 1372, wherein the second conductive coating 1372 is disposed directly over at least a portion of the first conductive coating 1371. The common cathode 1375 has a first thickness $t_{c1}$ in the first emissive region 1331a, and a second thickness $t_{c2}$ in the second emissive region 1335b and the third emissive region 1335c. The first thickness $t_{c1}$ may correspond to the thickness of the first conductive coating 1371, and the second thickness $t_{c2}$ may correspond to the combined thickness of the first conductive coating 1371 and the second conductive coating 1372. Accordingly, the second thickness $t_{c2}$ is greater than the first thickness $t_{c1}$.

Figure 14:
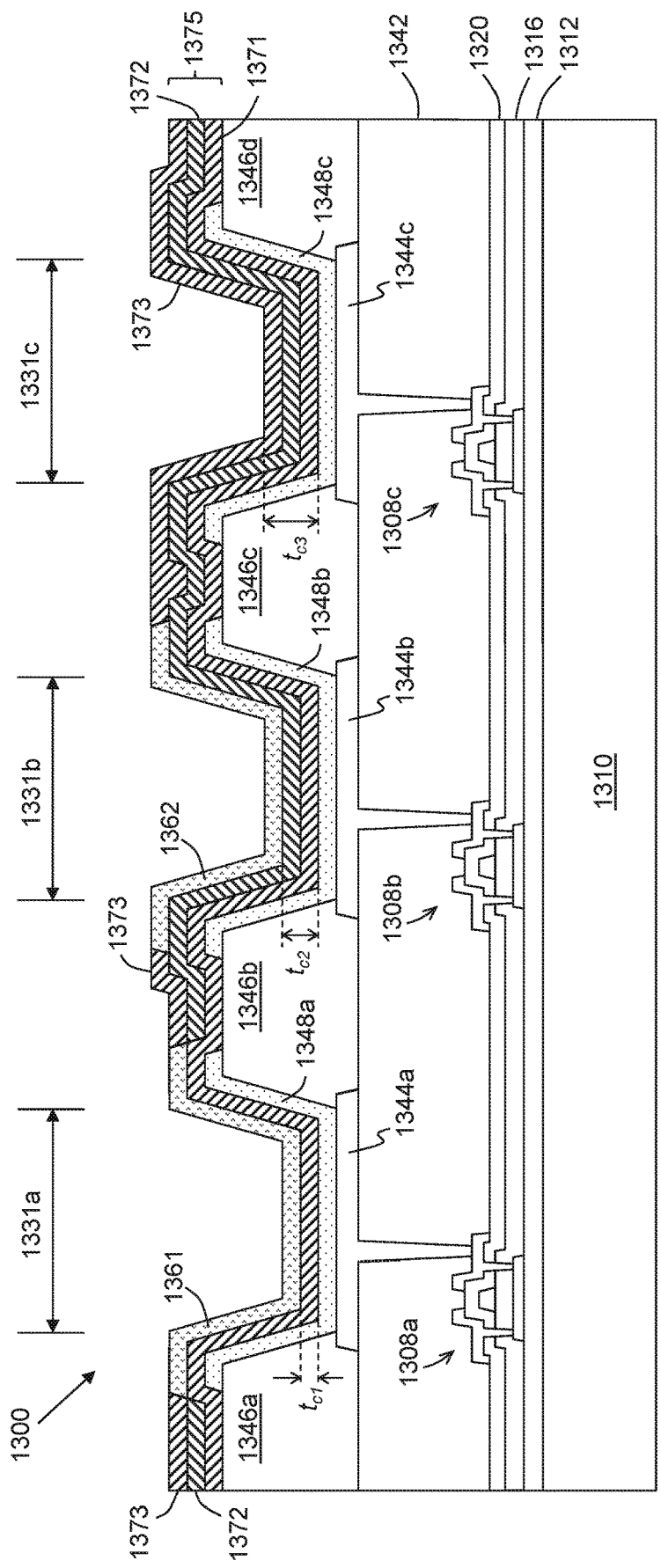
FIG. 14 is a schematic diagram illustrating the cross-section of an AMOLED device according to yet another embodiment.

FIG. 14 illustrates a further embodiment of device 1300 wherein the common cathode 1375 further comprises a third conductive coating 1373. Specifically in the embodiment of FIG. 14, the device 1300 comprises a second nucleation inhibiting coating 1362 disposed over a portion of the second conductive coating 1372 provided over the second emissive region 1331b. A third conductive coating 1373 is then deposited over the exposed or untreated surface(s) of the second conductive coating 1372, including the portion of the second conductive coating 1372 disposed over the third emissive region 1331c. In this way, a common cathode 1375 having a first thickness $t_{c1}$ in the first emissive region 1331a, a second thickness $t_{c2}$ in the second emissive region 1331b, and a third thickness $t_{c3}$ in the third emissive region 1331c may be provided. As would be appreciated, the first thickness $t_{c1}$ corresponds to the thickness of the first conductive coating 1371, the second thickness $t_{c2}$ corresponds to the combined thickness of the first conductive coating 1371 and the second conductive coating 1372, and the third thickness $t_{c3}$ corresponds to the combined thickness of the first conductive coating 1371, the second conductive coating 1372, and third conductive coating 1373. Accordingly, the first thickness $t_{c1}$ is generally less than the second thickness $t_{c2}$, and the third thickness $t_{c3}$ is generally greater than the second thickness $t_{c2}$.

Figure 15:
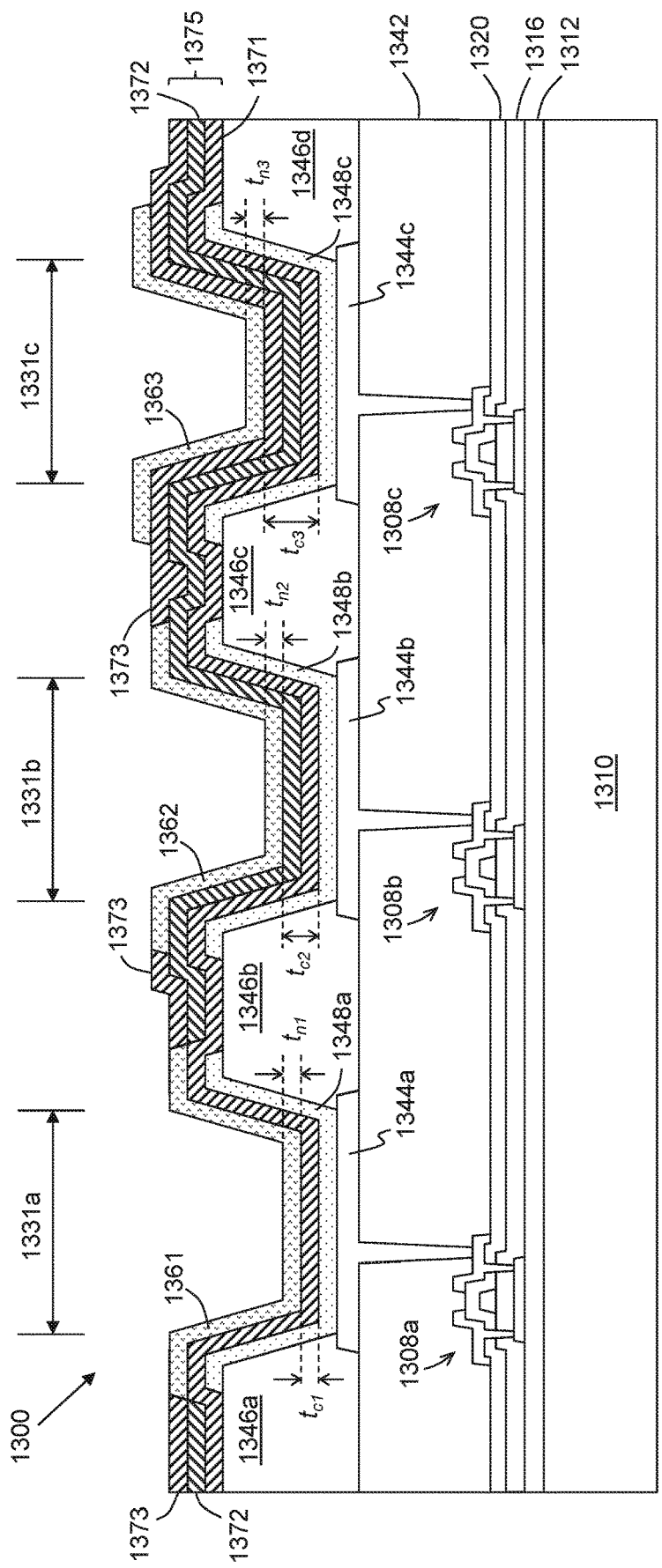
FIG. 15 is a schematic diagram illustrating the cross-section of an AMOLED device according to yet another embodiment.

In yet another embodiment illustrated in FIG. 15, the device 1300 further comprises a third nucleation inhibiting coating 1363 disposed over the third emissive region 1331c. Specifically, the third nucleation inhibiting coating 1363 is illustrated as being deposited over a portion of the third conductive coating 1373 coating a portion of the device corresponding to the third emissive region 1331c.

Figure 16:
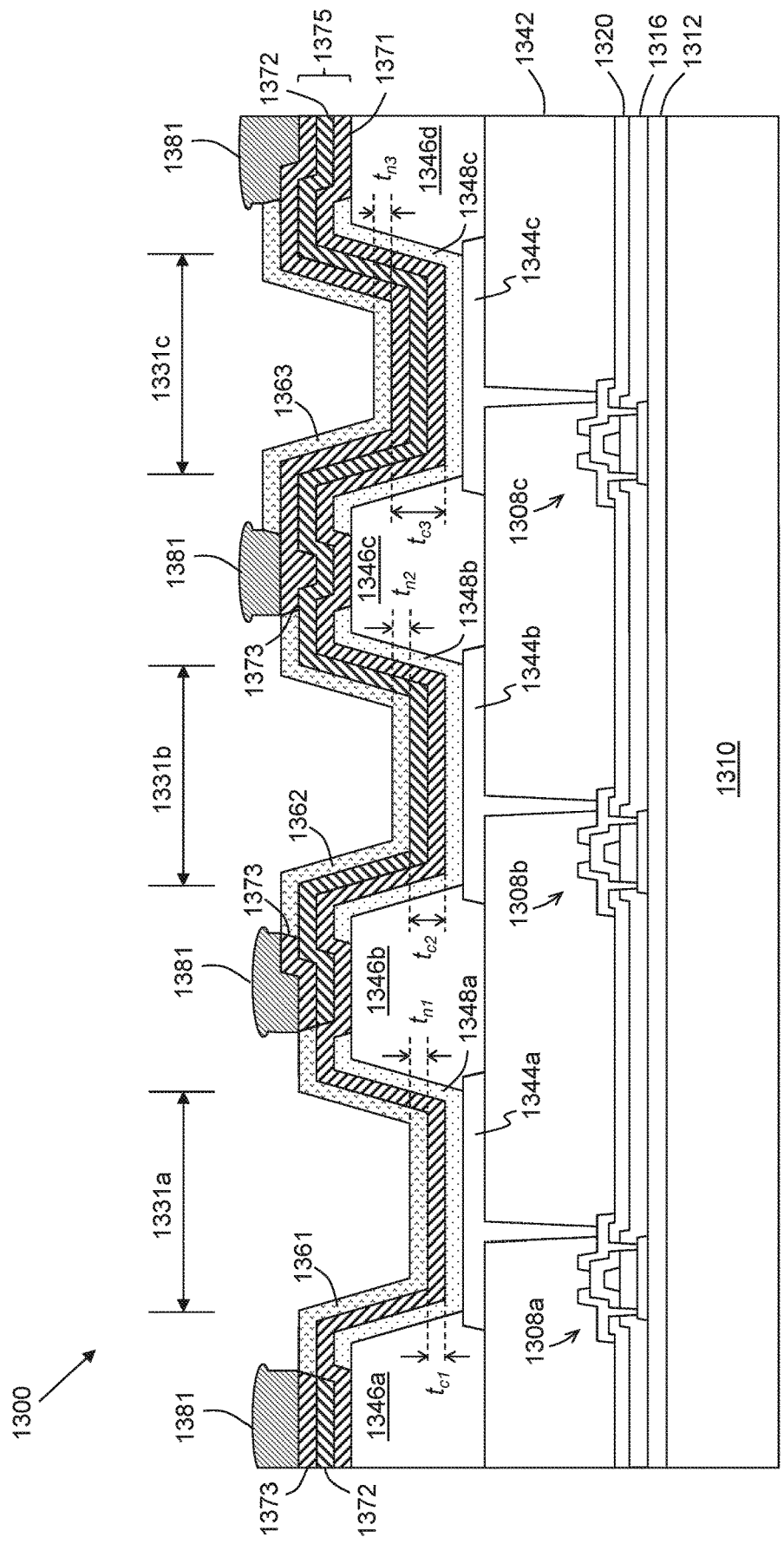
FIG. 16 is a schematic diagram illustrating the cross-section of an AMOLED device according to yet another embodiment.

In yet another embodiment illustrated in FIG. 16, the device 1300 further comprises an auxiliary electrode 1381 disposed in the non-emissive regions of the device 1300. For example, the auxiliary electrode 1381 may be formed using substantially the same processes as those used to deposit the second conductive coating 1372 and/or the third conductive coating 1373. The auxiliary electrode 1381 is illustrated as being deposited over the PDLs 1346a-1346d, which correspond to the non-emissive regions of the device 1300. The auxiliary electrode 1381 may be substantially inhibited from becoming formed over the emissive regions 1331a-c, and as such, the emissive regions 1331a-c may be substantially free of the material used to form the auxiliary electrode 1381.

The first conductive coating 1371, the second conductive coating 1372, and the third conductive coating 1373 may be light transmissive or substantially transparent in the visible wavelength portion of the electromagnetic spectrum. For further clarity, the first conductive coating 1371, the second conductive coating 1372, and the third conductive coating 1373 may each be light transmissive or substantially transparent in at least a portion of the visible wavelength range of the electromagnetic spectrum. Thus, when the second conductive coating and/or the third conductive coating are disposed on top of the first conductive coating to form the common cathode 1375, such electrode may also be light transmissive or substantially transparent in the visible wavelength portion of the electromagnetic spectrum. For example, the light transmittance of the first conductive coating 1371, the second conductive coating 1372, the third conductive coating 1373, and/or the common cathode 1375 may be greater than about 30%, greater than about 40%, greater than about 45%, greater than about 50%, greater than about 60%, greater than 70%, greater than about 75%, or greater than about 80% in a visible portion of the electromagnetic spectrum.

In some embodiments, the thickness of the first conductive coating 1371, the second conductive coating 1372, and the third conductive coating 1373 may be made relatively thin to maintain a relatively high light transmittance. For example, the thickness of the first conductive coating 1371 may be about 5 to 30 nm, about 8 to 25 nm, or about 10 to 20 nm. The thickness of the second conductive coating 1372 may, for example, be about 1 to 25 nm, about 1 to 20 nm, about 1 to 15 nm, about 1 to 10 nm, or about 3 to 6 nm. The thickness of the third conductive coating 1373 may, for example, be about 1 to 25 nm, about 1 to 20 nm, about 1 to 15 nm, about 1 to 10 nm, or about 3 to 6 nm. Accordingly, the thickness of a common cathode 1375 formed by the combination of the first conductive coating 1371 and the second conductive coating 1372 and/or the third conductive coating 1373 may, for example, be about 6 to 35 nm, about 10 to 30 nm, or about 10 to 25 nm, or about 12 to 18 nm.

The thickness of the auxiliary electrode 1381 may be greater than the thickness of the first conductive coating 1371, the second conductive coating 1372, the third conductive coating 1373, and/or the common cathode 1375. For example, the thickness of the auxiliary electrode 1381 may be greater than about 50 nm, greater than about 80 nm, greater than about 100 nm, greater than about 150 nm, greater than about 200 nm, greater than about 300 nm, greater than about 400 nm, greater than about 500 nm, greater than about 700 nm, greater than about 800 nm, greater than about 1 µm, greater than about 1.2 µm, greater than about 1.5 µm, greater than about 2 µm, greater than about 2.5 µm, or greater than about 3 µm. In some embodiments, the auxiliary electrode 1375 may be substantially non-transparent or opaque. However, since the auxiliary electrode 1375 is generally provided in the non-emissive region(s) of the device, the auxiliary electrode 1375 may not cause significant optical interference. For example, the light transmittance of the auxiliary electrode 1375 may be less than about 50%, less than about 70%, less than about 80%, less than about 85%, less than about 90%, or less than about 95% in the visible portion of the electromagnetic spectrum. In some embodiments, the auxiliary electrode 1375 may absorb light in at least a portion of the visible wavelength range of the electromagnetic spectrum.

The first conductive coating 1371 may comprise various materials used to form light transmissive conductive layers or coatings. For example, the first conductive coating 1371 may include transparent conducting oxides (TCOs), metallic or non-metallic thin films, and any combination thereof. The first conductive coating 1371 may further comprise two or more layers or coatings. For example, such layers or coatings may be distinct layers or coatings disposed on top of one another. The first conductive coating 1371 may comprise various materials including, for example, indium tin oxide (ITO), fluorine tin oxide (FTO), magnesium (Mg), aluminum (Al), ytterbium (Yb), silver (Ag), zinc (Zn), cadmium (Cd) and any combinations thereof, including alloys containing any of the foregoing materials. For example, the first conductive coating 1371 may comprise a Mg:Ag alloy, a Mg:Yb alloy, or a combination thereof. For a Mg:Ag alloy or a Mg:Yb alloy, the alloy composition may range from about 1:9 to about 9:1 by volume. In other examples, the first conductive coating 1371 may comprise a Yb/Ag bilayer coating. For example, such bilayer coating may be formed by depositing a ytterbium coating, followed by a silver coating. The thickness of the silver coating may be greater than the thickness of the ytterbium coating or vice versa. In yet another example, the first conductive coating 1371 may comprise a fullerene and magnesium. For example, such coating may be formed by depositing a fullerene coating followed by a magnesium coating. In another example, a fullerene may be dispersed within the magnesium coating to form a fullerene-containing magnesium alloy coating. Examples of such coatings are further described in US Patent Application Publication No. US 2015/0287846 (published Oct. 8, 2015) and in PCT Application No. PCT/IB2017/054970 (filed Aug. 15, 2017).

The second conductive coating 1372 and the third conductive coating 1373 may comprise high vapor pressure materials, such as ytterbium (Yb), zinc (Zn), cadmium (Cd) and magnesium (Mg). In some embodiments, the second conductive coating 1372 and the third conductive coating 1373 may comprise pure or substantially pure magnesium.

The auxiliary electrode 1381 may comprise substantially the same material(s) as the second conductive coating 1372 and/or the third conductive coating 1373. In some embodiments, the auxiliary electrode 1381 may include magnesium. For example, the auxiliary electrode 1381 may comprise pure or substantially pure magnesium. In other examples, the auxiliary electrode 1381 may comprise Yb, Cd, and/or Zn.

In some embodiments, the thickness of the nucleation inhibiting coating 1361, 1362, 1363 disposed in the emissive regions 1331a, 1331b, 1331c may be varied according to the color or emission spectrum of the light emitted by each emissive region. As illustrated in FIGS. 15 and 16, the first nucleation inhibiting coating 1361 may have a first nucleation inhibiting coating thickness $t_{n1}$, the second nucleation inhibiting coating 1362 may have a second nucleation inhibiting coating thickness $t_{n2}$, and the third nucleation inhibiting coating 1363 may have a third nucleation inhibiting coating thickness $t_{n3}$. The first nucleation inhibiting coating thickness $t_{n1}$, the second nucleation inhibiting coating thickness $t_{n2}$, and/or the third nucleation inhibiting coating thickness $t_{n3}$ may be substantially the same as one another. Alternatively, the first nucleation inhibiting coating thickness $t_{n1}$, the second nucleation inhibiting coating thickness $t_{n2}$, and/or the third nucleation inhibiting coating thickness $t_{n3}$ may be different from one another.

By modulating the thickness of the nucleation inhibiting coating disposed in each emissive region or subpixel independently of one another, the optical microcavity effects in each emissive region or subpixel can be further controlled. For example, the thickness of the nucleation inhibiting coating disposed over a blue subpixel may be less than the thickness of the nucleation inhibiting coating disposed over a green subpixel, and the thickness of the nucleation inhibiting coating disposed over a green subpixel may be less than the thickness of the nucleation inhibiting coating disposed over a red subpixel. As would be appreciated, the optical microcavity effect in each emissive region or subpixel may be controlled to an even greater extent by modulating both the nucleation inhibiting coating thickness and the conductive coating thickness for each emissive region or subpixel independent of other emissive regions or subpixels.

Optical microcavity effects arise due to the presence of optical interfaces created by numerous thin-film layers and coatings with different refractive indices, which are used to construct opto-electronic devices such as OLEDs. Some factors which affect the optical microcavity effect observed in a device include the total path length (e.g. the total thickness of the device through which light emitted from the device must travel before being out-coupled) and the refractive indices of various layers and coatings. It has now been found that, by modulating the thickness of the cathode in an emissive region (e.g. subpixel), the optical microcavity effect in the emissive region may be varied. Such effect may generally be attributed to the change in the total optical path length. The inventors further postulate that, particularly in the case of light-transmissive cathode formed by thin coating(s), the change in the cathode thickness may also change the refractive index of the cathode in addition to the total optical path length. Furthermore, the optical path length, and thus the optical microcavity effect, may also be modulated by changing the thickness of the nucleation inhibiting coating disposed in the emissive region.

The optical properties of the device which may be affected by modulating the optical microcavity effects include the emission spectrum, intensity (e.g. luminous intensity), and angular distribution of the output light, including the angular dependence of the brightness and color shift of the output light.

While various embodiments have been described with 2 or 3 emissive regions or subpixels, it will be appreciated that devices may comprise any number of emissive regions or subpixels. For example, a device may comprise a plurality of pixels, wherein each pixel comprises 2, 3, or more subpixels. Furthermore, the specific arrangement of the pixels or subpixels with respect to other pixels or subpixels may be varied depending on the device design.

In some applications, it may be desirable to deposit a conductive coating having specific material properties onto a substrate surface on which the conductive coating cannot be readily deposited. For example, pure or substantially pure magnesium typically cannot be readily deposited onto an organic surface due to low sticking coefficients of magnesium on various organic surfaces. Accordingly, in some embodiments, the surface onto which the first conductive coating, the second conductive coating, the third conductive coating, and/or the auxiliary electrode is to be deposited may be further treated by depositing a nucleation promoting coating thereon prior to depositing the conductive coating, such as one including magnesium.

Based on findings and experimental observations, it is postulated that fullerenes and other nucleation promoting materials, as will be explained further herein, act as nucleation sites for the deposition of a conductive coating including magnesium. For example, in cases where magnesium is deposited using an evaporation process on a fullerene treated surface, the fullerene molecules act as nucleation sites that promote formation of stable nuclei for magnesium deposition. Less than a monolayer of fullerene or other nucleation promoting material may be provided on the treated surface to act as nucleation sites for deposition of magnesium in some cases. As will be understood, treating the surface by depositing several monolayers of a nucleation promoting material may result in a higher number of nucleation sites, and thus a higher initial sticking probability.

It will also be appreciated that an amount of fullerene or other material (which may act as a nucleation promoting coating) deposited on a surface may be more, or less, than one monolayer. For example, the surface may be treated by depositing 0.1 monolayer, 1 monolayer, 10 monolayers, or more of a nucleation promoting material. The amount of a nucleation inhibiting material deposited on a surface to form a nucleation inhibiting coating will generally be about 1 monolayer or greater. As used herein, depositing 1 monolayer of a material refers to an amount of the material to cover a desired area of a surface with a single layer of constituent molecules or atoms of the material. Similarly, as used herein, depositing 0.1 monolayer of a material refers to an amount of the material to cover 10% of a desired area of a surface with a single layer of constituent molecules or atoms of the material. Due to, for example, possible stacking or clustering of molecules or atoms, an actual thickness of a deposited material may be non-uniform. For example, depositing 1 monolayer of a material may result in some regions of a surface being uncovered by the material, while other regions of the surface may have multiple atomic or molecular layers deposited thereon.

As used herein, the term "fullerene" refers to a material including carbon molecules. Examples of fullerene molecules include carbon cage molecules including a three-dimensional skeleton that includes multiple carbon atoms, which form a closed shell, and which can be spherical or semi-spherical in shape. A fullerene molecule can be designated as $C_n$, where n is an integer corresponding to a number of carbon atoms included in a carbon skeleton of the fullerene molecule. Examples of fullerene molecules include $C_n$, where n is in the range of 50 to 250, such as $C_{60}$, $C_{70}$, $C_{72}$, $C_{74}$, $C_{76}$, $C_{78}$, $C_{80}$, $C_{82}$, and $C_{84}$. Additional examples of fullerene molecules include carbon molecules in a tube or cylindrical shape, such as single-walled carbon nanotubes and multi-walled carbon nanotubes.

Various processes for selectively depositing a material on a surface may be used to deposit the nucleation promoting coating including, but not limited to, evaporation (including thermal evaporation and electron beam evaporation), photolithography, printing (including ink or vapor jet printing, reel-to-reel printing, and micro-contact transfer printing), OVPD, LITI patterning, spin coating, dip coating, spray coating, physical vapor deposition (PVD) (including sputtering), chemical vapor deposition (CVD), and combinations thereof.

For example, with reference to the embodiment of FIGS. 1 and 2A-2C, an additional step of depositing a nucleation promoting coating may be conducted prior to stage 12. Specifically, the surface of the substrate 102 may be coated with a nucleation promoting coating prior to depositing the first conductive coating 131. In other embodiments, an additional step of selectively depositing a nucleation promoting coating over the first conductive coating 131 may be included prior to depositing the second conductive coating in stage 16. For example, such additional step may be included before selective deposition of the first nucleation inhibiting coating in stage 14 and after deposition of the first conductive coating in stage 12, or after selective deposition of the first nucleation inhibiting coating in stage 14 and before the deposition of the second conductive coating in stage 16. For example, such nucleation promoting coating may be disposed over portions of the first conductive coating 131 which are untreated or exposed from the first nucleation inhibiting coating 141. For example, the nucleation promoting coating may be disposed at the interface between the first conductive coating 131 and the second conductive coating 151 in the portions of the conductive coating provided over the non-emissive regions 121a, 121b, 121c, and the second emissive region 114.

In another example, with reference to various embodiments of the device 1300 illustrated in FIGS. 13 to 16, a first nucleation promoting coating may be disposed at the interface between the organic layer 1348a, 1348b, 1348c and the first conductive coating 1371. Alternatively, or in addition thereto, further nucleation promoting coating(s) may be disposed at the interface between the first conductive coating 1371 and the second conductive coating 1372 and/or at the interface between the second conductive coating 1372 and the third conductive coating 1373. If desired, such nucleation promoting coating(s) may be deposited using an open-mask or mask-free deposition process. Accordingly, in some examples, the nucleation promoting coating(s) may be disposed at the interfaces between the first nucleation inhibiting coating 1361, the second nucleation inhibiting coating 1362, and the third nucleation inhibiting coating 1363 and the respective conductive coating or surfaces underlying each of the nucleation inhibiting coatings.

The base substrate 1010, 1310 may be, for example, a flexible or rigid substrate. The base substrate may include, for example, silicon, glass, metal, polymer (e.g., polyimide), sapphire, or other materials suitable for use as the base substrate.

The organic layer includes an electroluminescent layer. The electroluminescent layer may be formed, for example, by doping a host material with an emitter material. The emitter material may be a fluorescent emitter, a phosphorescent emitter, or a TADF emitter, for example. A plurality of emitter materials may also be doped into the host material to form the electroluminescent layer.

While some of the foregoing embodiments have been described in relation to an OLED, it will be understood that such processes and conductive coatings formed as a result of the processes may be used for forming opto-electronic devices including quantum dots as an active layer material. For example, such a device may include an active layer disposed between a pair of electrodes with the active layer including quantum dots. The device may be, for example, an electroluminescent quantum dot display device in which light is emitted from the quantum dot active layer as a result of current provided by the electrodes. The conductive coatings may form the electrode for such devices.

In accordance with the above-described embodiments, a conductive coating may be selectively deposited on target regions (e.g., emissive regions or subpixel regions) using an open mask or a mask-free deposition process, through the use of a nucleation inhibiting coating or a combination of nucleation inhibiting and nucleation promoting coatings. By contrast, the lack of sufficient selectivity in an open mask or a mask-free deposition process would result in deposition of a conductive material beyond target regions and over non-emissive regions or adjacent emissive regions or subpixel regions, which is undesired since the deposition of such material over adjacent emissive regions or subpixel regions may contribute to decrease in optical performance of the device in these regions. Moreover, by providing high selectivity in depositing conductive coatings on target regions, the conductive coating can serve as an electrode with varying thicknesses between different subpixel regions to achieve desired optical and electrical performances in an OLED device. For example, the high selectivity provided by the above-described embodiments allows deposition of a common cathode having varying thicknesses to tune or modulate the optical microcavity effects for each subpixel and the emission color spectrum associated therewith.

The formation of thin films during vapor deposition on a surface of a substrate involves processes of nucleation and growth. During initial stages of film formation, a sufficient number of vapor monomers (e.g., atoms or molecules) typically condense from a vapor phase to form initial nuclei on the surface. As vapor monomers continue to impinge upon the surface, a size and density of these initial nuclei increase to form small clusters or islands. After reaching a saturation island density, adjacent islands typically will start to coalesce, increasing an average island size, while decreasing an island density. Coalescence of adjacent islands continues until a substantially closed film is formed.

There can be three basic growth modes for the formation of thin films: 1) island (Volmer-Weber), 2) layer-by-layer (Frank-van der Merwe), and 3) Stranski-Krastanov. Island growth typically occurs when stable clusters of monomers nucleate on a surface and grow to form discrete islands. This growth mode occurs when the interactions between the monomers is stronger than that between the monomers and the surface.

The nucleation rate describes how many nuclei of a critical size form on a surface per unit time. During initial stages of film formation, it is unlikely that nuclei will grow from direct impingement of monomers on the surface, since the density of nuclei is low, and thus the nuclei cover a relatively small fraction of the surface (e.g., there are large gaps/spaces between neighboring nuclei). Therefore, the rate at which critical nuclei grow typically depends on the rate at which adsorbed monomers (e.g., adatoms) on the surface migrate and attach to nearby nuclei.

After adsorption of an adatom on a surface, the adatom may either desorb from the surface, or may migrate some distance on the surface before either desorbing, interacting with other adatoms to form a small cluster, or attaching to a growing nuclei. An average amount of time that an adatom remains on the surface after initial adsorption is given by:

$$\tau_s = \frac{1}{v}\exp\left(\frac{E_{des}}{kT}\right)$$

In the above equation, v is a vibrational frequency of the adatom on the surface, k is the Boltzmann constant, T is temperature, and $E_{des}$ is an energy involved to desorb the adatom from the surface. From this equation it is noted that the lower the value of $E_{des}$ the easier it is for the adatom to desorb from the surface, and hence the shorter the time the adatom will remain on the surface. A mean distance an adatom can diffuse is given by:

$$X = a_0 \exp\left(\frac{E_{des} - E_S}{2kT}\right)$$

where $a_0$ is a lattice constant and $E_S$ is an activation energy for surface diffusion. For low values of $E_{des}$ and/or high values of $E_S$ the adatom will diffuse a shorter distance before desorbing, and hence is less likely to attach to a growing nuclei or interact with another adatom or cluster of adatoms.

During initial stages of film formation, adsorbed adatoms may interact to form clusters, with a critical concentration of clusters per unit area being given by:

$$\frac{N_i}{n_0} = \left|\frac{N_1}{n_0}\right|^i \exp\left(\frac{E_i}{kT}\right)$$

where $E_i$ is an energy involved to dissociate a critical cluster containing i adatoms into separate adatoms, $n_0$ is a total density of adsorption sites, and $N_1$ is a monomer density given by:

$$N_1 = \dot{R}\tau_s$$

where $\dot{R}$ is a vapor impingement rate. Typically i will depend on a crystal structure of a material being deposited and will determine the critical cluster size to form a stable nucleus.

A critical monomer supply rate for growing clusters is given by the rate of vapor impingement and an average area over which an adatom can diffuse before desorbing:

$$\dot{R}X^2 = a_0^2 \exp\left(\frac{E_{des} - E_S}{kT}\right)$$

The critical nucleation rate is thus given by the combination of the above equations:

$$\dot{N}_i = \dot{R}a_0^2 n_0 \left(\frac{\dot{R}}{vn_0}\right)^i \exp\left(\frac{(i+1)E_{des} - E_S + E_i}{kT}\right)$$

From the above equation it is noted that the critical nucleation rate will be suppressed for surfaces that have a low desorption energy for adsorbed adatoms, a high activation energy for diffusion of an adatom, are at high temperatures, or are subjected to low vapor impingement rates.

Sites of substrate heterogeneities, such as defects, ledges or step edges, may increase $E_{des}$, leading to a higher density of nuclei observed at such sites. Also, impurities or contamination on a surface may also increase $E_{des}$, leading to a higher density of nuclei. For vapor deposition processes conducted under high vacuum conditions, the type and density of contaminates on a surface is affected by a vacuum pressure and a composition of residual gases that make up that pressure.

Under high vacuum conditions, a flux of molecules that impinge on a surface (per cm²-sec) is given by:

$$\Phi = 3.513 \times 10^{22} \frac{P}{MT}$$

where P is pressure, and M is molecular weight. Therefore, a higher partial pressure of a reactive gas, such as $H_2O$, can lead to a higher density of contamination on a surface during vapor deposition, leading to an increase in $E_{des}$ and hence a higher density of nuclei.

A useful parameter for characterizing nucleation and growth of thin films is the sticking probability given by:

$$S = \frac{N_{ads}}{N_{total}}$$

where $N_{ads}$ is a number of adsorbed monomers that remain on a surface (e.g., are incorporated into a film) and $N_{total}$ is a total number of impinging monomers on the surface. A sticking probability equal to 1 indicates that all monomers that impinge the surface are adsorbed and subsequently incorporated into a growing film. A sticking probability equal to 0 indicates that all monomers that impinge the surface are desorbed and subsequently no film is formed on the surface. A sticking probability of metals on various surfaces can be evaluated using various techniques of measuring the sticking probability, such as a dual quartz crystal microbalance (QCM) technique as described by Walker et al., *J. Phys. Chem. C* 2007, 111, 765 (2006) and in the Examples section below.

As the density of islands increases (e.g., increasing average film thickness), a sticking probability may change. For example, a low initial sticking probability may increase with increasing average film thickness. This can be understood based on a difference in sticking probability between an area of a surface with no islands (bare substrate) and an area with a high density of islands. For example, a monomer that impinges a surface of an island may have a sticking probability close to 1.

An initial sticking probability $S_0$ can therefore be specified as a sticking probability of a surface prior to the formation of any significant number of critical nuclei. One measure of an initial sticking probability can involve a sticking probability of a surface for a material during an initial stage of deposition of the material, where an average thickness of the deposited material across the surface is at or below threshold value. In the description of some embodiments, a threshold value for an initial sticking probability can be specified as 1 nm. An average sticking probability is then given by:

$$\overline{S} = (1 - A_{nuc}) + S_{nuc}(A_{nuc})$$

where $S_{nuc}$ is a sticking probability of an area covered by islands, and $A_{nuc}$ is a percentage of an area of a substrate surface covered by islands.

Suitable materials for use to form a nucleation inhibiting coating include those exhibiting or characterized as having an initial sticking probability for a material of a conductive coating of no greater than or less than about 0.3 (or 30%), or no greater than or less than about 0.2, or no greater than or less than about 0.1, or no greater than or less than about 0.05, and, more particularly, no greater than or less than about 0.03, no greater than or less than about 0.02, no greater than or less than about 0.01, no greater than or less than about 0.08, no greater than or less than about 0.005, no greater than or less than about 0.003, no greater than or less than about 0.001, no greater than or less than about 0.0008, no greater than or less than about 0.0005, or no greater than or less than about 0.0001. Particularly in embodiment where the total flux of the evaporated conductive coating material (including materials used to form the first conductive coating, the second conductive coating, the third conductive coating, and/or the auxiliary electrode) to which the nucleation inhibiting coating is subjected to is equivalent to the amount for forming relatively thin conductive coating having, for example, total average thickness of less than about 50 nm, or less than about 30 nm, the initial sticking probability of the nucleation inhibiting coating may be relatively high (e.g. initial sticking probability of less than about 0.3). However, in embodiments where the total flux of the evaporated conductive coating material to which the nucleation inhibiting coating is subjected to is equivalent to the amount for forming relatively thick conductive coating having, for example, total average thickness of greater than about 50 nm, greater than about 80 nm, greater than about 100 nm, or greater than about 300 nm, the initial sticking probability of the nucleation inhibiting coating may be relatively low (e.g. initial sticking probability of less than about 0.1, less than about 0.05, or less than about 0.03). For example, suitable materials for use to form a first nucleation inhibiting coating, the second nucleation inhibiting coating, and/or the third nucleation inhibiting coating include TAZ, BAlq, and any mixture thereof.

Suitable materials for use to form a nucleation promoting coating include those exhibiting or characterized as having an initial sticking probability for a material of a conductive coating of at least about 0.6 (or 60%), at least about 0.7, at least about 0.75, at least about 0.8, at least about 0.9, at least about 0.93, at least about 0.95, at least about 0.98, or at least about 0.99.

Suitable nucleation inhibiting materials include organic materials, such as small molecule organic materials and organic polymers. Examples of suitable organic materials include polycyclic aromatic compounds including organic molecules which may optionally include one or more heteroatoms, such as nitrogen (N), sulfur (S), oxygen (O), phosphorus (P), and aluminum (Al). In some embodiments, a polycyclic aromatic compound includes organic molecules each including a core moiety and at least one terminal moiety bonded to the core moiety. A number of terminal moieties may be 1 or more, 2 or more, 3 or more, or 4 or more. In the case of 2 or more terminal moieties, the terminal moieties may be the same or different, or a subset of the terminal moieties may be the same but different from at least one remaining terminal moiety. In some embodiments, at least one terminal moiety is, or includes, a biphenylyl moiety represented by one of the chemical structures (I-a), (I-b), and (Ic) as follows:

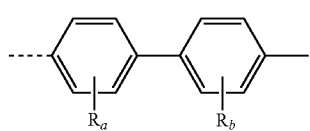

(I-a)

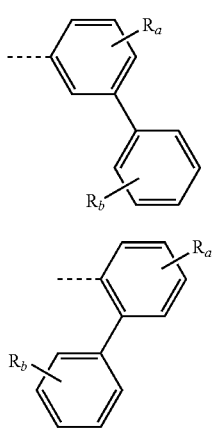

(I-b)

(I-c)

wherein the dotted line indicates a bond formed between the biphenylyl moiety and the core moiety. In general, the biphenylyl moiety represented by (I-a), (I-b) and (I-c) may be unsubstituted or may be substituted by having one or more of its hydrogen atoms replaced by one or more substituent groups. In the moiety represented by (I-a), (I-b), and (I-c), $R_a$ and $R_b$ independently represent the optional presence of one or more substituent groups, wherein $R_a$ may represent mono, di, tri, or tetra substitution, and $R_b$ may represent mono, di, tri, tetra, or penta substitution. For example, one or more substituent groups, $R_a$ and $R_b$, may independently be selected from: deutero, fluoro, alkyl including $C_1$-$C_4$ alkyl, cycloalkyl, arylalkyl, silyl, aryl, heteroaryl, fluoroalkyl, and any combinations thereof. Particularly, one or more substituent groups, $R_a$ and $R_b$, may be independently selected from: methyl, ethyl, t-butyl, trifluoromethyl, phenyl, methylphenyl, dimethylphenyl, trimethylphenyl, t-butylphenyl, biphenylyl, methylbiphenylyl, dimethylbiphenylyl, trimethylbiphenylyl, t-butyl biphenylyl, fluorophenyl, difluorophenyl, trifluorophenyl, polyfluorophenyl, fluorobiphenylyl, difluorobiphenylyl, trifluorobiphenylyl, and polyfluorobiphenylyl. Without wishing to be bound by a particular theory, the presence of an exposed biphenylyl moiety on a surface may serve to adjust or tune a surface energy (e.g., a desorption energy) to lower an affinity of the surface towards deposition of a conductive material such as magnesium. Other moieties and materials that yield a similar tuning of a surface energy to inhibit deposition of magnesium may be used to form a nucleation inhibiting coating.

In another embodiment, at least one terminal moiety is, or includes, a phenyl moiety represented by the structure (I-d) as follows:

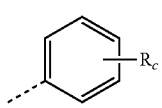

(I-d)

wherein the dotted line indicates a bond formed between the phenyl moiety and the core moiety. In general, the phenyl moiety represented by (I-d) may be unsubstituted or may be substituted by having one or more of its hydrogen atoms replaced by one or more substituent groups. In the moiety represented by (I-d), $R_c$ represents the optional presence of one or more substituent groups, wherein $R_c$ may represent mono, di, tri, tetra, or penta substitution. One or more substituent groups, $R_c$, may be independently selected from: deutero, fluoro, alkyl including $C_1$-$C_4$ alkyl, cycloalkyl, silyl, fluoroalkyl, and any combinations thereof. Particularly, one or more substituent groups, $R_c$, may be independently selected from: methyl, ethyl, t-butyl, fluoromethyl, bifluoromethyl, trifluoromethyl, fluoroethyl, and polyfluoroethyl.

In yet another embodiment, at least one terminal moiety is, or includes, a polycyclic aromatic moiety including fused ring structures, such as fluorene moieties or phenylene moieties (including those containing multiple (e.g., 3, 4, or more) fused benzene rings). Examples of such moieties include spirobifluorene moiety, triphenylene moiety, diphenylfluorene moiety, dimethylfluorene moiety, difluorofluorene moiety, and any combinations thereof.

In some embodiments, a polycyclic aromatic compound includes organic molecules represented by at least one of chemical structures (II), (III), and (IV) as follows:

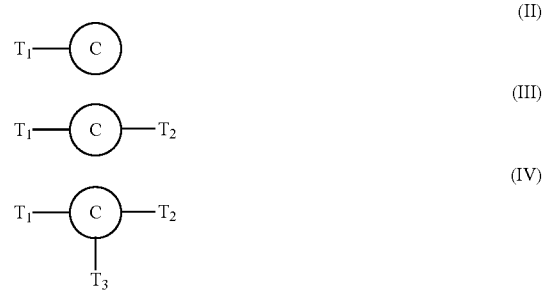

(II)

(III)

(IV)

In (II), (III), and (IV), C represents a core moiety, and $T_1$, $T_2$, and $T_3$ represent terminal moieties bonded to the core moiety. Although 1, 2, and 3 terminal moieties are depicted in (II), (III), and (IV), it should be understood that more than 3 terminal moieties also may be included.

In some embodiments, C is, or includes, a heterocyclic moiety, such as a heterocyclic moiety including one or more nitrogen atoms, for which an example is a triazole moiety. In some embodiments, C is, or includes, a metal atom (including transition and post-transition atoms), such as an aluminum atom, a copper atom, an iridium atom, and/or a platinum atom. In some embodiments, C is, or includes, a nitrogen atom, an oxygen atom, and/or a phosphorus atom. In some embodiments, C is, or includes, a cyclic hydrocarbon moiety, which may be aromatic. In some embodiments, C is, or includes, a substituted or unsubstituted alkyl, which may be branched or unbranched, a cycloalkynyl (including those containing between 1 and 7 carbon atoms), an alkenyl, an alkynyl, an aryl (including phenyl, naphthyl, thienyl, and indolyl), an arylalkyl, a heterocyclic moiety (including cyclic amines such as morpholino, piperdino and pyrolidino), a cyclic ether moiety (such as tetrahydrofuran and tetrahydropyran moieties), a heteroaryl (including pyrrole, furan, thiophene, imidazole, oxazole, thiazole, triazole, pyrazole, pyridine, pyrazine, pyrimidine, polycyclic heteroaromatic moieties, and dibenzylthiophenyl), fluorene moieties, silyl, and any combinations thereof.

In (II), (III), and (IV), Ti is, or includes, a moiety represented by (I-a), (I-b), (I-c), or (I-d), or a polycyclic aromatic moiety including fused ring structures as described above. The moiety, $T_1$, may be directly bonded to the core moiety, or may be bonded to the core moiety via a linker moiety. Examples of a linker moiety include —O— (where O denotes an oxygen atom), —S— (where S denotes a sulfur atom), and cyclic or acyclic hydrocarbon moieties including 1, 2, 3, 4, or more carbon atoms, and which may be unsubstituted or substituted, and which may optionally include one or more heteroatoms. The bond between the core moiety and one or more terminal moieties may be a covalent bond or a bond formed between a metallic element and an organic element, particularly in the case of organometallic compounds.

In (III), $T_1$ and $T_2$ may be the same or different, as long as at least $T_1$ is, or includes, a moiety represented by (I-a), (I-b), (I-c), or (I-d), or a polycyclic aromatic moiety including fused ring structures as described above. For example, each of $T_1$ and $T_2$ may be, or may include, a moiety represented by (I-a), (I-b), (I-c), or (I-d), or a polycyclic aromatic moiety including fused ring structures as described above. As another example, $T_1$ is, or includes, a moiety represented by (I-a), (I-b), (I-c), or (I-d), or a polycyclic aromatic moiety including fused ring structures as described above, while $T_2$ may lack such a moiety. In some embodiments, $T_2$ is, or includes, a cyclic hydrocarbon moiety, which may be aromatic, which may include a single ring structure or may be polycyclic, which may be substituted or unsubstituted, and which may be directly bonded to the core moiety, or may be bonded to the core moiety via a linker moiety. In some embodiments, $T_2$ is, or includes, a heterocyclic moiety, such as a heterocyclic moiety including one or more nitrogen atoms, which may include a single ring structure or may be polycyclic, which may be substituted or unsubstituted, and which may be directly bonded to the core moiety, or may be bonded to the core moiety via a linker moiety. In some embodiments, $T_2$ is, or includes, an acyclic hydrocarbon moiety, which may be unsubstituted or substituted, which may optionally include one or more heteroatoms, and which may be directly bonded to the core moiety, or may be bonded to the core moiety via a linker moiety. In some embodiments where $T_1$ and $T_2$ are different, $T_2$ may be selected from moieties having sizes comparable to $T_1$. Specifically, $T_2$ may be selected from the above-listed moieties having molecular weights no greater than about 2 times, no greater than about 1.9 times, no greater than about 1.7 times, no greater than about 1.5 times, no greater than about 1.2 times, or no greater than about 1.1 times a molecular weight of $T_1$. Without wishing to be bound by a particular theory, it is postulated that, when the terminal moiety $T_2$ is included which is different from or lacks a moiety represented by (I-a), (I-b), (I-c), or (I-d), or a polycyclic aromatic moiety including fused ring structures as described above, a comparable size of $T_2$ with respect to $T_1$ may promote exposure of $T_1$ on a surface, in contrast to bulky terminal groups that may hinder exposure of $T_1$ due to molecular stacking, steric hindrance, or a combination of such effects.

In (IV), $T_1$, $T_2$, and $T_3$ may be the same or different, as long as at least $T_1$ is, or includes, a moiety represented by (I-a), (I-b), (I-c), or (I-d), or a polycyclic aromatic moiety including fused ring structures as described above. For example, each of $T_1$, $T_2$, and $T_3$ may be, or may include, a moiety represented by (I-a), (I-b), (I-c), or (I-d), or a polycyclic aromatic moiety including fused ring structures as described above. As another example, each of $T_1$ and $T_2$ may be, or may include, a moiety represented by (I-a), (I-b), (I-c), or (I-d), or a polycyclic aromatic moiety including fused ring structures as described above, while $T_3$ may lack such a moiety. As another example, each of $T_1$ and $T_3$ may be, or may include, a moiety represented by (I-a), (I-b), (I-c), or (I-d), or a polycyclic aromatic moiety including fused ring structures as described above, while $T_2$ may lack such a moiety. As a further example, $T_1$ is, or includes, a moiety represented by (I-a), (I-b), (I-c), or (I-d), or a polycyclic aromatic moiety including fused ring structures as described above, while both $T_2$ and $T_3$ may lack such a moiety. In some embodiments, at least one $T_2$ and $T_3$ is, or includes, a cyclic hydrocarbon moiety, which may be aromatic, which may include a single ring structure or may be polycyclic, which may be substituted or unsubstituted, and which may be directly bonded to the core moiety, or may be bonded to the core moiety via a linker moiety. In some embodiments, at least one $T_2$ and $T_3$ is, or includes, a heterocyclic moiety, such as a heterocyclic moiety including one or more nitrogen atoms, which may include a single ring structure or may be polycyclic, which may be substituted or unsubstituted, and which may be directly bonded to the core moiety, or may be bonded to the core moiety via a linker moiety. In some embodiments, at least one $T_2$ and $T_3$ is, or includes, an acyclic hydrocarbon moiety, which may be unsubstituted or substituted, which may optionally include one or more heteroatoms, and which may be directly bonded to the core moiety, or may be bonded to the core moiety via a linker moiety. In some embodiments where $T_1$, $T_2$, and $T_3$ are different, $T_2$ and $T_3$ may be selected from moieties having sizes comparable to $T_1$. Specifically, $T_2$ and $T_3$ may be selected from the above-listed moieties having molecular weights no greater than about 2 times, no greater than about 1.9 times, no greater than about 1.7 times, no greater than about 1.5 times, no greater than about 1.2 times, or no greater than about 1.1 times a molecular weight of $T_1$. Without wishing to be bound by a particular theory, it is postulated that, when the terminal moieties $T_2$ and $T_3$ are included which are different from or lacks a moiety represented by (I-a), (I-b), (I-c), or (I-d), or a polycyclic aromatic moiety including fused ring structures as described above, a comparable size of $T_2$ and $T_3$ with respect to $T_1$ may promote exposure of $T_1$ on a surface, in contrast to bulky terminal groups that may hinder exposure of $T_1$ due to molecular stacking, steric hindrance, or a combination of such effects.

Suitable nucleation inhibiting materials include polymeric materials. Examples of such polymeric materials include: fluoropolymers, including but not limited to perfluorinated polymers and polytetrafluoroethylene (PTFE); polyvinylbiphenyl; polyvinylcarbazole (PVK); and polymers formed by polymerizing a plurality of the polycyclic aromatic compounds as described above. In another example, polymeric materials include polymers formed by polymerizing a plurality of monomers, wherein at least one of the monomers includes a terminal moiety that is, or includes, a moiety represented by (I-a), (I-b), (I-c), or (I-d), or a polycyclic aromatic moiety including fused ring structures as described above.

For further clarity, any of the foregoing nucleation inhibiting materials may be used to form the first nucleation inhibiting coating, the second nucleation inhibiting coating, the third nucleation inhibiting coating, and/or any other nucleation inhibiting coating.

In some embodiments, various nucleation inhibiting coatings deposited during the fabrication process may be removed by using, for example, a solvent or plasma etching process after the conductive coatings have been deposited. Accordingly, in some embodiments, the device may comprise a first emissive region and a second emissive region, and a conductive coating disposed over the first and second emissive regions, wherein the conductive coating has a first thickness in the first emissive region and a second thickness in the second emissive region. The first thickness may be less than or greater than the second thickness. The first emissive region and the second emissive region may be configured to emit light having different wavelength or emission spectrum from one another. For example, the first emissive region and the second emissive region may correspond to subpixel regions of an electroluminescent display device.

At least some of the above embodiments have been described in reference to various layers or coatings, including the first, second, and third nucleation inhibiting coatings, one or more nucleation promoting coatings, the first, second, and third conductive coatings, and the auxiliary electrode being formed using an evaporation process. As will be understood, an evaporation process is a type of PVD process where one or more source materials are evaporated or sublimed under a low pressure (e.g., vacuum) environment and deposited on a target surface through de-sublimation of the one or more evaporated source materials. A variety of different evaporation sources may be used for heating a source material, and, as such, it will be appreciated that the source material may be heated in various ways. For example, the source material may be heated by an electric filament, electron beam, inductive heating, or by resistive heating. In addition, such layers or coatings may be deposited and/or patterned using other suitable processes, including photolithography, printing, OVPD, LITI patterning, and combinations thereof. These processes may also be used in combination with a shadow mask to achieve various patterns.

For example, magnesium may be deposited at source temperatures up to about 600° C. to achieve a faster rate of deposition, such as about 10 to 30 nm per second or more. Referring to Table 1 below, various deposition rates measured using a Knudsen cell source to deposit substantially pure magnesium on a fullerene-treated organic surface of about 1 nm are provided. It will be appreciated that other factors may also affect a deposition rate including, but not limited to, a distance between a source and a substrate, characteristics of the substrate, presence of a nucleation promoting coating on the substrate, the type of source used and a shaping of a flux of material evaporated from the source.

TABLE 1

Magnesium Deposition Rate by Temperature

| Sample # | Temperature (° C.) | Rate (angstroms/s) |
|---|---|---|
| 1 | 510 | 10 |
| 2 | 525 | 40 |
| 3 | 575 | 140 |
| 4 | 600 | 160 |

It will be appreciated by those skilled in the art that particular processing conditions used may vary depending on an equipment being used to conduct a deposition. It will also be appreciated that higher deposition rates are generally attained at higher source temperatures; however, other deposition conditions can be selected, such as, for example, by placing a substrate closer to a deposition source.

A deposition source material used to deposit a conductive coating may be a mixture or a compound, and, in some embodiments, at least one component of the mixture or compound is not deposited on a substrate during deposition (or is deposited in a relatively small amount compared to, for example, magnesium). In some embodiments, the source material may be a copper-magnesium (Cu—Mg) mixture or a Cu—Mg compound. In some embodiments, the source material for a magnesium deposition source includes magnesium and a material with a lower vapor pressure than magnesium, such as, for example, Cu. In other embodiments, the source material for a magnesium deposition source is substantially pure magnesium. Specifically, substantially pure magnesium can exhibit substantially similar properties (e.g., initial sticking probabilities on nucleation inhibiting and promoting coatings) compared to pure magnesium (99.99% and higher purity magnesium). For example, an initial sticking probability of substantially pure magnesium on a nucleation inhibiting coating can be within ±10% or within ±5% of an initial sticking probability of 99.99% purity magnesium on the nucleation inhibiting coating. Purity of magnesium may be about 95% or higher, about 98% or higher, about 99% or higher, or about 99.9% or higher. Deposition source materials used to deposit a conductive coating may include other metals in place of, or in combination with, magnesium. For example, a source material may include high vapor pressure materials, such as ytterbium (Yb), cadmium (Cd), zinc (Zn), or any combination thereof.

Various embodiments of the method and electrode formed using such method as described above may be used in conjunction with devices having various pixel and subpixel arrangements. For example, the device may be an RGB device wherein the device comprises a plurality of pixels, each pixel comprising a red subpixel, a green subpixel, and a blue subpixel. Other example subpixel arrangements are illustrated in FIGS. 17-21.

Figure 17:
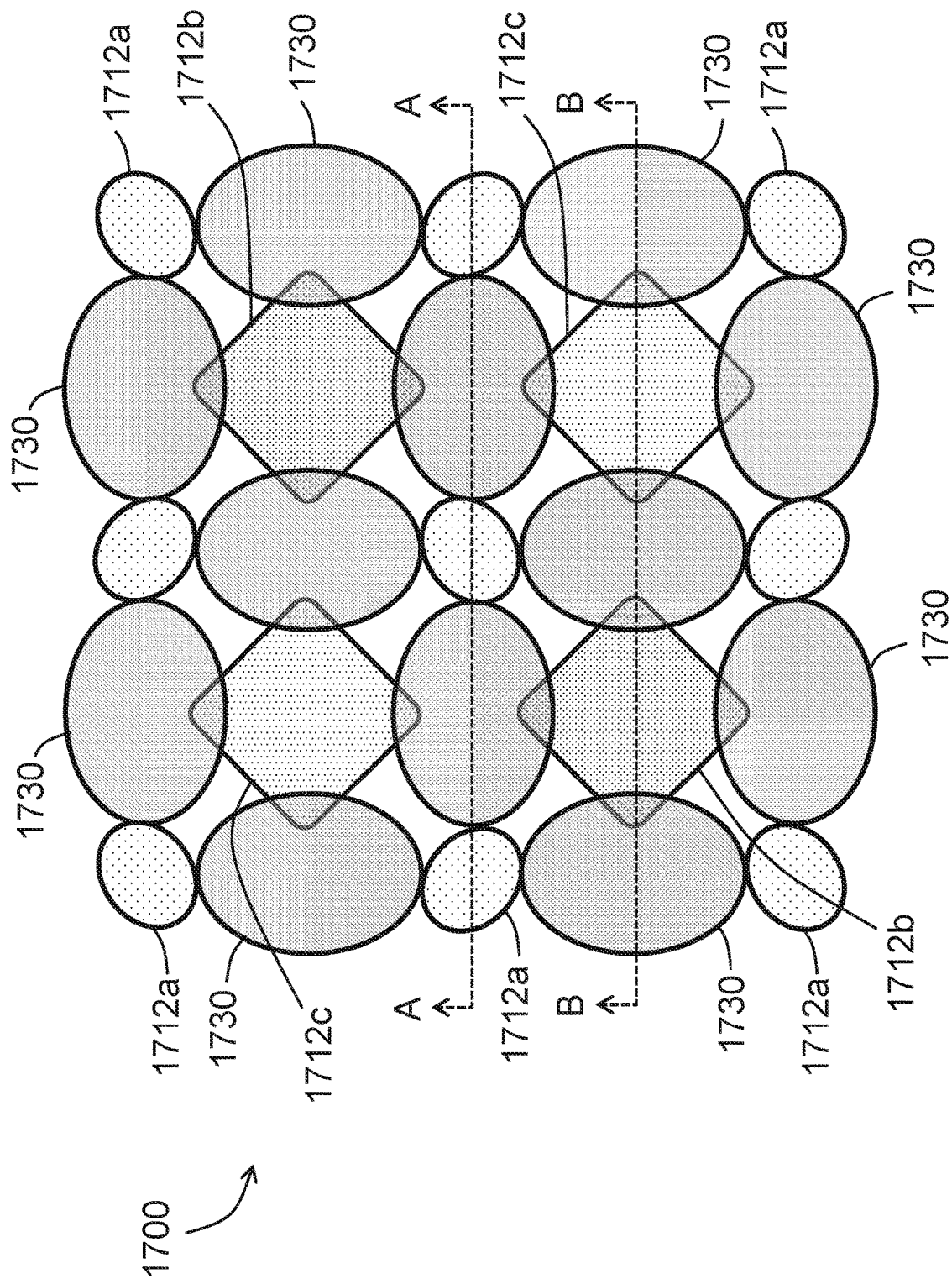
FIG. 17 is a schematic diagram illustrating the top view of a subpixel arrangement according to one embodiment.

FIG. 17 is a schematic illustration of an OLED device 1700 having a diamond pixel arrangement according to one embodiment. The OLED device 1700 includes a plurality of PDLs 1730 and emissive regions 1712a-c (sub-pixels) disposed between neighboring PDLs 1730. The emissive regions 1712a-c include those corresponding to first sub-pixels 1712a, which may, for example, correspond to green sub-pixels, second sub-pixels 1712b, which may, for example, correspond to blue sub-pixels, and third sub-pixels 1712c, which may, for example, correspond to red sub-pixels.

Figure 18:
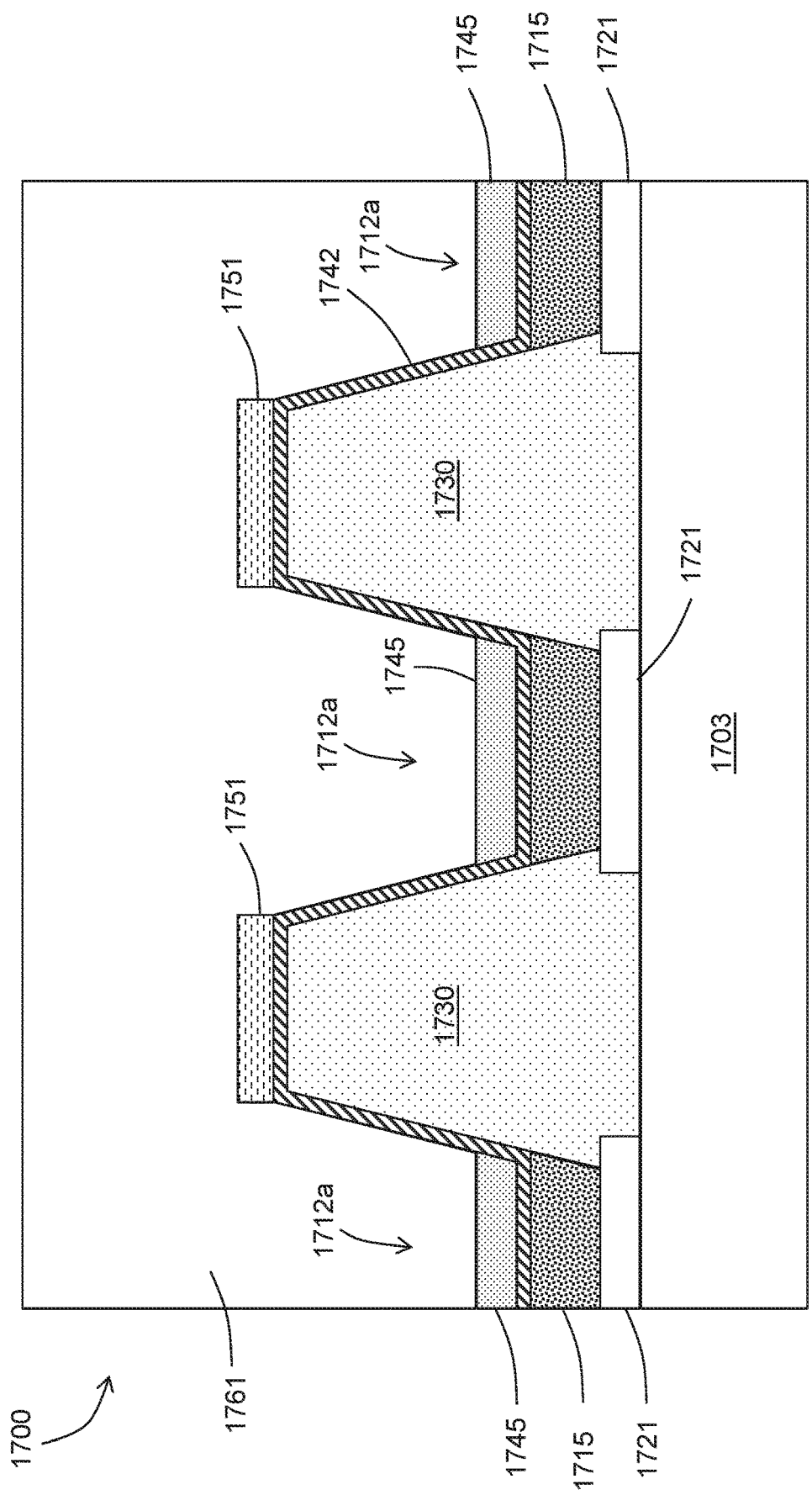
FIG. 18 is a schematic diagram illustrating a cross-sectional view of the subpixel arrangement of FIG. 17.

FIG. 18 is a schematic illustration of the OLED device 1700 taken along line A-A shown in FIG. 17. As more clearly illustrated in FIG. 18, the device 1700 includes a substrate 1703 and a plurality of anode units 1721 formed on a surface of the base substrate 1703. The substrate 1703 may further include a plurality of transistors and a base substrate, which have been omitted from the figure for sake of simplicity. An organic layer 1715 is provided on top of each anode unit 1721 in a region between neighboring PDLs 1730, and a common cathode 1742 is provided over the organic layer 1715 and the PDLs 1730 to form the first sub-pixels 1712a. As described above, the thickness of the common cathode 1745 may be varied between different subpixels. The organic layer 1715 may include a plurality of organic and/or inorganic layers. For example, such layers may include a hole transport layer, a hole injection layer, an electroluminescence layer, an electron injection layer, and/or an electron transport layer. A nucleation inhibiting coating 1745 is provided over regions of the common cathode 1742 corresponding to the first sub-pixels 1712a. An auxiliary electrode 1751 may be disposed over regions which are exposed or uncoated by the nucleation inhibiting coating 1745. For example, such regions may include portions of the common cathode 1742 corresponding to substantially planar regions of the PDLs 1730. The nucleation inhibiting coating 1745 may also act as an index-matching coating. A thin film encapsulation layer 1761 may optionally be provided to encapsulate the device 1700. The thickness of the nucleation inhibiting coating 1745 may also be varied between different subpixels to tune the optical microcavity effects for each subpixel.

Figure 19:
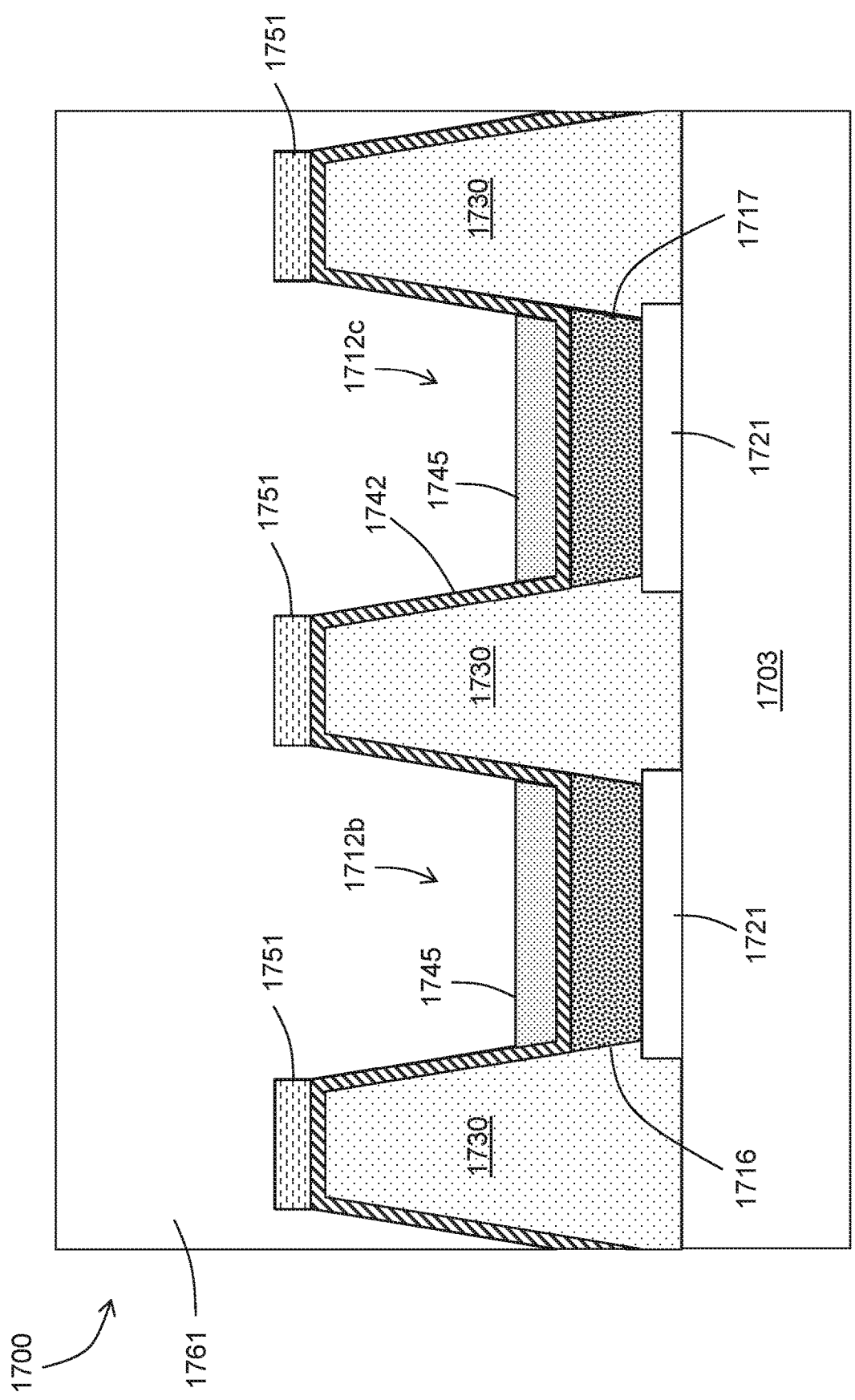
FIG. 19 is a schematic diagram illustrating another cross-sectional view of the subpixel arrangement of FIG. 17.

FIG. 19 shows a schematic illustration of the OLED device 1700 taken along line B-B indicated in FIG. 17. The device 1700 includes the plurality of anode units 1721 formed on the surface of the substrate 1703, and an organic layer 1716 or 1717 provided on top of each anode unit 1721 in a region between neighboring PDLs 1730. The common cathode 1742 is provided over the organic layers 1716 and 1717 and the PDLs 1730 to form the second sub-pixel 1712*b* and the third sub-pixel 1712*c*, respectively. The nucleation inhibiting coating 1745 is provided over regions of the common cathode 1742 corresponding to the sub-pixels 1712*b* and 1712*c*. The auxiliary electrode 1751 is disposed over regions of the common cathode 1742 which are uncovered or exposed from the nucleation inhibiting coating 1745. For example, these regions may correspond to the regions coating the substantially planar regions of the PDLs 1730. The nucleation inhibiting coating 1745 may also act as an index-matching coating. The thin film encapsulation layer 1761 may optionally be provided to encapsulate the device 1700.

Figure 20A:
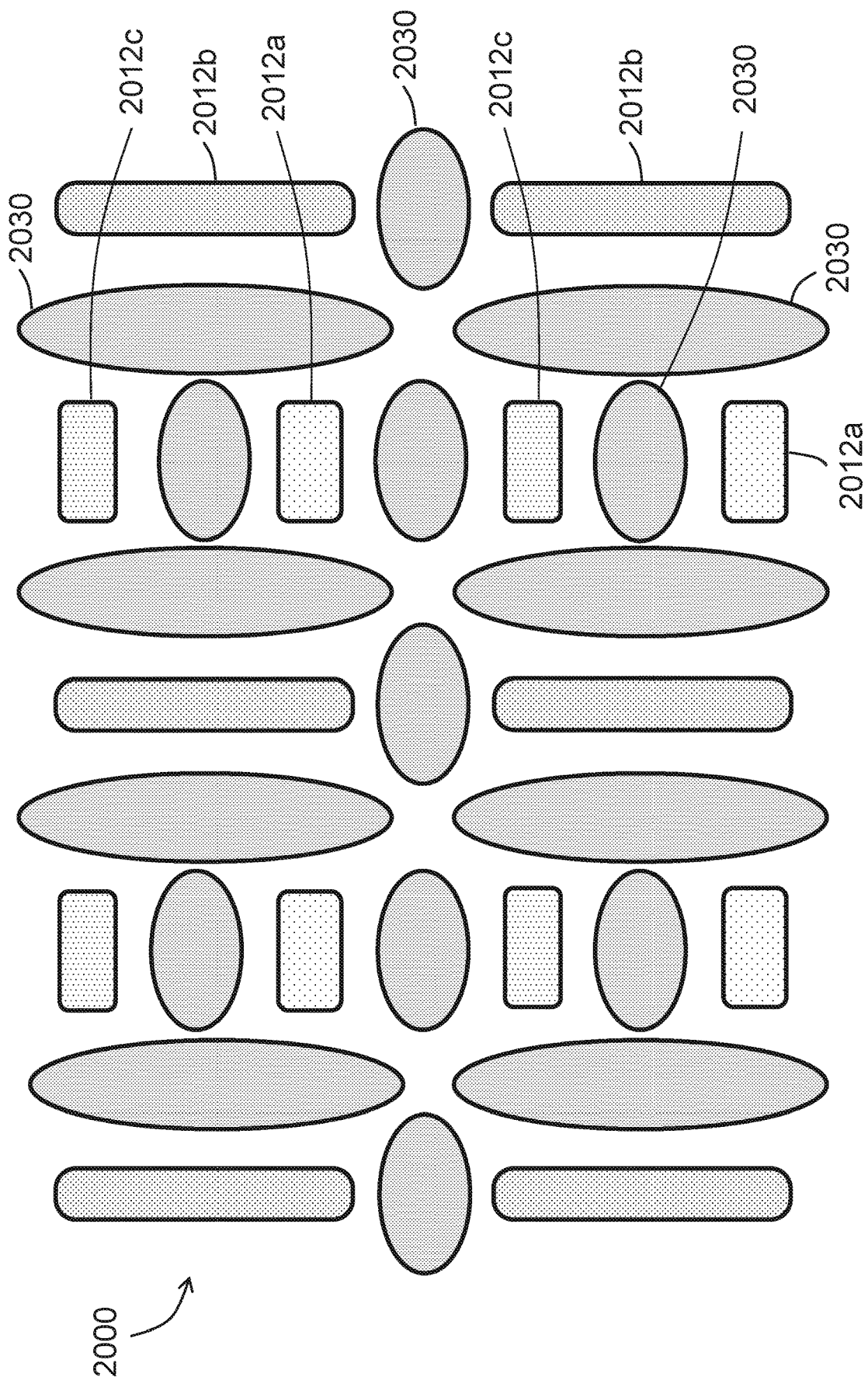
FIG. 20A is a schematic diagram illustrating the top view of a subpixel arrangement according to another embodiment.
Figure 20B:
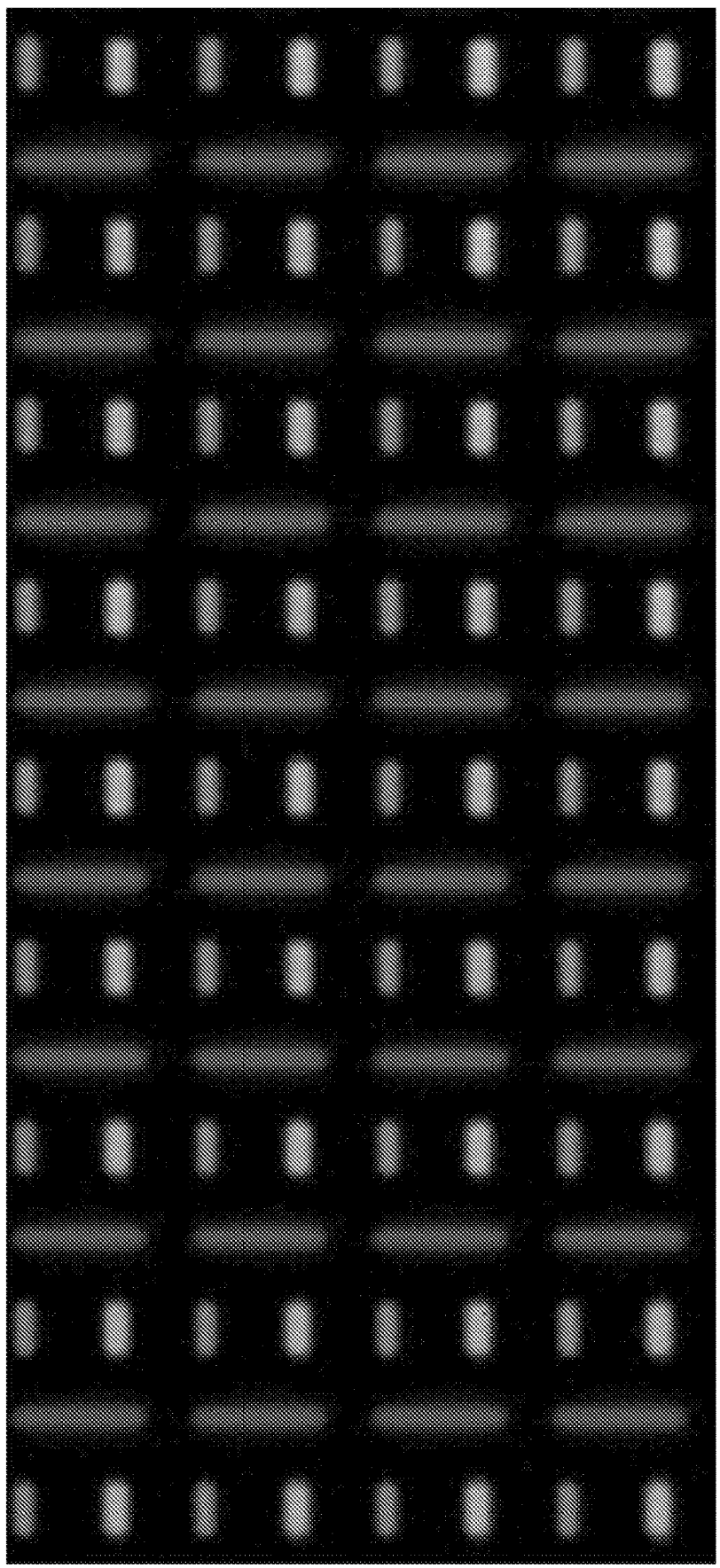
FIG. 20B is a micrograph of the subpixel arrangement of FIG. 20A.

FIG. 20A is a schematic illustration of an OLED device 2000 with a pixel arrangement according to another embodiment. Specifically, the device 2000 includes a plurality of PDLs 2030 separating emissive regions 2012*a-c* (subpixels). For example, first subpixels 2012*a* may correspond to green subpixels, second subpixels 2012*b* may correspond to blue subpixels, and third subpixels 2012*c* may correspond to red subpixels. FIG. 20B is an image of an OLED device with the pixel arrangement according to the embodiment of FIG. 20A. Although not shown, the device 2000 may further include a common cathode with varying thicknesses in the emissive regions, and/or an auxiliary electrode provided over non-emissive regions of the device 2000. For example, the auxiliary electrode may be disposed over regions of a common cathode corresponding to substantially planar portions of the PDLs 2030.

Figure 21A:
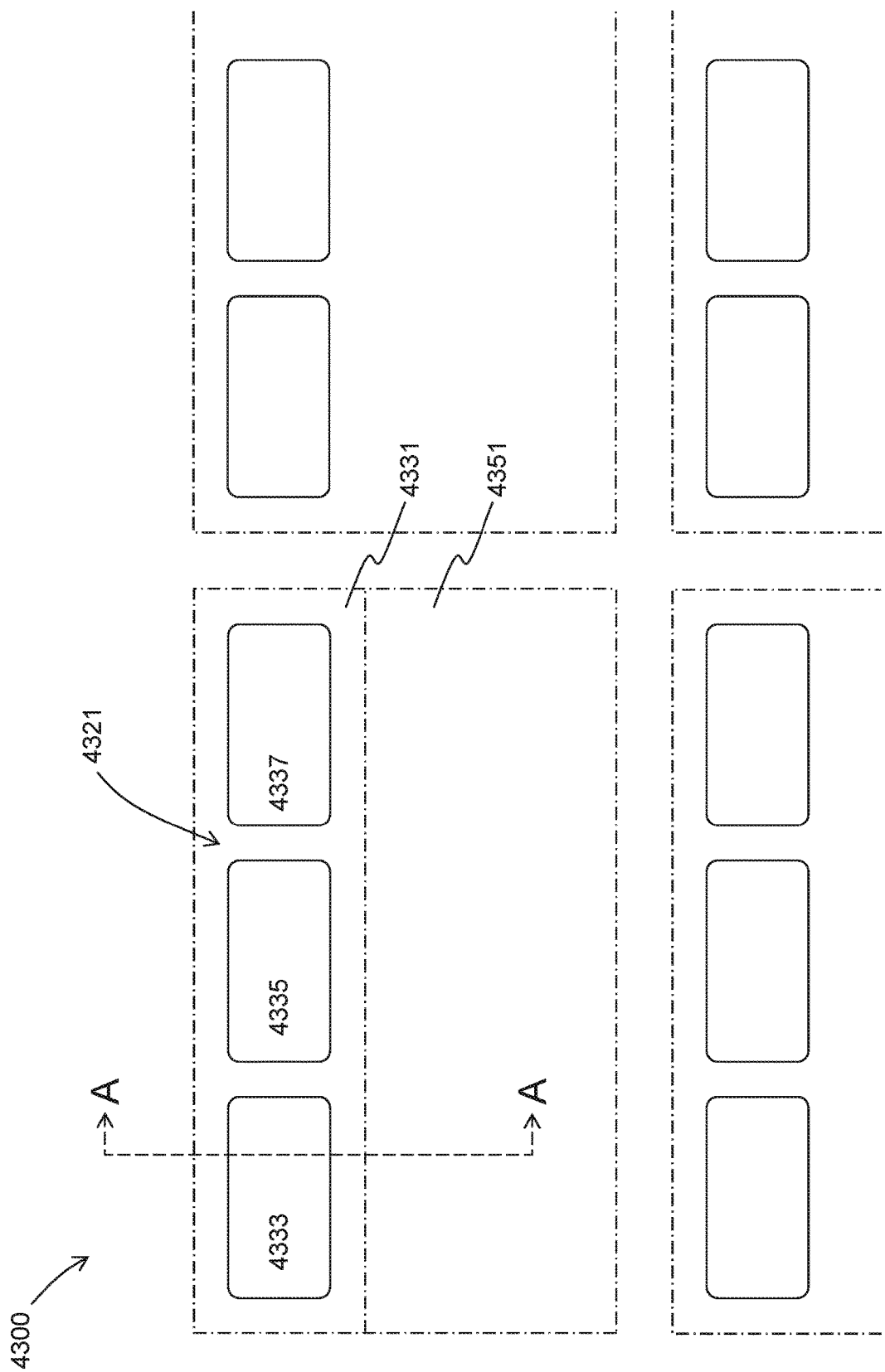
FIG. 21A is a schematic diagram illustrating the top view of a subpixel arrangement according to one embodiment of a transparent display device.

FIG. 21A illustrates a portion of an AMOLED device 4300 according to yet another embodiment wherein the AMOLED device 4300 includes a plurality of light transmissive regions. As illustrated, the AMOLED device 4300 includes a plurality of pixels 4321. Each pixel 4321 includes a subpixel region 4331, which further includes a plurality of subpixels 4333, 4335, 4337, and a light transmissive region 4351. For example, the subpixel 4333 may correspond to a red subpixel, the subpixel 4335 may correspond to a green subpixel, and the subpixel 4337 may correspond to a blue subpixel. As will be explained, the light transmissive region 4351 is substantially transparent to allow light to pass through the device 4300.

Figure 21B:
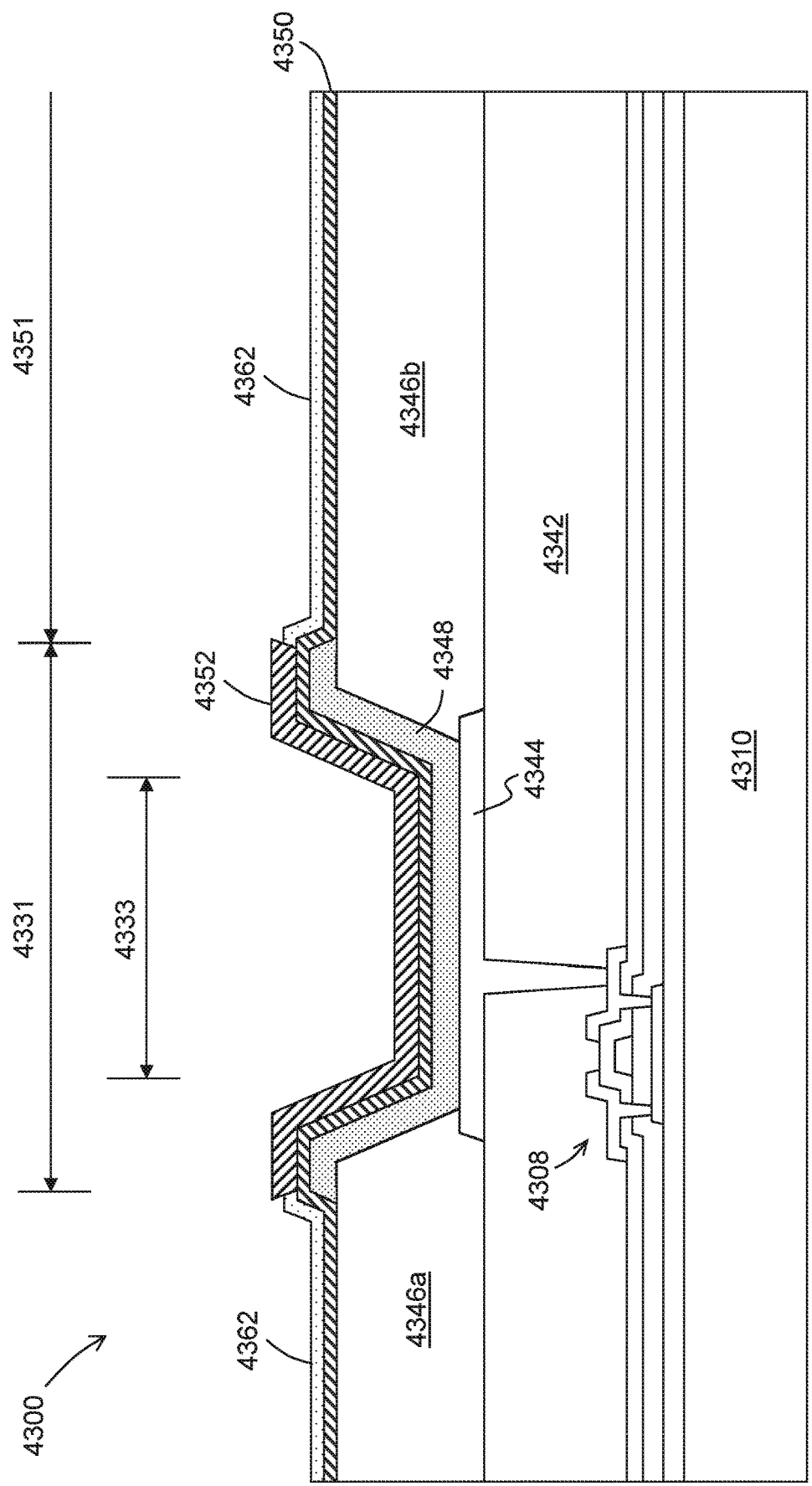
FIG. 21B is a schematic diagram illustrating the cross-section of an AMOLED device of FIG. 21A according to an embodiment.

FIG. 21B illustrates a cross-sectional view of the device 4300 taken along line A-A according to one embodiment. The device 4300 includes a base substrate 4310, a TFT 4308, an insulating layer 4342, and an anode 4344 formed on the insulating layer 4342 and in electrical communication with the TFT 4308. A first PDL 4346*a* and a second PDL 4346*b* are formed over the insulating layer 4342 and cover the edges of the anode 4344. One or more organic layers 4348 are deposited to cover an exposed region of the anode 4344 and portions of the PDLs 4346*a*, 4346*b*. A first conductive coating 4350 is then deposited over the one or more organic layers 4348. In the illustrated embodiment, the first conductive coating 4350 is disposed over both the subpixel region 4331 and the light transmissive region 4351. In such embodiment, the first conductive coating 4350 may be substantially transparent or light-transmissive. For example, the thickness of the first conductive coating 4350 may be relatively thin such that the presence of the first conductive coating 4350 does not substantially attenuate transmission of light through the light transmissive region 4351. The first conductive coating 4350 may, for example, be deposited using an open mask or mask-free deposition process. Next, a nucleation inhibiting coating 4362 is deposited to cover portions of the device 4300 corresponding to the light transmissive region 4351. The entire device surface is then exposed to a vapor flux of material for forming the second conductive coating 4352, thus causing selective deposition of the second conductive coating 4352 over an uncoated region of the first conductive coating 4350. Specifically, the second conductive coating 4352 is disposed over a portion of the device 4300 corresponding to the subpixel region 4331. In this way, a cathode for the device 4300 is formed by the combination of the first conductive coating 4350 and the second conductive coating 4352.

In some embodiments, the thickness of the first conductive coating 4350 is less than the thickness of the second conductive coating 4352. In this way, relatively high light transmittance may be maintained in the light transmissive region 4351. For example, the thickness of the first conductive coating 4350 may be, for example, less than about 30 nm, less than about 25 nm, less than about 20 nm, less than about 15 nm, less than about 10 nm, less than about 8 nm, or less than about 5 nm, and the thickness of the second conductive coating 4352 may be, for example, less than about 30 nm, less than about 25 nm, less than about 20 nm, less than about 15 nm, less than about 10 nm, or less than about 8 nm. In other embodiments, the thickness of the first conductive coating 4350 is greater than the thickness of the second conductive coating 4352. In yet another embodiment, the thickness of the first conductive coating 4350 and the thickness of the second conductive coating 4352 may substantially be about the same.

The material(s) which may be used to form the first conductive coating 4350 and the second conductive coating 4352 may be substantially the same as those used to form the first conductive coating 1371 and the second conductive coating 1372, respectively. Since such materials have been described above in relation to other embodiments, descriptions of these materials are omitted for sake of brevity.

In the device 4300, the light transmissive region 4351 is substantially free of any materials which may substantially affect the transmission of light therethrough. In particular, the TFT 4308, the anode 4344, and an auxiliary electrode are all positioned within the subpixel region 4331 such that these components do not attenuate or impede light from being transmitted through the light transmissive region 4351. Such arrangement allows a viewer viewing the device 4300 from a typical viewing distance to see through the device 4300 when the pixels are off or are non-emitting, thus creating a transparent AMOLED display.

Figure 21C:
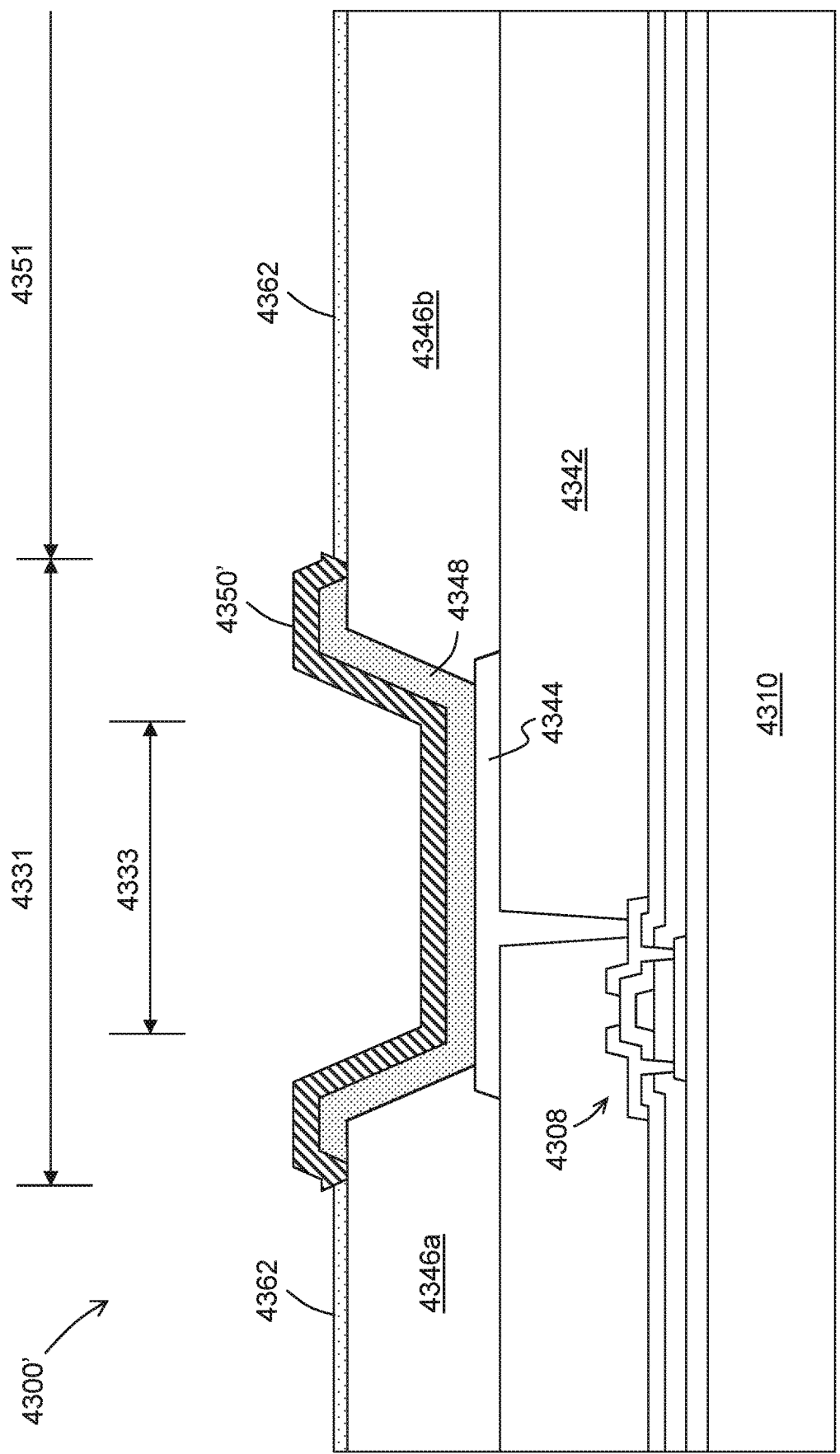
FIG. 21C is a schematic diagram illustrating the cross-section of an AMOLED device of FIG. 21A according to another embodiment.

FIG. 21C illustrates the cross-section of the device 4300' according to another embodiment, wherein the first conductive coating 4350' is selectively disposed in the subpixel region 4331 and the light transmissive region 4351 is substantially free of, or exposed from, the material used to form the first conductive coating 4350'. For example, during fabrication of the device 4300', the nucleation inhibiting coating 4362 may be deposited in the light transmissive region 4351 prior to depositing the first conductive coating 4350'. In this way, the first conductive coating 4350' may be selectively deposited in the subpixel region 4331 using an open mask or mask-free deposition process. As explained above, the material used to form the first conductive coating 4350' generally exhibits a relatively poor affinity (e.g., low initial sticking probability) towards being deposited onto the surface of the nucleation inhibiting coating 4362. For example, the first conductive coating 4350' may comprise high vapor pressure materials, such as ytterbium (Yb), zinc (Zn), cadmium (Cd) and magnesium (Mg). In some embodiments, the first conductive coating 4350' may comprise pure or substantially pure magnesium. By providing a light transmissive region 4351 that is free or substantially free of the first conductive coating 4350', the light transmittance in such region may be favorably enhanced in some cases, for example in comparison to the device 4300 of FIG. 21B.

While not shown, the AMOLED device 4300 of FIG. 21B and the AMOLED device 4300' of FIG. 21C may each further include a nucleation promoting coating disposed between the first conductive coating 4350 or 4350' and the underlying surfaces (e.g., the organic layer 4348). Such nucleation promoting coating may also be disposed between the nucleation inhibiting coating 4362 and the underlying surfaces (e.g., the PDLs 4346a-b).

In some embodiments, the nucleation inhibiting coating 4362 may be formed concurrently with at least one of the organic layers 4348. For example, the material for forming the nucleation inhibiting coating 4362 may also be used to form at least one of the organic layers 4348. In this way, the number of stages for fabricating the device 4300 or 4300' may be reduced.

In some embodiments, additional conductive coatings, including the second conductive coating and the third conductive coating, which have been described in relation to other embodiments above, may also be provided over subpixels 4333, 4335, and 4337. Additionally, in some embodiments, an auxiliary electrode may also be provided in non-emissive regions of the device 4300, 4300'. For example, such auxiliary electrode may be provided in the regions between neighboring pixels 4321 such that it does not substantially affect the light transmittance in the subpixel regions 4331 or the light transmissive regions 4351. The auxiliary electrode may also be provided in the region between the subpixel region 4331 and the light transmissive region 4351, and/or be provided between neighboring subpixels, if desired.

In some embodiments, various layers or coatings, including the organic layers 4348, may cover a portion of the light transmissive region 4351 if such layers or coatings are substantially transparent. Alternatively, the PDLs 4346a, 4346b may be omitted from the light transmissive region 4351, if desired.

It will be appreciated that pixel and subpixel arrangements other than the arrangement illustrated in FIG. 21A and FIG. 21B may also be used.

A barrier coating (not shown) may be provided to encapsulate the devices illustrated in the foregoing embodiments depicting AMOLED display devices. As will be appreciated, such a barrier coating may inhibit various device layers, including organic layers and a cathode which may be prone to oxidation, from being exposed to moisture and ambient air. For example, the barrier coating may be a thin film encapsulation formed by printing, CVD, sputtering, ALD, any combinations of the foregoing, or by any other suitable methods. The barrier coating may also be provided by laminating a pre-formed barrier film onto the devices using an adhesive. For example, the barrier coating may be a multi-layer coating comprising organic materials, inorganic materials, or combination of both. The barrier coating may further comprise a getter material and/or a desiccant in some embodiments.

As will be understood, various layers and portions of a backplane, including a TFT (e.g., TFT 4308 shown in FIG. 21B) may be fabricated using a variety of suitable materials and processes. For example, the TFT may be fabricated using organic or inorganic materials, which may be deposited and/or processed using techniques such as CVD, PECVD, laser annealing, and PVD (including sputtering). As would be understood, such layers may be patterned using photolithography, which uses a photomask to expose selective portions of a photoresist covering an underlying device layer to UV light. Depending on the type of photoresist used, exposed or unexposed portions of the photomask may then be washed off to reveal desired portion(s) of the underlying device layer. A patterned surface may then be etched, chemically or physically, to effectively remove an exposed portion of the device layer.

Furthermore, while a top-gate TFT has been illustrated and described in certain embodiments above, it will be appreciated that other TFT structures may also be used. For example, the TFT may be a bottom-gate TFT. The TFT may be a n-type TFT or a p-type TFT. Examples of TFT structures include those utilizing amorphous silicon (a-Si), indium gallium zinc oxide (IGZO), and low-temperature polycrystalline silicon (LTPS).

Various layers and portions of a frontplane, including electrodes, one or more organic layers, a pixel definition layer, and a capping layer may be deposited using any suitable deposition processes, including thermal evaporation and/or printing. It will be appreciated that, for example, a shadow mask may be used as appropriate to produce desired patterns when depositing such materials, and that various etching and selective deposition processes may also be used to pattern various layers. Examples of such methods include, but are not limited to, photolithography, printing (including ink or vapor jet printing and reel-to-reel printing), CVD, PVD (including sputtering), OVPD, and LITI patterning.

EXAMPLES

Aspects of some embodiments will now be illustrated and described with reference to the following examples, which are not intended to limit the scope of the present disclosure in any way.

As used in the examples herein, a reference to a layer thickness of a material refers to an amount of the material deposited on a target surface (or target region(s) of the surface in the case of selective deposition), which corresponds to an amount of the material to cover the target surface with an uniformly thick layer of the material having the referenced layer thickness. By way of example, depositing a layer thickness of 10 nm indicates that an amount of the material deposited on the surface corresponds to an amount of the material to form an uniformly thick layer of the material that is 10 nm thick. It will be appreciated that, for example, due to possible stacking or clustering of molecules or atoms, an actual thickness of the deposited material may be non-uniform. For example, depositing a layer thickness of 10 nm may yield some portions of the deposited material having an actual thickness greater than 10 nm, or other portions of the deposited material having an actual thickness less than 10 nm. A certain layer thickness of a material deposited on a surface can correspond to an average thickness of the deposited material across the surface.

Molecular structures of certain materials used in the illustrative examples are provided below.

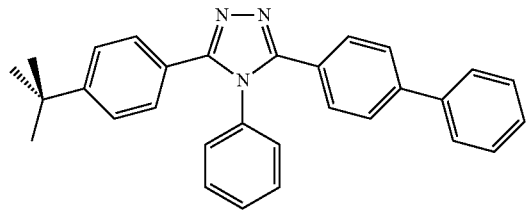

TAZ

Liq

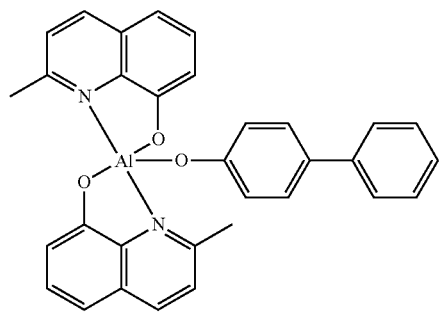

BAlq

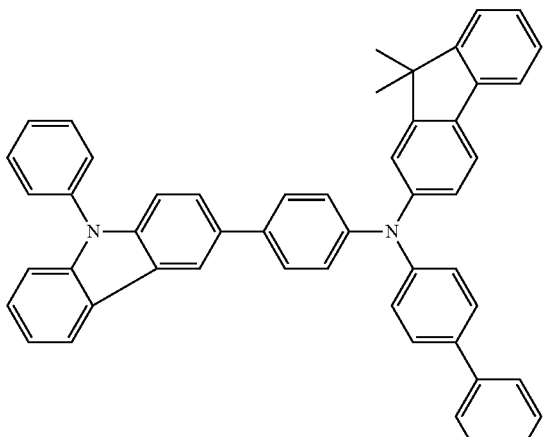

HT211

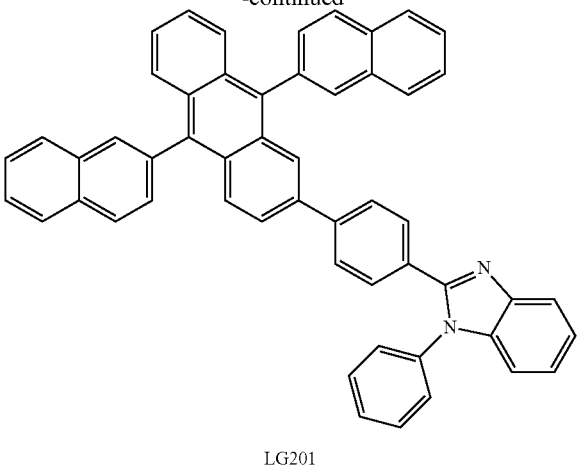

LG201

Example 1

To measure properties of various materials for use as a nucleation inhibiting coating or a nucleation promoting coating, a series of experiments were conducted using a set of quartz crystal microbalances (QCMs).

As will be understood, a QCM can be used to monitor a rate of deposition in a thin film deposition process. Briefly, such monitoring is conducted by measuring a change in frequency of a quartz crystal resonator caused by addition or removal of a material on a surface of the resonator.

Figure 22:
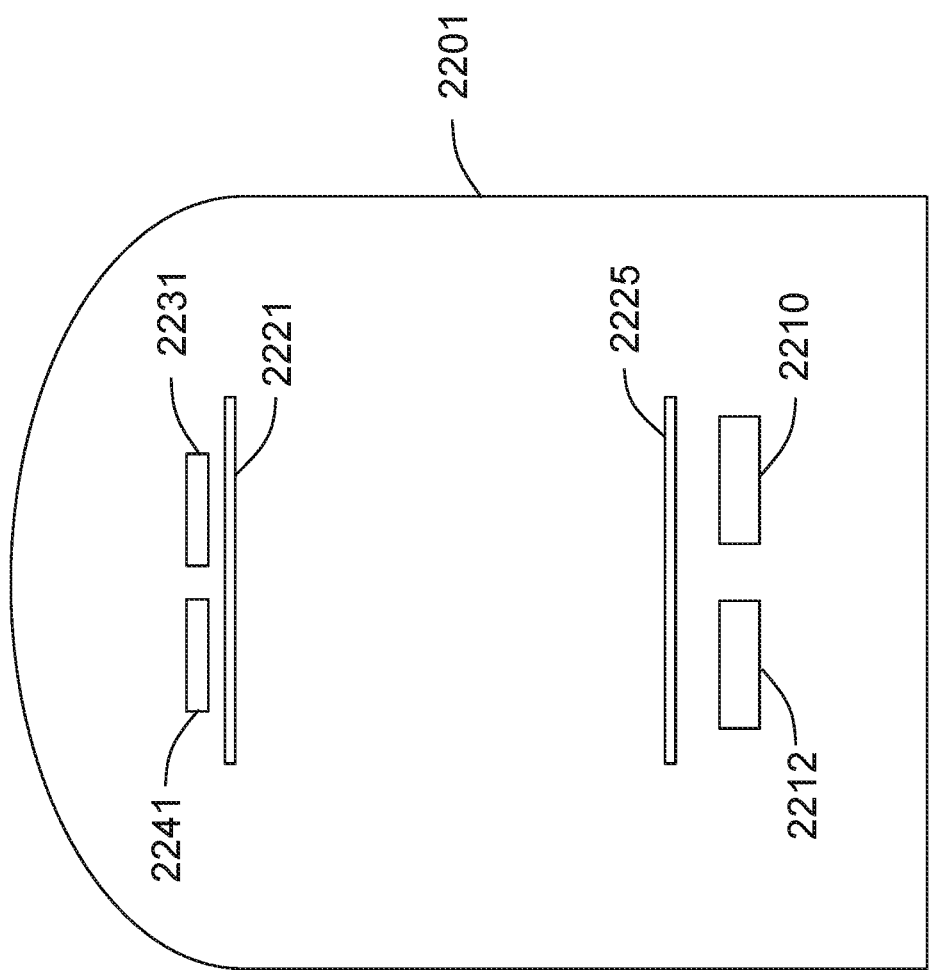
FIG. 22 is a schematic diagram illustrating a QCM experimental set up.

FIG. 22 is a schematic diagram illustrating an experimental set-up for measuring a deposition profile of magnesium on surfaces of QCMs. As illustrated, an evaporation chamber 2201 includes a first evaporation source 2210 and a second evaporation source 2212. A pair of QCMs 2231 and 2241 are positioned inside the chamber 2201 with a resonator surface of each of the QCMs 2231 and 2241 facing towards the sources 2210 and 2212. A sample shutter 2221 and a source shutter 2225 are disposed between the QCMs 2231 and 2241 and the evaporation sources 2210 and 2212. The sample shutter 2221 and the source shutter 2225 are moveable shutters adapted to control a flux of vapor incident on the QCMs 2231 and 2241 and the flux of vapor exiting from the sources 2210 and 2212, respectively.

In the illustrated example set up, the first QCM 2231, which will also be referred to herein as a "reference QCM", serves as a baseline against which a deposition profile of magnesium on the second QCM 2241, which will also be referred to herein as a "sample QCM", is compared. Optically polished quartz crystals obtained from LapTech Precision Inc. (part number: XL1252; frequency: 6.000 MHz; AT1; center: 5.985 MHz; diameter: 13.97 mm±3 mm; optically polished) were used as the reference QCM and the sample QCM in each experiment.

Each experiment was conducted as follows. First, the reference QCM 2231 and the sample QCM 2241 were positioned inside the evaporation chamber 2201 as illustrated in FIG. 22. The chamber 2201 was then pumped down until the chamber pressure was below about $10^{-5}$ Pa. The sample shutter 2221 was then actuated such that the resonator surfaces of both the reference QCM 2231 and the sample QCM 2241 were masked. The first evaporation source 2210 was then initiated to start evaporation of a nucleation promoting or inhibiting material (also referred to as a "nucleation modifying material" herein). Once a stable evaporation rate was achieved, the sample shutter 2221 was moved such that the resonator surface of the sample QCM 2241 became exposed to the vapor flux while keeping the surface of the reference QCM 2231 unexposed, thus allowing the nucleation modifying material to be deposited on the surface of the sample QCM 2241. Upon depositing a desired layer thickness of the nucleation modifying material on the surface of the sample QCM 2241, the source shutter 2225 was actuated to block the vapor flux exiting the first source 2210, thus preventing further deposition. The first source 2210 was then shut off.

Next, the second evaporation source 2212 was initiated to start evaporation of magnesium. The shutter 2221 was used to cover the QCMs 2231 and 2241 until a stable deposition rate was reached. Once the stable deposition rate was reached, the shutter 2221 was actuated to uncover both the modified surface of the sample QCM 2241 and the surface of the reference QCM 2231, such that magnesium vapor was incident on the surfaces of both QCMs 2231 and 2241. The resonant frequencies of the QCMs 2231 and 2241 were monitored to determine the deposition profiles of magnesium on each of the QCMs 2231 and 2241.

Various nucleation modifying materials, including those that can be used to form a nucleation inhibiting coating, were deposited on the resonator surface of the sample QCM 2241 to form a nucleation modifying coating thereon. By repeating the above experimental procedure using the chamber configuration illustrated in FIG. 22 for each nucleation modifying material, the deposition rate of magnesium on various surfaces was analyzed. The following materials were used to form a nucleation modifying coating: 3-(4-biphenyl)-4-phenyl-5-tert-butylphenyl-1,2,4-triazole (TAZ); aluminum (III) bis(2-methyl-8-quninolinato)-4-phenylphenolate (BAlq); 2-(4-(9,10-di(naphthalene-2-yl)anthracene-2-yl)phenyl)-1-phenyl-1H-benzo-[D]imidazole (LG201); 8-hydroxyquinoline lithium (Liq); and N(diphenyl-4-yl)9,9-dimethyl-N-(4(9-phenyl-9H-carbazol-3-yl)phenyl)-9H-fluorene-2-amine (HT211).

Figure 23:
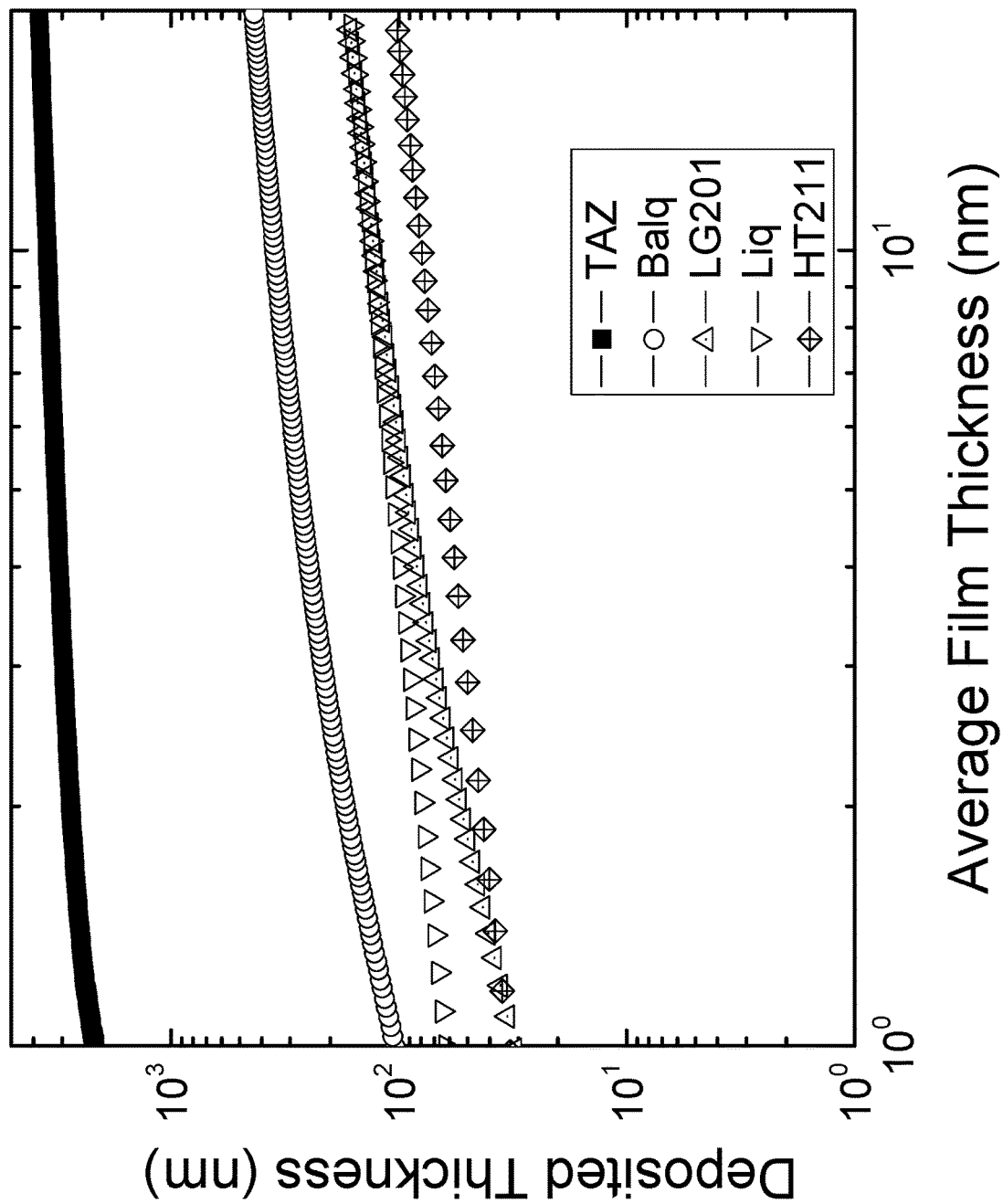
FIG. 23 is a plot of deposited thickness vs. average film thickness for various nucleation inhibiting materials.

FIG. 23 is a log-log plot showing a layer thickness of magnesium deposited on the reference QCM surface (reference layer thickness, or "deposited thickness" as labeled in FIG. 23) against a layer thickness of magnesium deposited on the sample QCM surface (sample layer thickness, or "average film thickness" as labeled in FIG. 23). In each case, the reference QCM surface was pre-coated with substantially pure silver prior to conducting the experiments.

Based on the plot of FIG. 23, the layer thicknesses of magnesium deposited on both QCM surfaces and thus the deposition rate of magnesium as a result of exposing the surfaces to the same magnesium vapor flux can be determined. In particular, by comparing the deposition rate of magnesium on the sample QCM surface to that on the reference QCM surface during the formation of a relatively thin layer of magnesium on the sample QCM surface (namely, during initial stages of deposition of up to 1 nm or 10 nm in layer thickness), the nucleation inhibiting properties of a coating present on the sample QCM surface may be determined. For ease of discussion, the layer thickness of magnesium deposited on the sample QCM surface will be referred to as the sample layer thickness, and the layer thickness of magnesium deposited on the reference QCM surface will be referred to as the reference layer thickness.

For certain experiments, the reference layer thickness corresponding to the sample layer thickness at 1 nm and 10 nm for various samples is summarized in Table 2 below. Specifically, the reference layer thickness provided in Table 2 corresponds to the layer thickness of magnesium deposited on the reference QCM surface in the same time period for a 1 nm or 10 nm layer thickness to be deposited on the sample QCM surface for each sample. Organic materials were deposited at a deposition rate of about 1 Å/sec at a vacuum pressure of about $10^{-5}$ Pa. Magnesium was deposited at a deposition rate of about 2 Å/sec at a source temperature of about 520-530° C. and a vacuum pressure of about $10^{-5}$ Pa.

TABLE 2

Summary of results of the sample layer thickness and corresponding reference layer thickness

| Nucleation Modifying Material | Thickness of Mg on sample QCM surface (nm) | Thickness of Mg on reference QCM surface (nm) |
|---|---|---|
| TAZ | 1 | 2158 |
| BAlq | 1 | 104 |
| LG201 | 1 | 31 |
| Liq | 1 | 62 |
| HT211 | 1 | 33 |

Based on the above, it can be seen that the reference layer thickness which was deposited when the sample layer thickness of 1 nm was reached varied substantially depending on the nucleation modifying material covering the sample QCM surface. A threshold sample layer thickness of 1 nm was selected in this example to determine the relative deposition rates during the initial stage of film formation on the sample QCM surface. It was observed that, since the reference QCM surface was pre-coated with silver, the deposition rate of magnesium on the reference QCM surface remained relatively constant.

A relatively thick coating of magnesium in excess of 2000 nm was deposited on the reference QCM before the sample layer thickness of 1 nm was reached for the sample QCM coated with TAZ. A reference layer thickness of 104 nm was deposited before the sample layer thickness of 1 nm was reached for the sample QCM coated with BAlq. However, a relatively thin coating of magnesium with a layer thickness less than 62 nm was deposited on the reference QCM before the threshold thickness was reached for the sample QCMs coated with LG201, Liq, or HT211.

As will be appreciated, a greater selectivity can generally be achieved during conductive coating deposition by using a nucleation modifying coating exhibiting a relatively high reference layer thickness, and thus a relatively low initial deposition rate and sticking probability. For example, a nucleation modifying coating exhibiting a high reference layer thickness may be an effective nucleation inhibiting coating, and may be used to cover region(s) of a target surface, such that when the target surface is exposed to magnesium vapor flux, magnesium selectively forms over uncovered region(s) of the target surface, with a surface of the nucleation inhibiting coating remaining substantially free of or substantially uncovered by magnesium. For example, a nucleation modifying coating exhibiting a reference layer thickness of at least or greater than about 80 nm at a threshold sample layer thickness of 1 nm may be used as a nucleation inhibiting coating. For example, a nucleation modifying coating exhibiting a reference layer thickness of at least or greater than about 100 nm, at least or greater than about 200 nm, at least or greater than about 500 nm, at least or greater than about 700 nm, at least or greater than about 1000 nm, at least or greater than about 1500 nm, at least or greater than about 1700 nm, or at least or greater than about 2000 nm at 1 nm threshold thickness may be used as a nucleation inhibiting coating. In other words, an initial deposition rate of magnesium on the reference surface may be at least or greater than about 80 times, at least or greater than about 100 times, at least or greater than about 200 times, at least or greater than about 500 times, at least or greater than about 700 times, at least or greater than about 1000 times, at least or greater than about 1500 times, at least or greater than about 1700 times, or at least or greater than about 2000 times an initial deposition rate of magnesium on a surface of the nucleation inhibiting coating.

Figure 24:
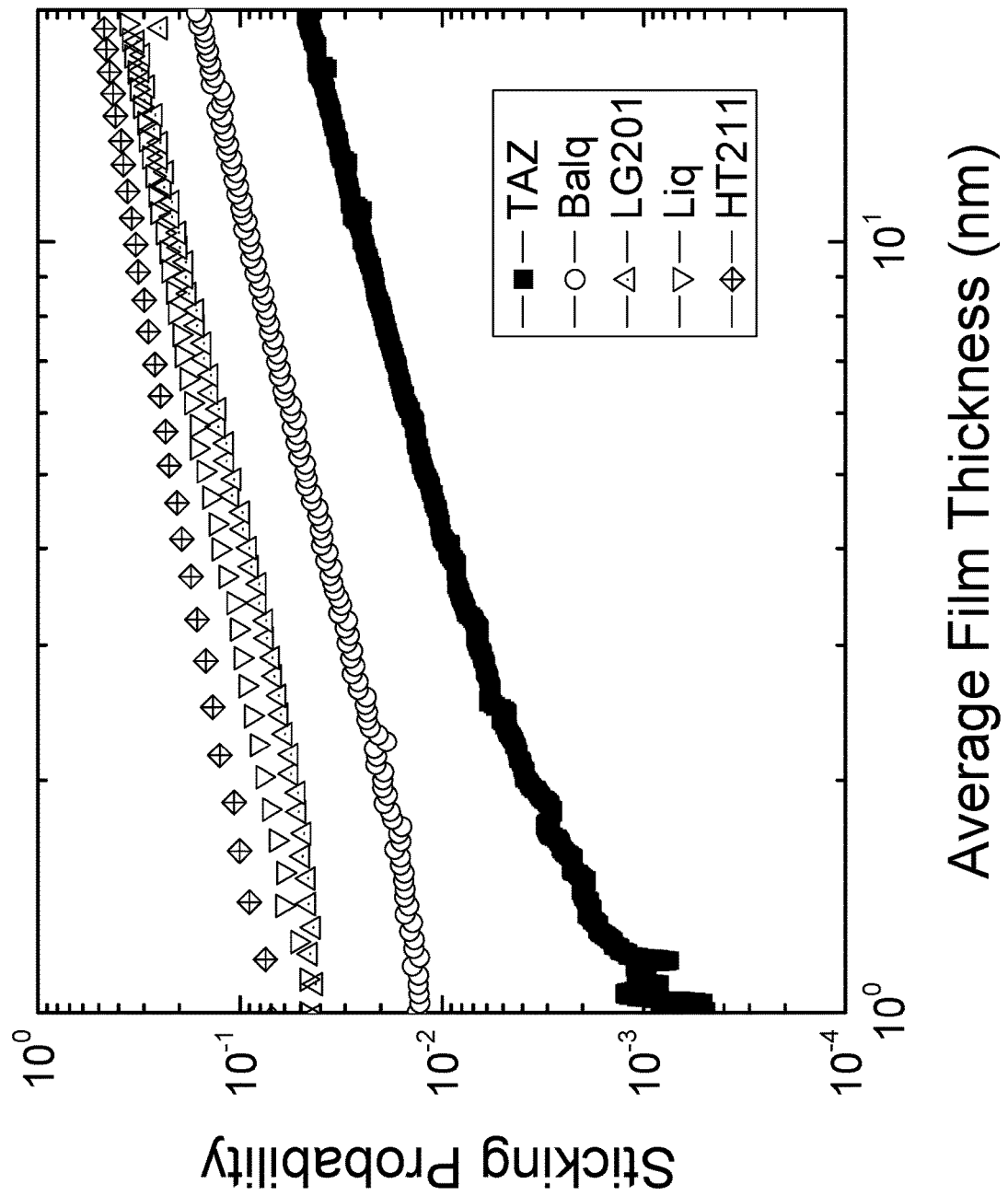
FIG. 24 is a plot of sticking probability vs. average film thickness for various nucleation inhibiting materials.

FIG. 24 is a log-log plot of sticking probability of magnesium vapor on the sample QCM surface versus a layer thickness of magnesium deposited on the sample QCM surface.

The sticking probability was derived based on the following equation:

$$S = \frac{N_{ads}}{N_{total}}$$

wherein $N_{ads}$ is a number of adsorbed monomers that are incorporated into a magnesium coating on the surface of the sample QCM, and $N_{total}$ is a total number of impinging monomers on the surface, which was determined based on monitoring the deposition of magnesium on the reference QCM.

As can be seen from the plot of FIG. 24, the sticking probability generally increases as more magnesium is deposited on the surface. For the purpose of achieving selective deposition of a magnesium coating, a nucleation inhibiting coating exhibiting a relatively low initial sticking probability (e.g., a low sticking probability during an initial deposition stage) is desirably used. More specifically, an initial sticking probability of this example refers to the sticking probability measured upon depositing an amount of magnesium corresponding to forming a close-packed magnesium layer with an average thickness of 1 nm on a surface of a nucleation inhibiting coating. The sticking probability measured upon deposition of 1 nm layer thickness of magnesium on various nucleation inhibiting coating surfaces are summarized in Table 3 below.

TABLE 3

Summary of results of sticking probability

| Nucleation Inhibiting Material | Sticking probability upon deposition of 1 nm of Mg |
| --- | --- |
| TAZ | <0.001 |
| BAlq | 0.013 |
| LG201 | 0.042 |
| Liq | 0.045 |
| HT211 | 0.064 |

Based on the experiments, coatings exhibiting an initial sticking probability of no greater than or less than about 0.3 (or 30%) with respect to magnesium vapor may act as a nucleation inhibiting coating. As would be understood, nucleation inhibiting coatings with lower initial sticking probability may be more desirable for some applications, such as for achieving greater selectivity during the deposition of a magnesium coating. For example, coatings with an initial sticking probability of no greater than or less than about 0.2, no greater than or less than about 0.1, or no greater than or less than about 0.07 may be used as a nucleation inhibiting coating. For example, such nucleation inhibiting coating may include those formed by depositing TAZ, BAlq, LG201, Liq, and/or HT211.

In some applications, nucleation inhibiting coatings with even lower initial sticking probability may be more desirable, such as for achieving deposition of a relatively thick magnesium coating, particularly for use as an auxiliary electrode. For example, coatings with an initial sticking probability of no greater than or less than about 0.03, no greater than or less than about 0.02, no greater than or less than about 0.01, no greater than or less than about 0.08, no greater than or less than about 0.005, no greater than or less than about 0.003, no greater than or less than about 0.001, no greater than or less than about 0.0008, no greater than or less than about 0.0005, or no greater than or less than about 0.0001 may be used as a nucleation inhibiting coating. For example, such nucleation inhibiting coating may include those formed by depositing BAlq and/or TAZ.

Example 2

To evaluate the optical microcavity effects caused by various thicknesses of cathode, an OLED device including four device regions was fabricated.

Figure 25:
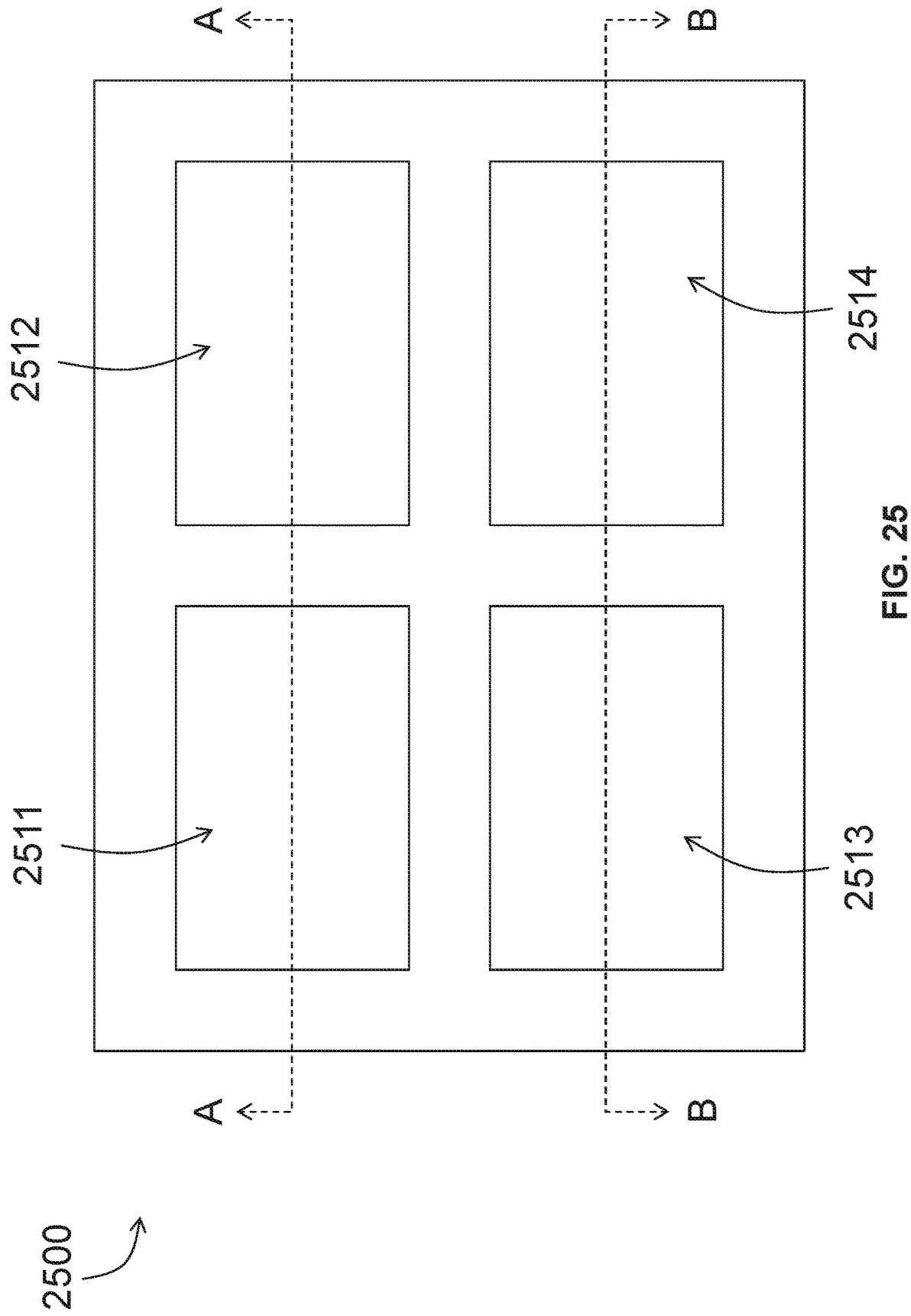
FIG. 25 is a schematic diagram of the top view of an example device.
Figure 26:
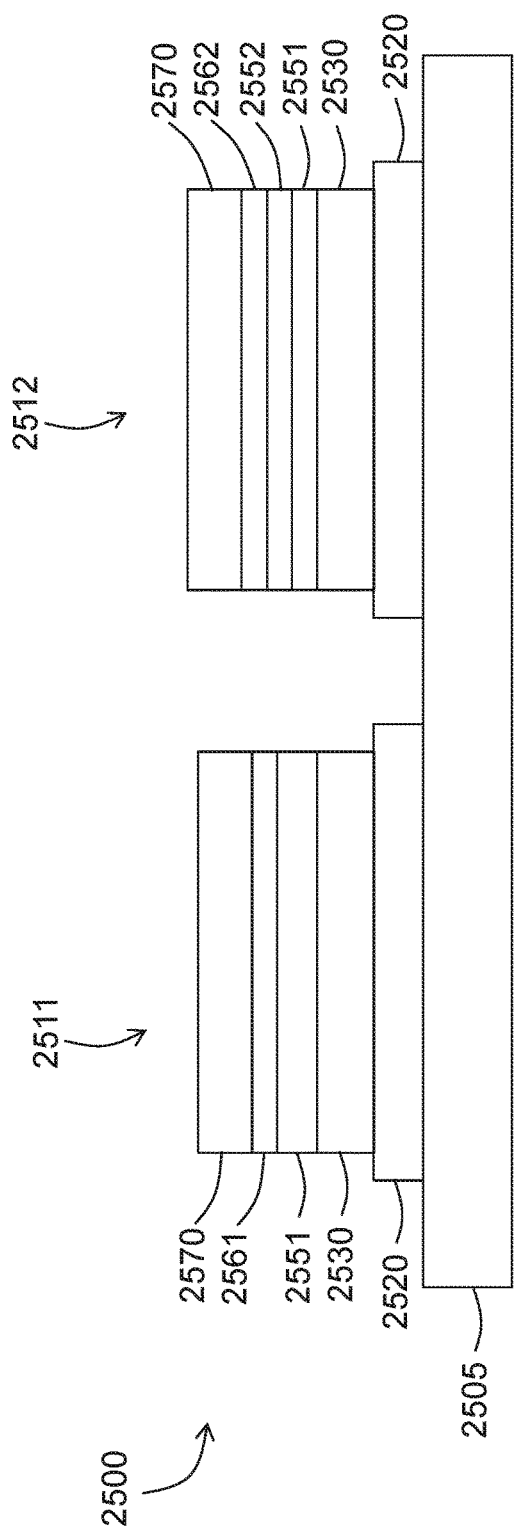
FIG. 26 is a schematic diagram of a cross-sectional view of the device of FIG. 25.
Figure 27:
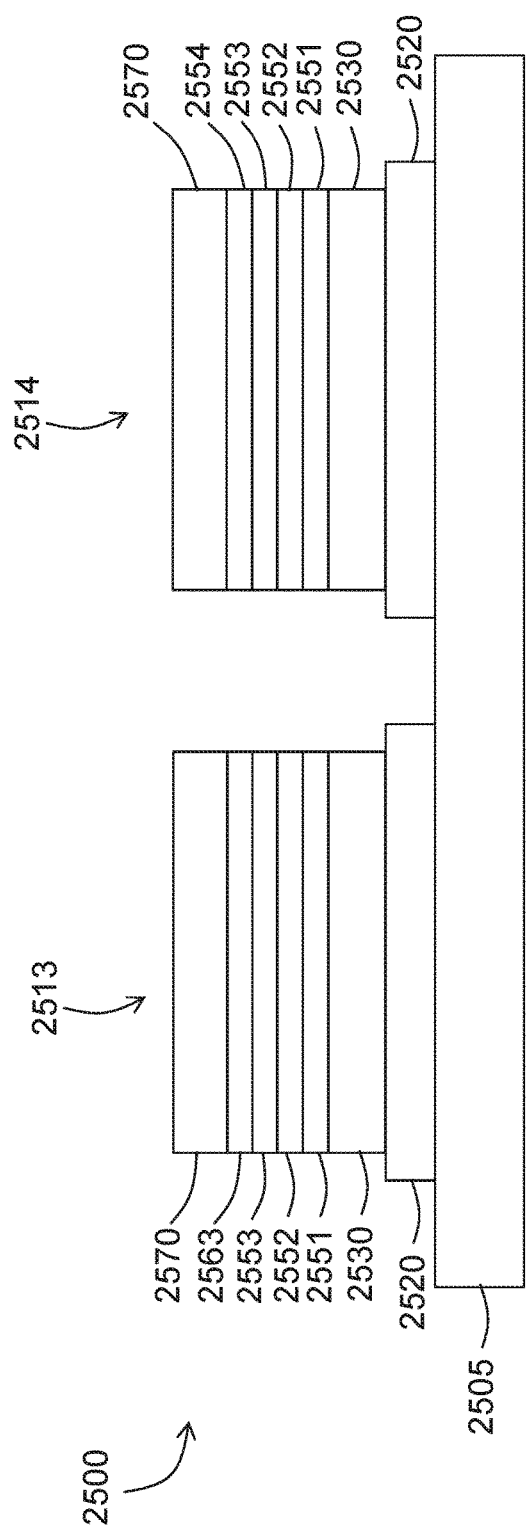
FIG. 27 is a schematic diagram of another cross-sectional view of the device of FIG. 25.

FIG. 25 is a schematic diagram illustrating the top view of the OLED device 2500 which was fabricated. The device 2500 includes a first device region 2511, a second device region 2512, a third device region 2513, and a fourth device region 2514. Each device region comprises an anode, organic layers, a cathode, and a capping layer. The structure of the device 2500 is further detailed in FIGS. 26 and 27, which illustrate the cross-sectional views taken along lines A-A and B-B indicated in FIG. 25, respectively. For all of the device regions, identical anode and organic layers were provided.

The OLED device 2500 was fabricated in the following manner. The reflective anode 2520 was deposited in each of the device regions 2511, 2512, 2513, 2514. Organic layers 2530 were then deposited over the reflective anode 2520 in each of the device regions 2511, 2512, 2513, 2514. The organic layers 2530 included an emitter layer comprising a green phosphorescent emitter. A first conductive coating 2551 was then deposited over the organic layers 2530 in each of the device regions 2511, 2512, 2513, 2514. The first conductive coating 2551 comprised a magnesium-silver alloy (Mg:Ag) having an Mg:Ag composition ratio of 1:4 by volume, and the thickness of the first conductive coating was 12 nm. A first nucleation inhibiting coating 2561 was then deposited over the first conductive coating 2551 in the first device region 2511. The first nucleation inhibiting coating 2561 was formed by 5 nm thick TAZ coating.

The device regions 2511, 2512, 2513, 2514 were then exposed to evaporated magnesium flux to deposit a second conductive coating 2552 in the second device region 2512, the third device region 2513, and the fourth device region 2514. It is noted that, since the nucleation inhibiting coating 2561 was provided over the first conductive coating 2551 in the first device region 2511, the second conductive coating was not deposited in the first device region 2511. The second conductive coating was formed by 6 nm thick coating of substantially pure magnesium (purity 22 99.99%). A second nucleation inhibiting coating 2562 was then deposited over the second conductive coating 2552 in the second device region 2512.

The device regions 2511, 2512, 2513, 2514 were then exposed to evaporated magnesium flux to deposit a third conductive coating 2553 in the third device region 2513 and the fourth device region 2514. It is noted that, since the first nucleation inhibiting coating 2561 and the second nucleation inhibiting coating 2562 were provided in the first device region 2511 and the second device region 2512, respectively, the third conductive coating was not deposited over the first device region 2511 or the second device region 2512. The third conductive coating was formed by 6 nm thick coating of substantially pure magnesium (purity>99.99%). A third nucleation inhibiting coating 2563 was then deposited over the third conductive coating 2553 in the third device region 2513.

The device regions 2511, 2512, 2513, 2514 were then exposed to evaporated magnesium flux to deposit a fourth conductive coating 2554 in the fourth device region 2514. It is noted that, since the first nucleation inhibiting coating 2561, the second nucleation inhibiting coating 2562, and the third nucleation inhibiting coating 2563 were provided in the first device region 2511, the second device region 2512, and the third device region 2513, respectively, the fourth conductive coating was not deposited over the first device region 2511, the second device region 2512, or the third device region 2513. The fourth conductive coating was formed by 6 nm thick coating of substantially pure magnesium (purity>99.99%).

A capping layer 2570 was then deposited over the device regions 2511, 2512, 2513, 2514. The capping layer 2570 was formed by depositing a 35 nm thick TAZ coating.

Figure 28:
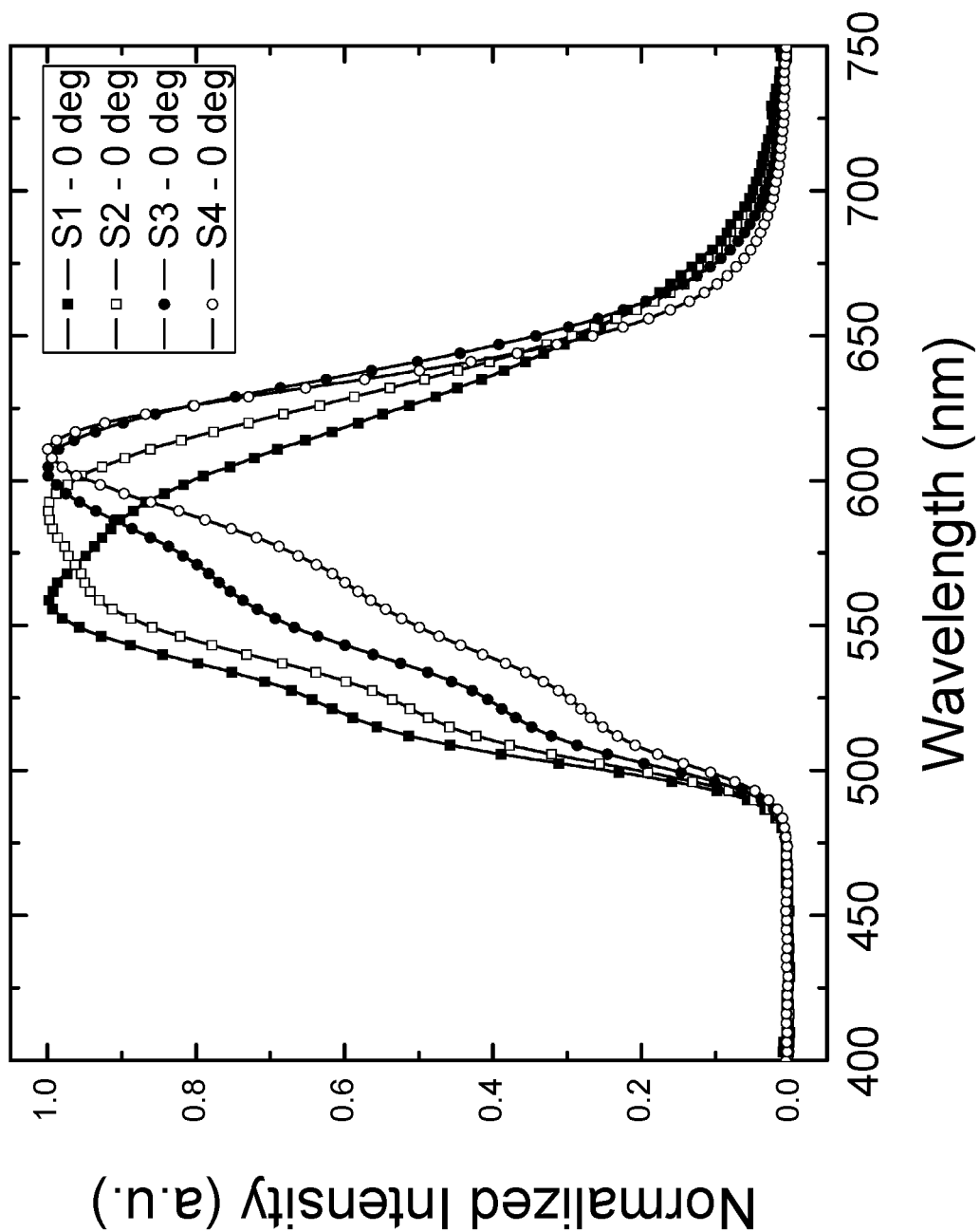
FIG. 28 is a plot showing the emission spectrum obtained from various regions of the example device of FIG. 25.

The emission spectrum from each of the device regions 2511, 2512, 2513, 2514 was measured. FIG. 28 is a plot showing the normalized intensity of light emission measured from each of the device regions. The emission spectrum shown in the plot of FIG. 28 was measured at an angle normal to the device surface. The emission spectrum of the first device region is labelled as S1, the second device region is S2, the third device region is S3, and the fourth device region is S4. As can be seen from the plot of FIG. 28, the emission spectrum generally shifted towards longer wavelength (e.g., red shifted) for device regions provided with greater cathode thickness. In particular, it was observed that the fourth device region S4, which was provided with the greatest cathode thickness, generally exhibited the greatest amount of red shift, followed by the third device region S3, then the second device region S2.

Figure 29:
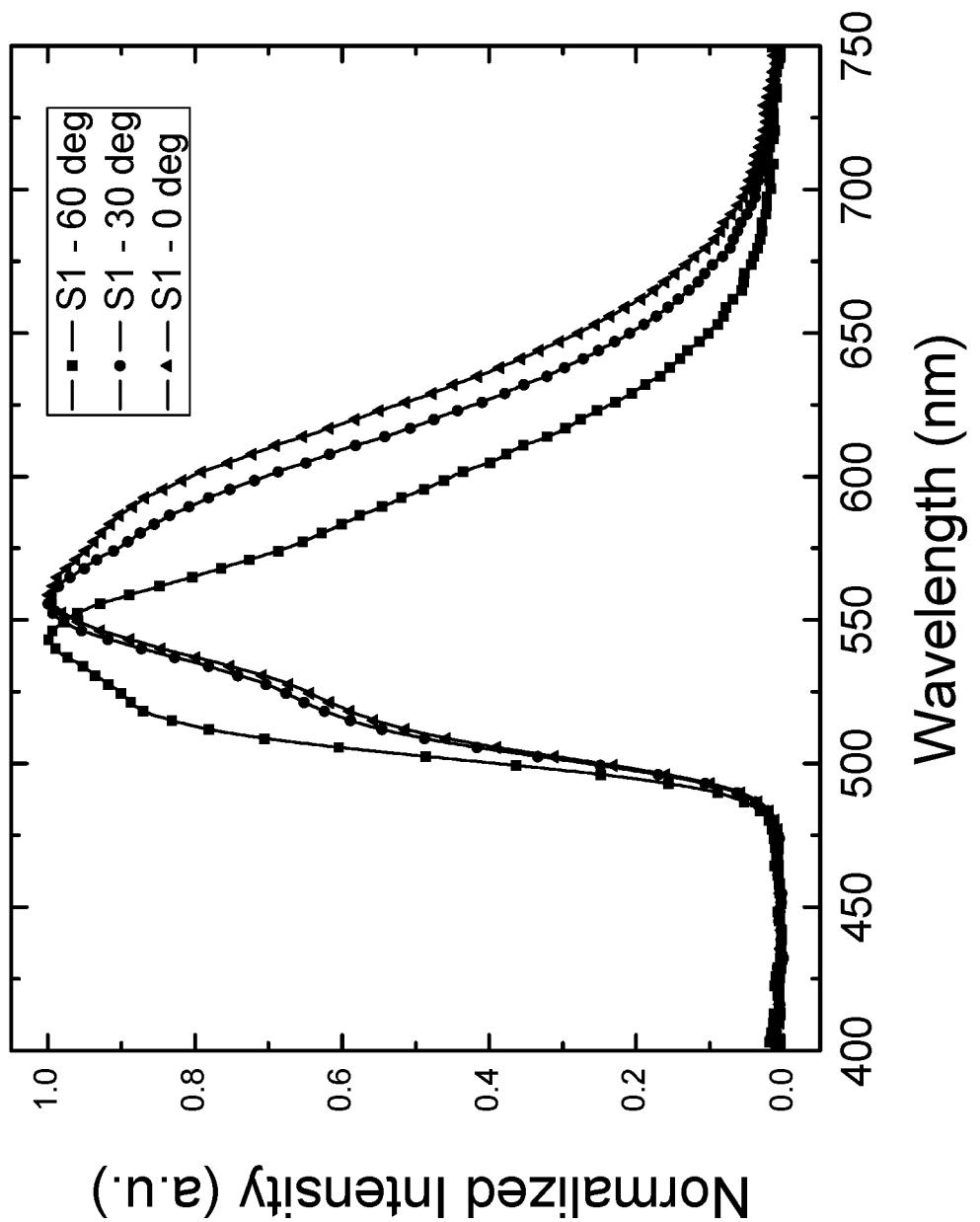
FIG. 29, FIG. 30, FIG. 31, and FIG. 32 are plots showing the emission spectrum obtained from various regions of the example device of FIG. 25 at various measurement angles.
Figure 30:
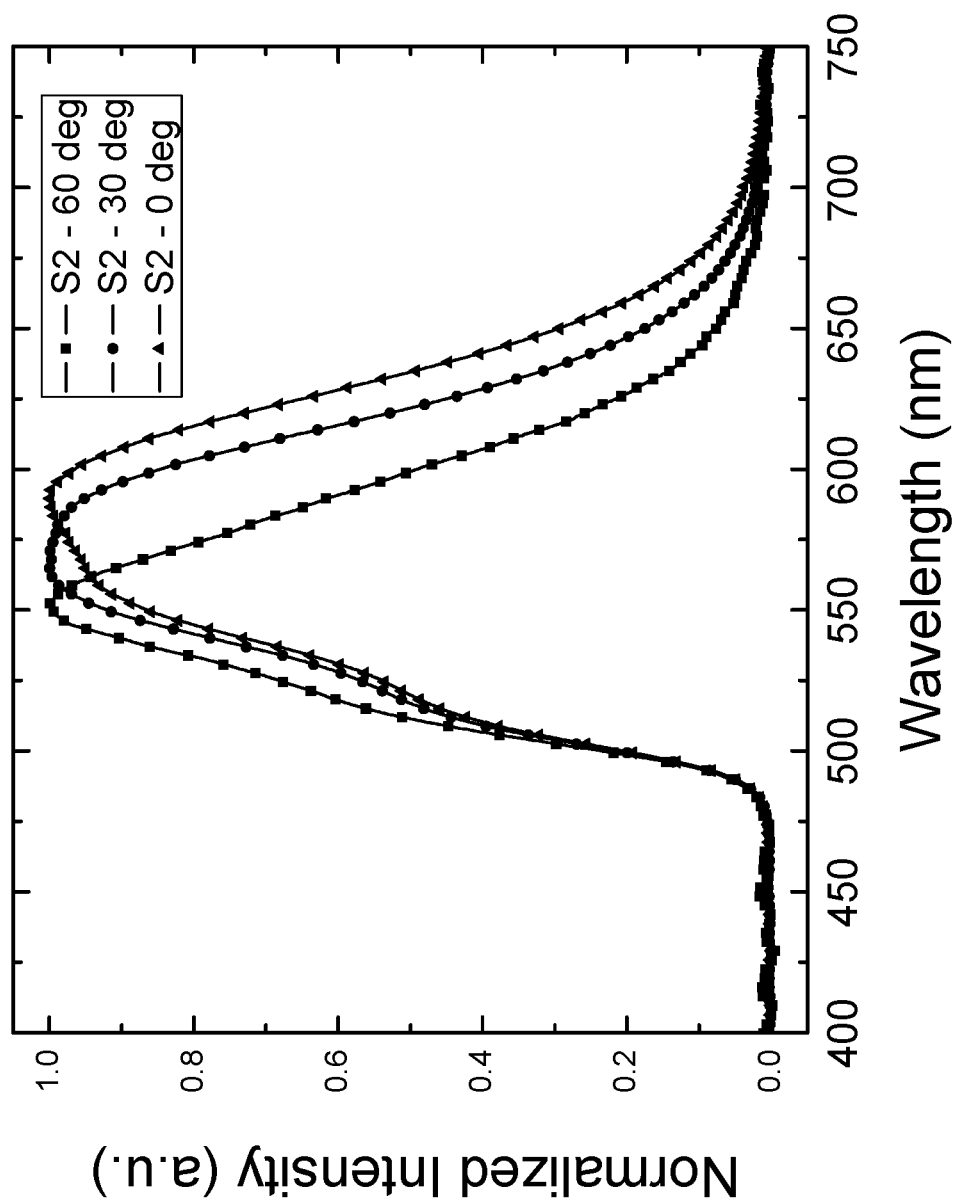
Figure 31:
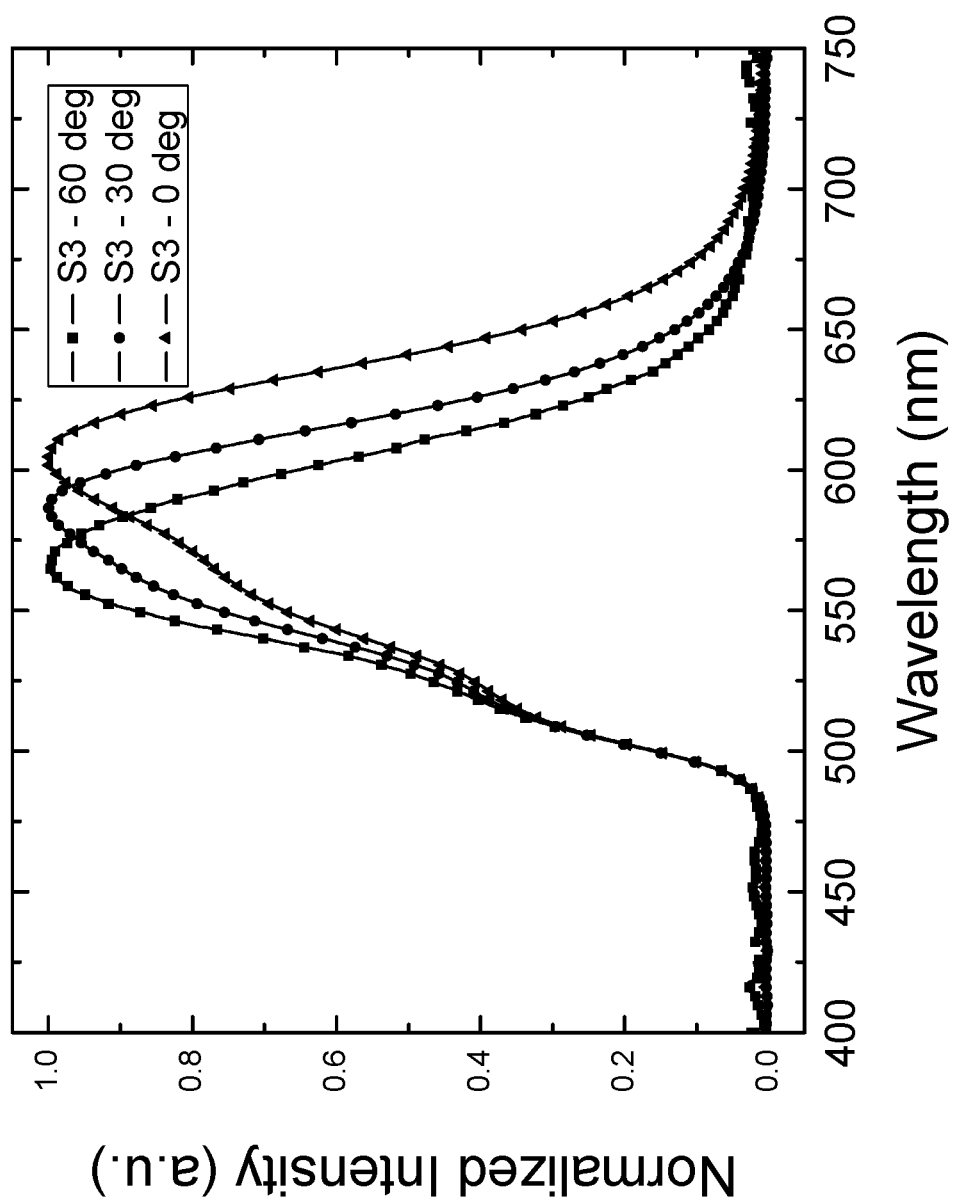
Figure 32:
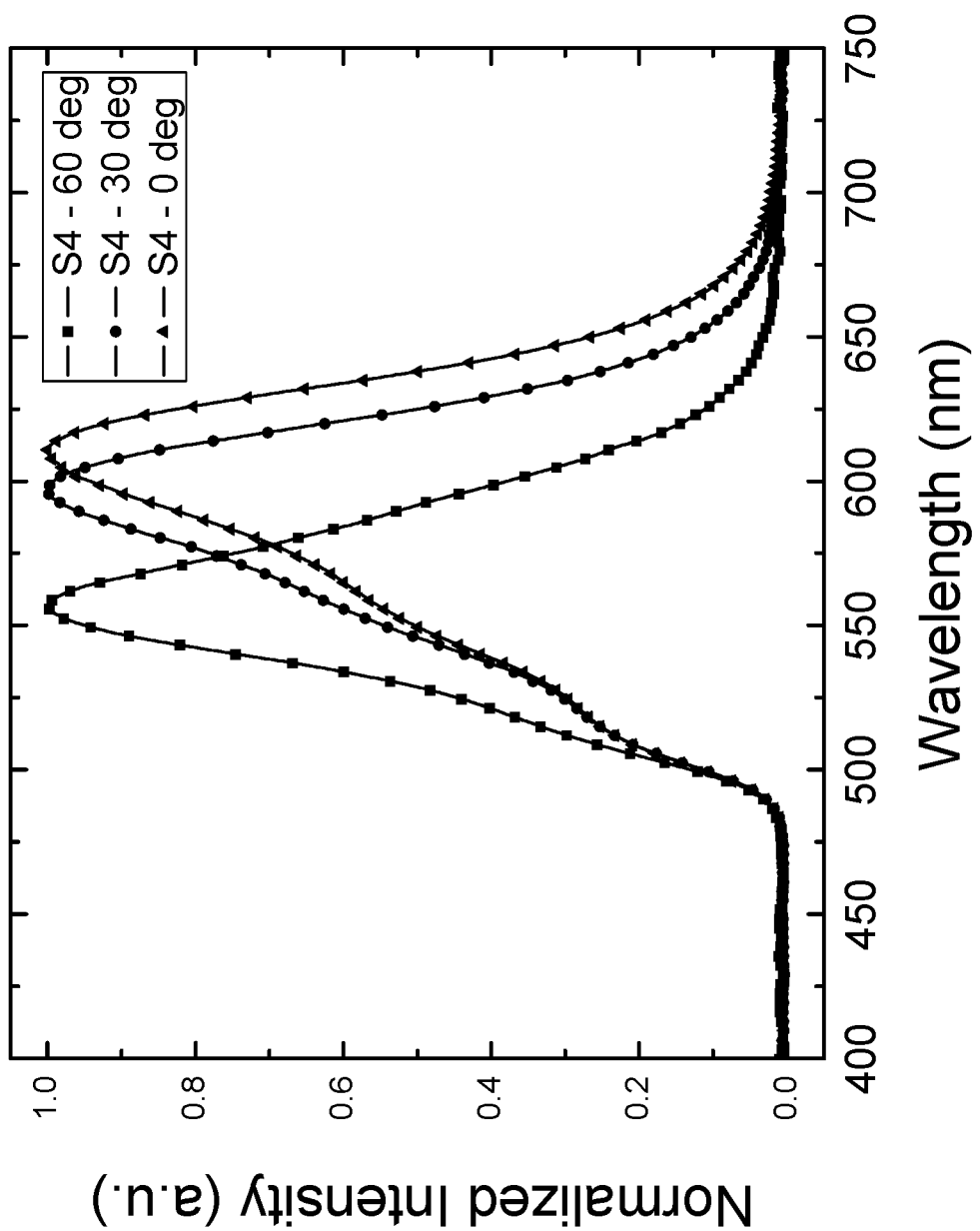

FIG. 29 is a plot of emission spectrum obtained from the first device region S1 at various angles. Specifically, the emission spectrum was obtained at an angle normal (or perpendicular) to the device surface, an angle 30 degrees from the normal angle of the device surface, and an angle 60 degrees from the normal angle of the device surface. The emission spectrum was measured from the second device region S2, the third device region S3, and the fourth device region S4 at identical angles to create the plot of FIGS. 30-32.

As can be seen from the plot of FIGS. 29-32, in all of the device regions S1-S4, the emission spectrum generally shifted towards shorter wavelength (e.g., blue shifted) as angle deviation relative to the normal angle was increased. Specifically, the greatest blue shift was observed in the emission spectra obtained at an angle 60 degrees from the normal for all device regions S1-S4, followed by emission spectra obtained at an angle 30 degrees from the normal.

As used herein, the terms "substantially," "substantial," "approximately," and "about" are used to denote and account for small variations. When used in conjunction with an event or circumstance, the terms can refer to instances in which the event or circumstance occurs precisely, as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be "substantially" the same as a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

In the description of some embodiments, a component provided "on" or "over" another component, or "covering" or which "covers" another component, can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

Although the present disclosure has been described with reference to certain specific embodiments, various modifications thereof will be apparent to those skilled in the art. Any examples provided herein are included solely for the purpose of illustrating certain aspects of the disclosure and are not intended to limit the disclosure in any way. Any drawings provided herein are solely for the purpose of illustrating certain aspects of the disclosure and may not be drawn to scale and do not limit the disclosure in any way. The scope of the claims appended hereto should not be limited by the specific embodiments set forth in the above description, but should be given their full scope consistent with the present disclosure as a whole. The disclosures of all documents recited herein are incorporated herein by reference in their entirety.

The invention claimed is:

1. An opto-electronic device comprising:
   a subpixel region comprising:
      an electrode;
      an organic layer disposed over the electrode; and
      a conductive coating disposed over the organic layer; and
   a light transmissive region comprising a nucleation inhibiting coating,
   wherein a surface of the nucleation inhibiting coating in the light transmissive region is substantially free of the conductive coating,
   wherein the nucleation inhibiting coating comprises organic molecules each including a core moiety and a terminal moiety bonded to the core moiety, and the terminal moiety includes a biphenylyl moiety, a phenyl moiety, a fluorene moiety, or a phenylene moiety.

2. The opto-electronic device of claim 1, wherein the light transmissive region is substantially free of the conductive coating to allow light to pass through the opto-electronic device.

3. The opto-electronic device of claim 1, wherein the conductive coating comprises magnesium.

4. The opto-electronic device of claim 3, wherein a thickness of the conductive coating is less than 30 nm.

5. The opto-electronic device of claim 1, wherein the nucleation inhibiting coating is characterized as having an initial sticking probability for a material of the conductive coating of no greater than 0.3.

6. The opto-electronic device of claim 1, wherein the terminal moiety includes one or more substituent groups independently selected from deutero, fluoro, alkyl, cycloalkyl, silyl, and fluoroalkyl.

7. The opto-electronic device of claim 1, further comprising a pixel definition layer covering an edge of the electrode, and wherein the pixel definition layer is omitted from the light transmissive region.

8. The opto-electronic device of claim 1, further comprising a non-emissive region, wherein the non-emissive region comprises an auxiliary electrode.

9. The opto-electronic device of claim 8, wherein the auxiliary electrode comprises a same material as the conductive coating.

10. The opto-electronic device of claim 8, wherein the auxiliary electrode is disposed between the subpixel region and the light transmissive region.

11. The opto-electronic device of claim 1, wherein the subpixel region further comprises a thin-film transistor in electrical communication with the electrode.

12. The opto-electronic device of claim 1, wherein the subpixel region further comprises a nucleation promoting coating disposed between the conductive coating and the organic layer.

13. The opto-electronic device of claim 1, wherein the nucleation inhibiting coating is characterized as having an initial sticking probability for a material of the conductive coating of no greater than 0.03.

14. An opto-electronic device comprising:
a subpixel region comprising:
an electrode;
an organic layer disposed over the electrode;
a first portion of a first conductive coating disposed over the organic layer; and
a second conductive coating disposed over the first portion of the first conductive coating; and
a light transmissive region comprising:
a second portion of the first conductive coating; and
a nucleation inhibiting coating disposed over the second portion of the first conductive coating,
wherein a surface of the nucleation inhibiting coating in the light transmissive region is substantially free of the second conductive coating,
wherein the first conductive coating comprises ytterbium, and the second conductive coating comprises magnesium.

15. The opto-electronic device of claim 14, wherein a thickness of the first conductive coating is less than a thickness of the second conductive coating.

16. The opto-electronic device of claim 15, wherein the thickness of the first conductive coating is less than 10 nm.

17. The opto-electronic device of claim 16, wherein the thickness of the second conductive coating is less than 30 nm.

18. The opto-electronic device of claim 14, wherein the first conductive coating is light transmissive.

19. The opto-electronic device of claim 14, wherein the nucleation inhibiting coating is characterized as having an initial sticking probability for a material of the second conductive coating of no greater than 0.3.

20. The opto-electronic device of claim 19, wherein the nucleation inhibiting coating comprises a polycyclic aromatic compound.

21. An opto-electronic device comprising:
a subpixel region comprising:
an electrode;
an organic layer disposed over the electrode;
a first portion of a first conductive coating disposed over the organic layer; and
a second conductive coating disposed over the first portion of the first conductive coating; and
a light transmissive region comprising:
a second portion of the first conductive coating; and
a nucleation inhibiting coating disposed over the second portion of the first conductive coating,
wherein a surface of the nucleation inhibiting coating in the light transmissive region is substantially free of the second conductive coating, wherein the nucleation inhibiting coating comprises organic molecules each including a core moiety and a terminal moiety bonded to the core moiety, and the terminal moiety includes a biphenylyl moiety, a phenyl moiety, a fluorene moiety, or a phenylene moiety.

22. The opto-electronic device of claim 21, wherein the terminal moiety includes one or more substituent groups independently selected from deutero, fluoro, alkyl, cycloalkyl, silyl, and fluoroalkyl.

23. The opto-electronic device of claim 14, further comprising a pixel definition layer covering an edge of the electrode, and wherein the pixel definition layer is omitted from the light transmissive region.

24. The opto-electronic device of claim 14, further comprising a non-emissive region, wherein the non-emissive region comprises an auxiliary electrode.

25. The opto-electronic device of claim 14, wherein the nucleation inhibiting coating is characterized as having an initial sticking probability for a material of the second conductive coating of no greater than 0.03.

26. The opto-electronic device of claim 21, wherein a thickness of the first conductive coating is less than a thickness of the second conductive coating.

27. The opto-electronic device of claim 26, wherein the thickness of the first conductive coating is less than 10 nm.

28. The opto-electronic device of claim 27, wherein the first conductive coating comprises a material selected from transparent conductive oxide, magnesium, aluminum, ytterbium, silver, zinc, and cadmium.

29. The opto-electronic device of claim 28, wherein the thickness of the second conductive coating is less than 30 nm.

30. The opto-electronic device of claim 29, wherein the second conductive coating comprises magnesium.

* * * * *